(12) United States Patent
Arigane et al.

(10) Patent No.: US 9,515,082 B2
(45) Date of Patent: Dec. 6, 2016

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Tsuyoshi Arigane, Tokyo (JP); Digh Hisamoto, Tokyo (JP); Daisuke Okada, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/664,493

(22) Filed: Mar. 20, 2015

(65) Prior Publication Data
US 2015/0270279 A1 Sep. 24, 2015

(30) Foreign Application Priority Data

Mar. 20, 2014 (JP) .................................. 2014-059145

(51) Int. Cl.
| | |
|---|---|
| H01L 21/336 | (2006.01) |
| H01L 27/115 | (2006.01) |
| H01L 29/792 | (2006.01) |
| H01L 29/66 | (2006.01) |
| H01L 29/423 | (2006.01) |
| H01L 21/28 | (2006.01) |
| H01L 21/762 | (2006.01) |

(52) U.S. Cl.
CPC ... *H01L 27/11568* (2013.01); *H01L 21/28282* (2013.01); *H01L 21/76224* (2013.01); *H01L 29/42344* (2013.01); *H01L 29/66545* (2013.01); *H01L 29/66833* (2013.01); *H01L 29/792* (2013.01)

(58) Field of Classification Search
None
See application file for complete search history.

(56) References Cited

U.S. PATENT DOCUMENTS

2007/0228498 A1* 10/2007 Toba ................. H01L 21/28282
257/411
2011/0001179 A1   1/2011 Yanagi et al.

FOREIGN PATENT DOCUMENTS

JP   2011-029631 A   2/2011

* cited by examiner

*Primary Examiner* — Reema Patel
(74) *Attorney, Agent, or Firm* — Shapiro, Gabor and Rosenberger, PLLC

(57) ABSTRACT

A memory gate is formed of a first memory gate including a second gate insulating film made of a second insulating film and a first memory gate electrode, and a second memory gate including a third gate insulating film made of a third insulating film and a second memory gate electrode. In addition, the lower surface of the second memory gate electrode is located lower in level than the lower surface of the first memory gate electrode. As a result, during an erase operation, an electric field is concentrated on the corner portion of the first memory gate electrode which is located closer to a selection gate and a semiconductor substrate and on the corner portion of the second memory gate electrode which is located closer to the first memory gate and the semiconductor substrate. This allows easy injection of holes into each of the second and third insulating films.

20 Claims, 85 Drawing Sheets

FIG. 83
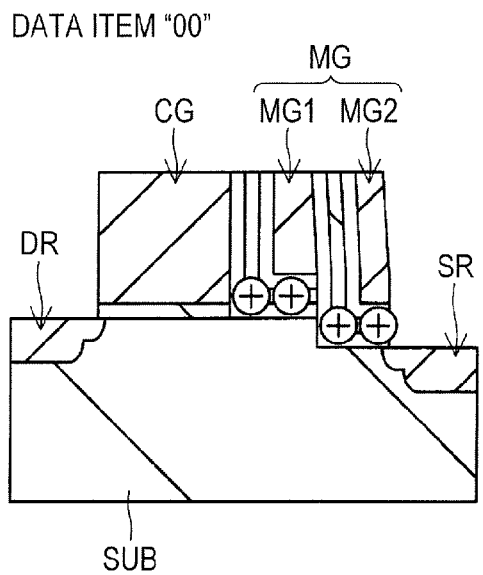
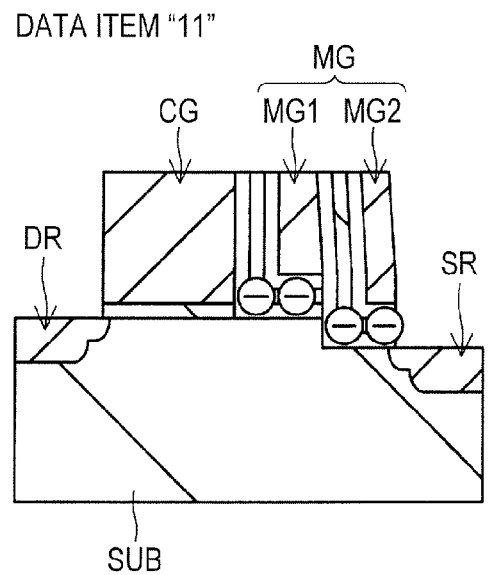
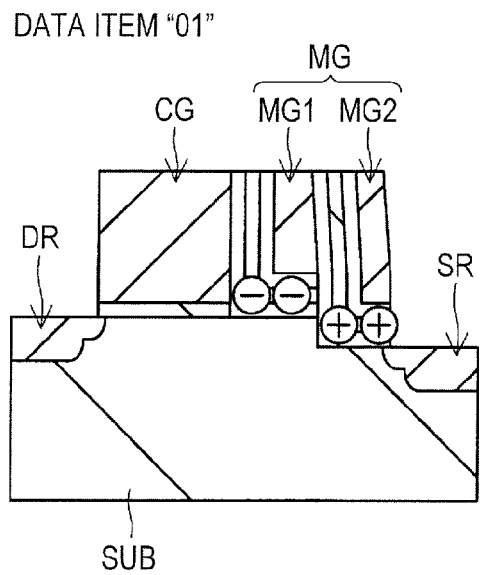
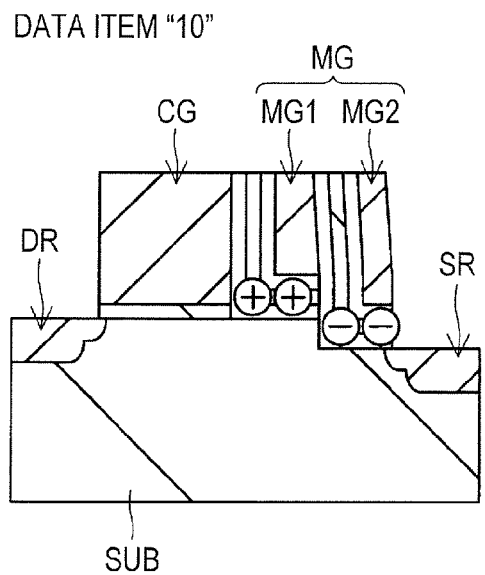

SEMICONDUCTOR DEVICE AND METHOD OF MANUFACTURING THE SAME

CROSS-REFERENCE TO RELATED APPLICATIONS

The disclosure of Japanese Patent Application No. 2014-059145 filed on Mar. 20, 2014 including the specification, drawings and abstract is incorporated herein by reference in its entirety.

BACKGROUND

The present invention relates to a semiconductor device and a manufacturing technology therefor and can be used appropriately for a semiconductor device having, e.g., an embedded nonvolatile memory and the manufacturing thereof.

For example, in Japanese Unexamined Patent Publication No. 2011-029631 (Patent Document 1), a nonvolatile memory is described to which a write/erase operation is performed by injecting electrons and holes into a charge storage film and thus changing a total charge amount. In the nonvolatile memory, the gate electrode of each of nonvolatile memory cells is formed of a double-layered film including a non-doped polycrystalline silicon layer and a metal material electrode layer. This allows the injection of charges from the gate electrode to be performed with high efficiency.

RELATED ART DOCUMENT

Patent Document

[Patent Document 1]
  Japanese Unexamined Patent Publication No. 2011-029631

SUMMARY

In a semiconductor device having memory elements also, it is desired to maximize the performance thereof.

Other problems and novel features of the present invention will become apparent from a statement in the present specification and the accompanying drawings.

According to an embodiment, a nonvolatile memory cell includes a selection gate, a first memory gate formed over one side surface of the selection gate via a second gate insulating film, and a second memory gate formed over one side surface of the first memory gate via a third gate insulating film. The selection gate includes a first gate insulating film formed over a main surface of a semiconductor substrate, and a selection gate electrode formed over the first gate insulating film. The first memory gate includes the second gate insulating film formed over the main surface of the semiconductor substrate, and a first memory gate electrode formed over the second gate insulating film. The second memory gate includes the third gate insulating film formed over the main surface of the semiconductor substrate, and a second memory gate electrode formed over the third gate insulating film. By injecting holes from the first memory gate electrode into the second gate insulating film and from the second memory gate electrode into the third gate insulating film, data in the nonvolatile memory cell is erased therefrom.

According to the embodiment, in a semiconductor device having an embedded nonvolatile memory cell, improved erase efficiency can be achieved.

BRIEF DESCRIPTION OF THE DRAWINGS

FIG. 83 is a schematic diagram illustrating the charges injected into first and second memory gates during a multi-value storage operation to the nonvolatile memory cell according to Embodiment 8;

DETAILED DESCRIPTION

Figure 1:
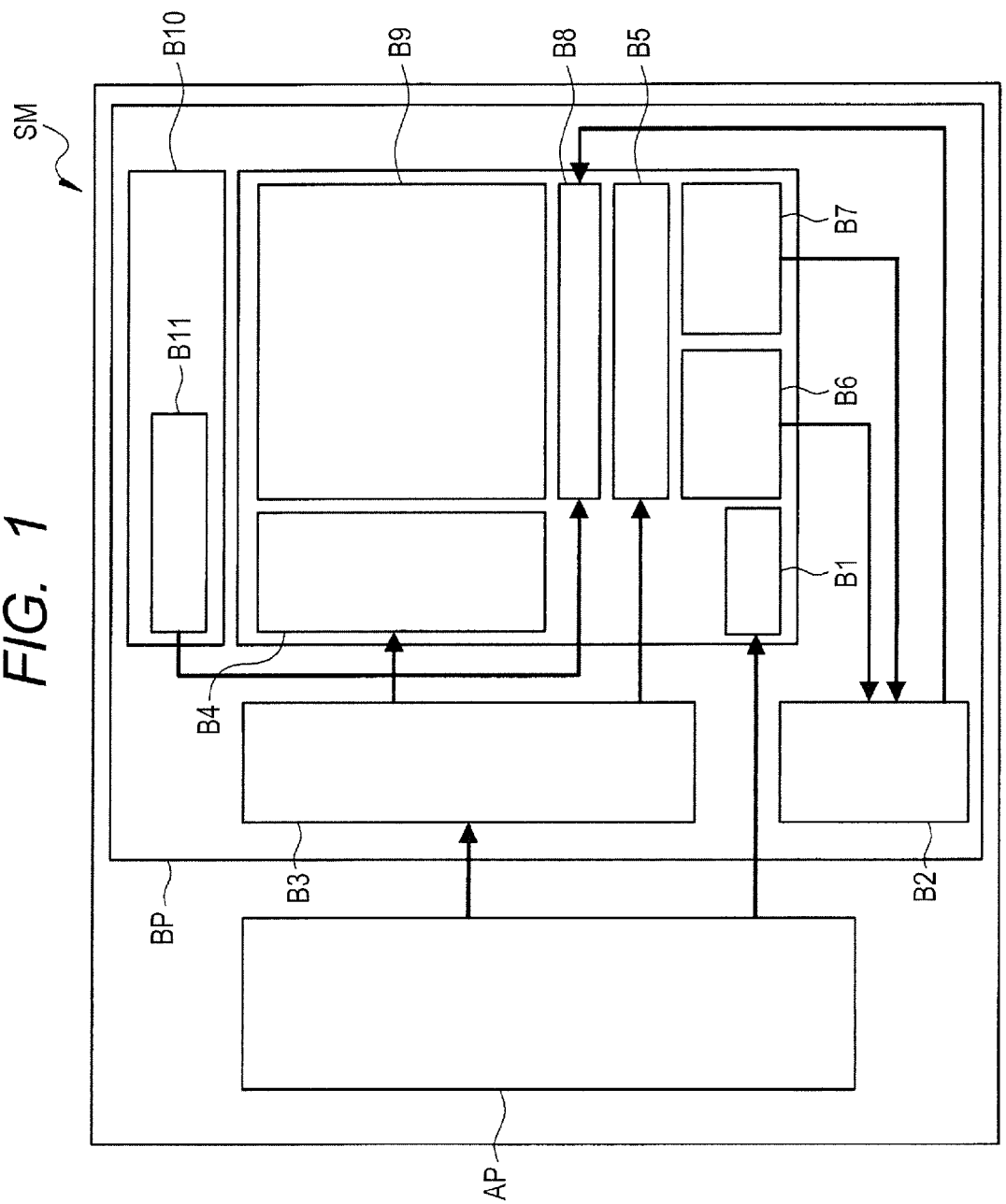
FIG. 1 is a block diagram of a semiconductor device according to Embodiment 1.

In the following embodiments, if necessary for the sake of convenience, each of the embodiments will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others.

Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers.

Also, in the following embodiments, it goes without saying that the components thereof (including also elements, steps, and the like) are not necessarily indispensable unless particularly explicitly described otherwise or unless the components are considered to be obviously indispensable in principle.

It will also be appreciated that, when the wording "comprised of A", "comprising A", "having A", or "including A" is used for a component A, it does not exclude a component other than the component A unless it is shown particularly explicitly that the component A is the only one component. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

In the following embodiments, a MISFET (Metal Insulator Semiconductor Field Effect Transistor) representative of a field effect transistor is shortened as a MIS transistor, an n-channel MISFET is shortened as an nMIS transistor, and a p-channel MISFET is shortened as a pMIS transistor. When silicon nitride is mentioned, it naturally includes $Si_3N_4$, but is not limited thereto. It is assumed that silicon nitride includes not only $Si_3N_4$, but also an insulating film made of a nitride of silicon having a similar composition. When a wafer is mentioned, it mainly refers to a Si (Silicon) single-crystal wafer, but is not limited thereto. It is assumed that a wafer refers to not only the Si single-crystal wafer, but also a SOI (Silicon On Insulator) wafer, an insulating film substrate for forming an integrated circuit thereover, or the like. It is also assumed that the shape thereof includes not only a circular or approximately circular shape, but also a square shape, a rectangular shape, and the like.

Also, in the following embodiments, a nonvolatile memory is simply referred to as a memory and a nonvolatile memory cell is simply referred to as a memory cell. The nonvolatile memory cell has a gate including a selection gate and a memory gate, a source, and a drain. In the following embodiments, for the sake of convenience, the drain is defined as a semiconductor region (diffusion layer) formed in the portion of a semiconductor substrate which is located closer to the selection gate and the source is defined as a semiconductor region (diffusion layer) formed in the portion of the semiconductor substrate which is located closer to the memory gate. Accordingly, the source and the drain can also be conversely defined as a semiconductor region (diffusion layer) formed in the portion of the semiconductor substrate which is located closer to the selection gate and a semiconductor region (diffusion layer) formed in the portion of the semiconductor substrate which is located closer to the memory gate, respectively.

In the drawings used in the embodiments, even a plan view may be hatched for improved clarity of illustration. Note that, throughout all the drawings for illustrating the embodiments, members having the same functions are designated by the same reference numerals, and the repeated description thereof is omitted. The embodiments of the present invention will be described below in detail on the basis of the drawings.

As an electrically re-writable nonvolatile memory cell, there is a nonvolatile memory cell of MONOS (Metal Oxide Nitride Oxide Silicon) type which uses an insulating film having a trap level, such as a nitride film, as a charge storage film.

To reduce the power consumption of a semiconductor device having an embedded nonvolatile memory in which the MONOS-type nonvolatile memory cells are arranged in a matrix shape, it is considered to change an erase method for the MONOS-type nonvolatile memory cells from a BTBT (Band To Band Tunneling) method that has been used conventionally to a FN (Fowler Nordheim) tunnel method.

However, compared to the BTBT method, the FN tunnel method has problems in that: (1) an erase speed is low; and (2) a threshold cannot be reduced to be lower than a desired value in an erase operation.

Embodiment 1

Configuration of Semiconductor Device

A configuration of a semiconductor device according to Embodiment 1 will be described using FIG. 1. FIG. 1 is a block diagram of the semiconductor device.

As shown in FIG. 1, a semiconductor device SM includes a logic portion AP and a memory portion BP. The memory portion BP includes a control circuit B1, an input/output circuit B2, an address buffer B3, a row decoder B4, a column decoder B5, a verify sense amplifier circuit B6, a high-speed read sense amplifier circuit B7, a write circuit B8, a memory cell array B9, a power supply circuit B10, and the like.

The control circuit B1 temporarily stores the control signal input thereto from the logic portion AP to perform a control operation. The control circuit B1 also controls the potential of each of the gates of memory cells in the memory cell array B9. To the input/output circuit B2, various data such as the data read from the memory cell array B9, the data to be written to the memory cell array B9, and program data is input/output. The address buffer B3 temporarily stores the address input thereto from the logic portion AP. The row decoder B4 performs decoding on the basis of the row address output from the address buffer B3. The column decoder B5 performs decoding on the basis of the column address output from the address buffer B3. The row decoder B4 and the column decoder B5 are each coupled to the address buffer B3.

The verify sense amplifier circuit B6 is a verifying sense amplifier used during an erase/write verify operation. The high-speed read sense amplifier circuit B7 is a reading sense amplifier used during a data read operation. The write circuit B8 latches the data to be written that has been input thereto via the input/output circuit B2 to control a data write operation. In the memory cell array B9, memory cells as minimum storage units are arranged in a matrix shape. The power supply circuit B10 includes a voltage generation circuit which generates various voltages used for the data write operation, a data erase operation, a verify operation, and the like, a current trimming circuit B11 which supplies any generated voltage to the write circuit B8, and the like.

Figure 2:
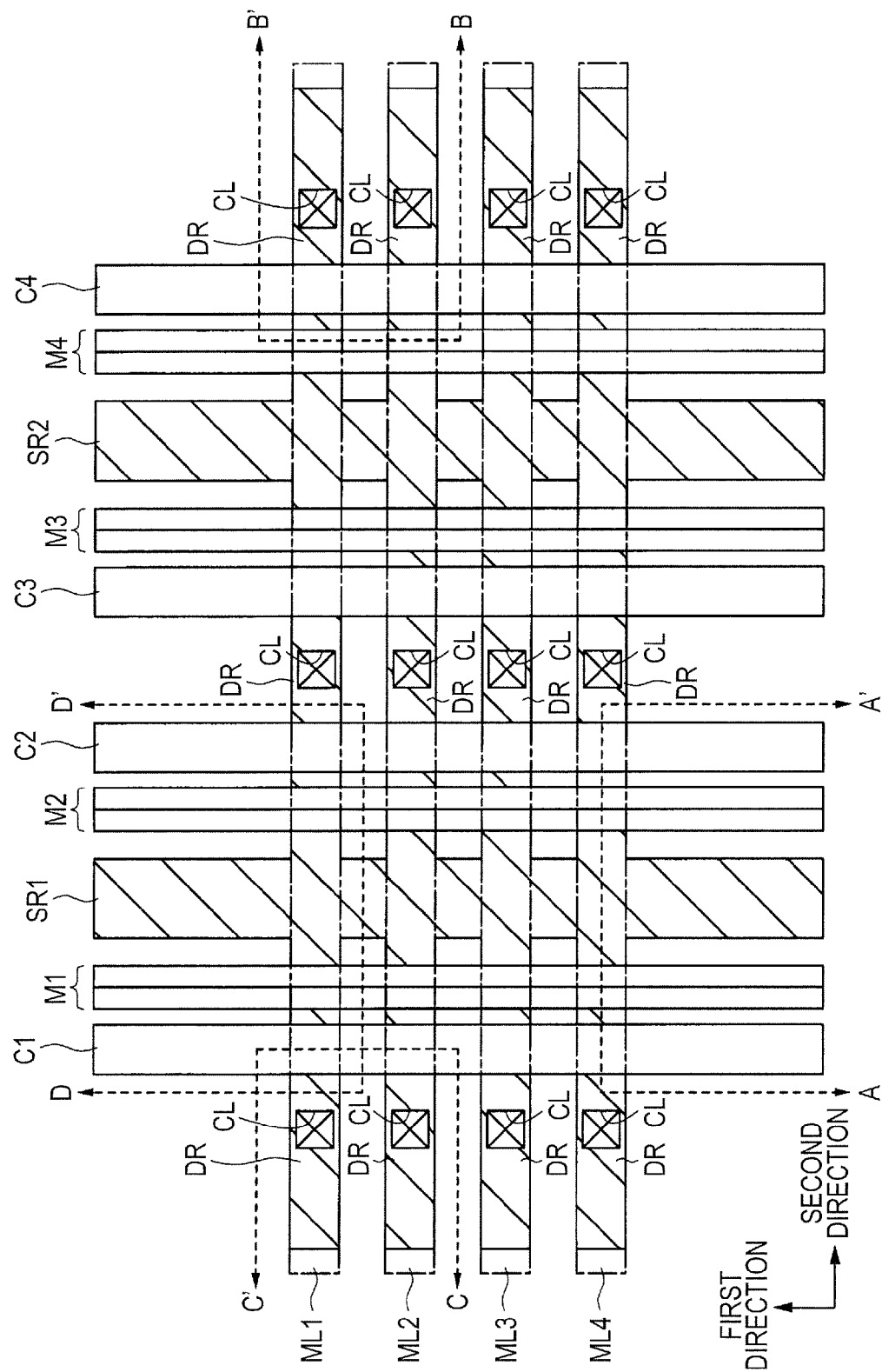
FIG. 2 is a main-portion plan view of a MONOS-type nonvolatile memory according to Embodiment 1.
Figure 3:
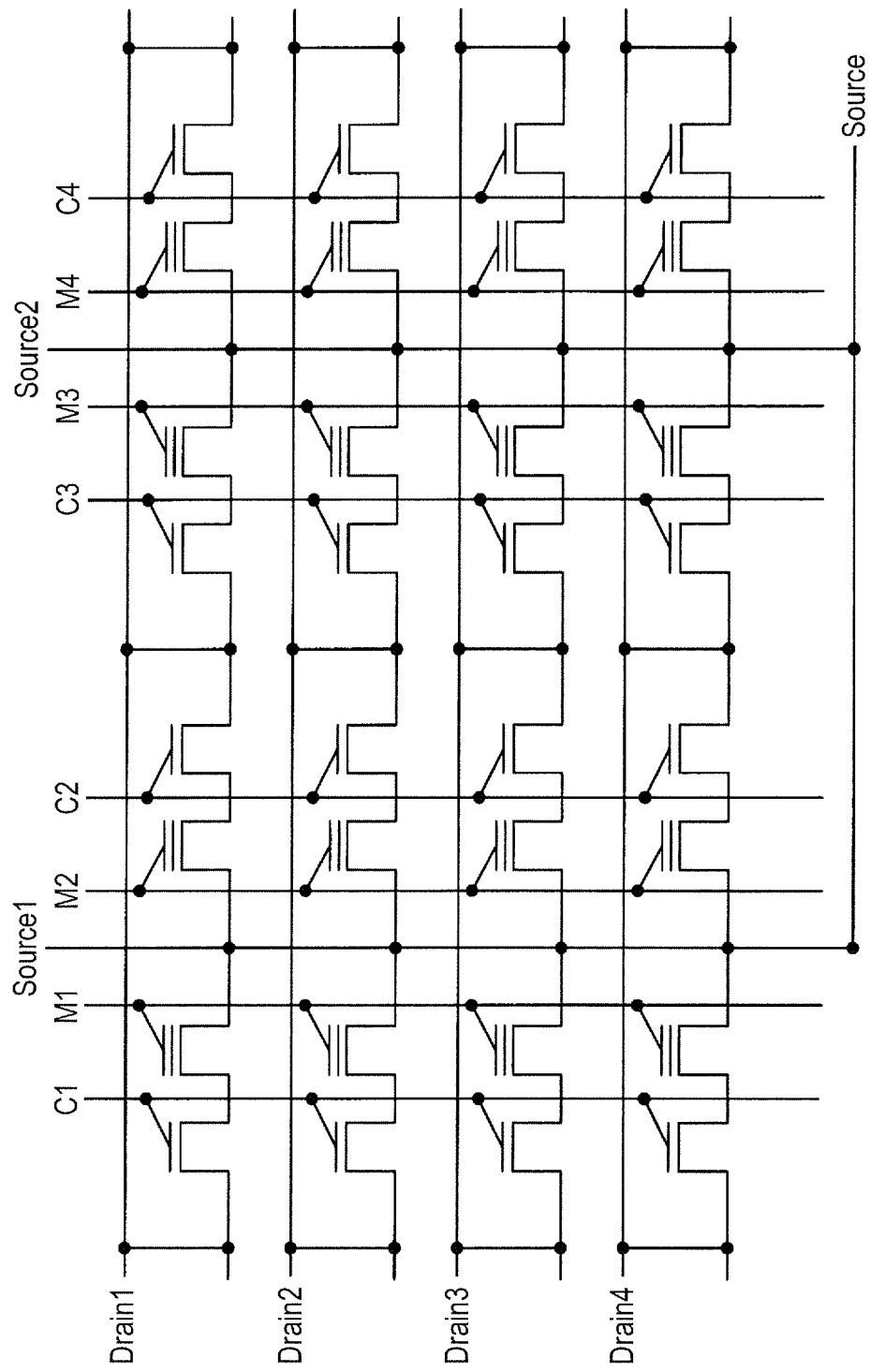
FIG. 3 is an equivalent circuit diagram of the MONOS-type nonvolatile memory according to Embodiment 1.

Next, a configuration of the memory cell array according to Embodiment 1 will be described using FIGS. 2 and 3. FIG. 2 is a main-portion plan view of a memory. FIG. 3 is an equivalent circuit diagram of the memory. In the memory cell array, the memory cells are formed in the matrix shape. Accordingly, the configuration of the memory cell array will be described using a partial region of the memory cell array.

As shown in FIG. 2, in the memory cell array, selection gates C1 to C4 each extending in a first direction (gate width direction) are arranged to be spaced apart from each other in a second direction (gate length direction) orthogonal to the first direction. Between the adjacent selection gates C1 and C2, a source SR1 extending in the first direction is placed. Between the adjacent selection gates C3 and C4, a source SR2 extending in the first direction is placed.

On the source SR1 side of the selection gate C1, a memory gate M1 extending in the first direction is placed adjacent to the selection gate C1. On the source SR1 side of the selection gate C2, a memory gate M2 extending in the first direction is placed adjacent to the selection gate C2. Thus, between the adjacent memory gates M1 and M2, the source SR1 extending in the first direction is placed. On the source SR2 side of the selection gate C3, a memory gate M3 extending in the first direction is placed adjacent to the selection gate C3. On the source SR2 side of the selection gate C4, a memory gate M4 extending in the first direction is placed adjacent to the selection gate C4. Thus, between the adjacent memory gates M3 and M4, the source SR2 extending in the first direction is placed.

On the side of each of the selection gates C1 and C2 opposite to the source SR1 side and on the side of each of the selection gates C3 and C4 opposite to the source SR2 side, drains DR are placed. For example, as shown in FIG. 2, between the adjacent selection gates C2 and C3, the drains DR are placed.

In addition, wires ML1 to ML4 extending in the second direction are arranged to be spaced apart from each other in the first direction. The wires Ml1 to ML4 are electrically coupled to the drains DR arranged along the second direction via contact holes CL.

As shown in FIG. 3, the sources SR1 and SR2 formed along the first direction function as source lines Source1 and Source2. The wires ML1 to ML4 formed along the second direction function as drain lines Drain1 to Drain4. Accordingly, the memory cells are arranged in a matrix shape at the points of intersection between the source lines Source1 and Source2 and the drain lines Drain1 to Drain4.

Figure 4:
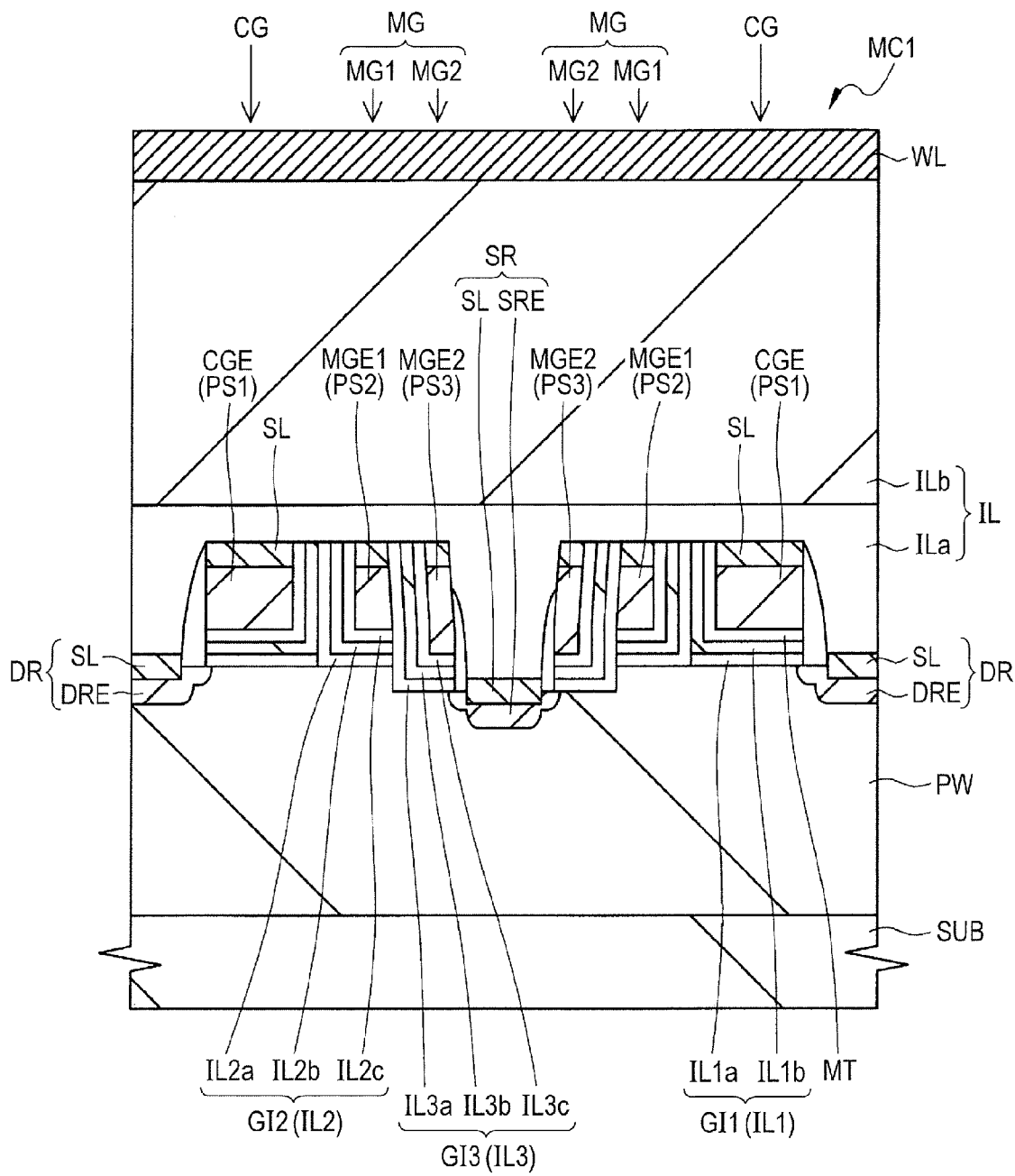
FIG. 4 is a main-portion cross-sectional view (main-portion cross-sectional view along the line A-A' shown in FIG. 2) of a MONOS-type nonvolatile memory cell according to Embodiment 1.
Figure 5:
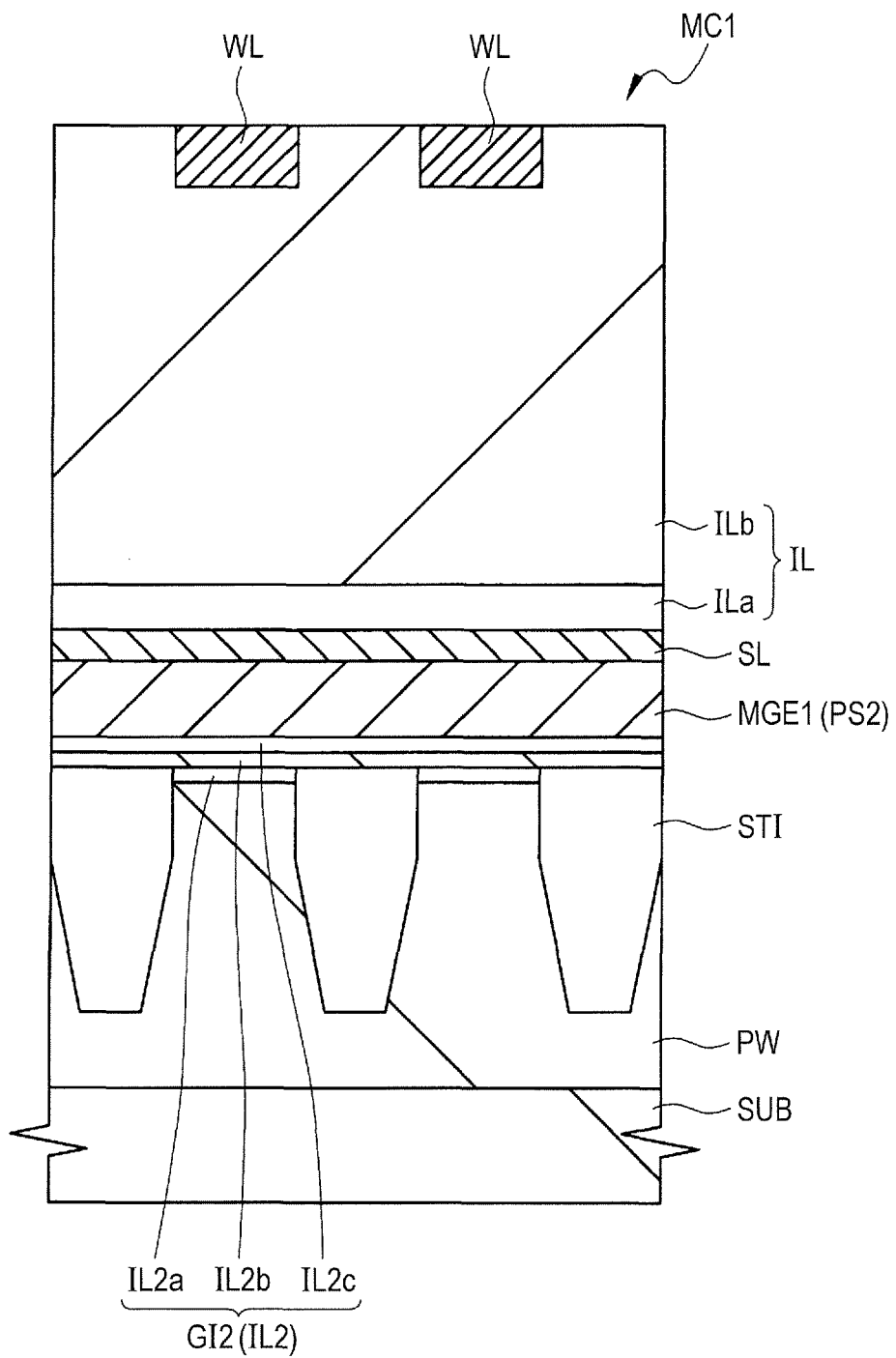
FIG. 5 is a main-portion cross-sectional view (main-portion cross-sectional view along the line B-B' shown in FIG. 2) of the MONOS-type nonvolatile memory cell according to Embodiment 1.
Figure 6:
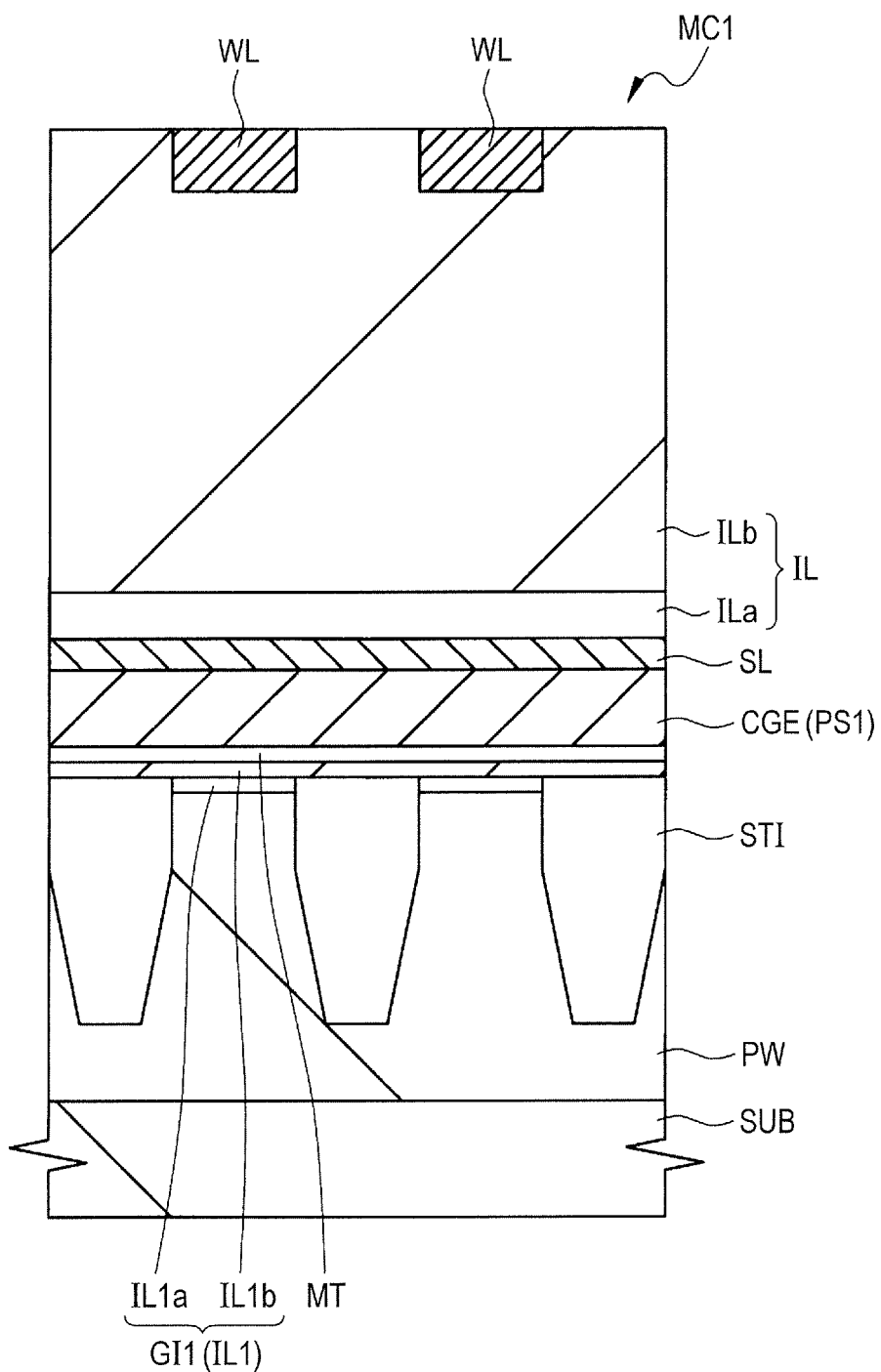
FIG. 6 is a main-portion cross-sectional view (main-portion cross-sectional view along the line C-C' shown in FIG. 2) of the MONOS-type nonvolatile memory cell according to Embodiment 1.
Figure 7:
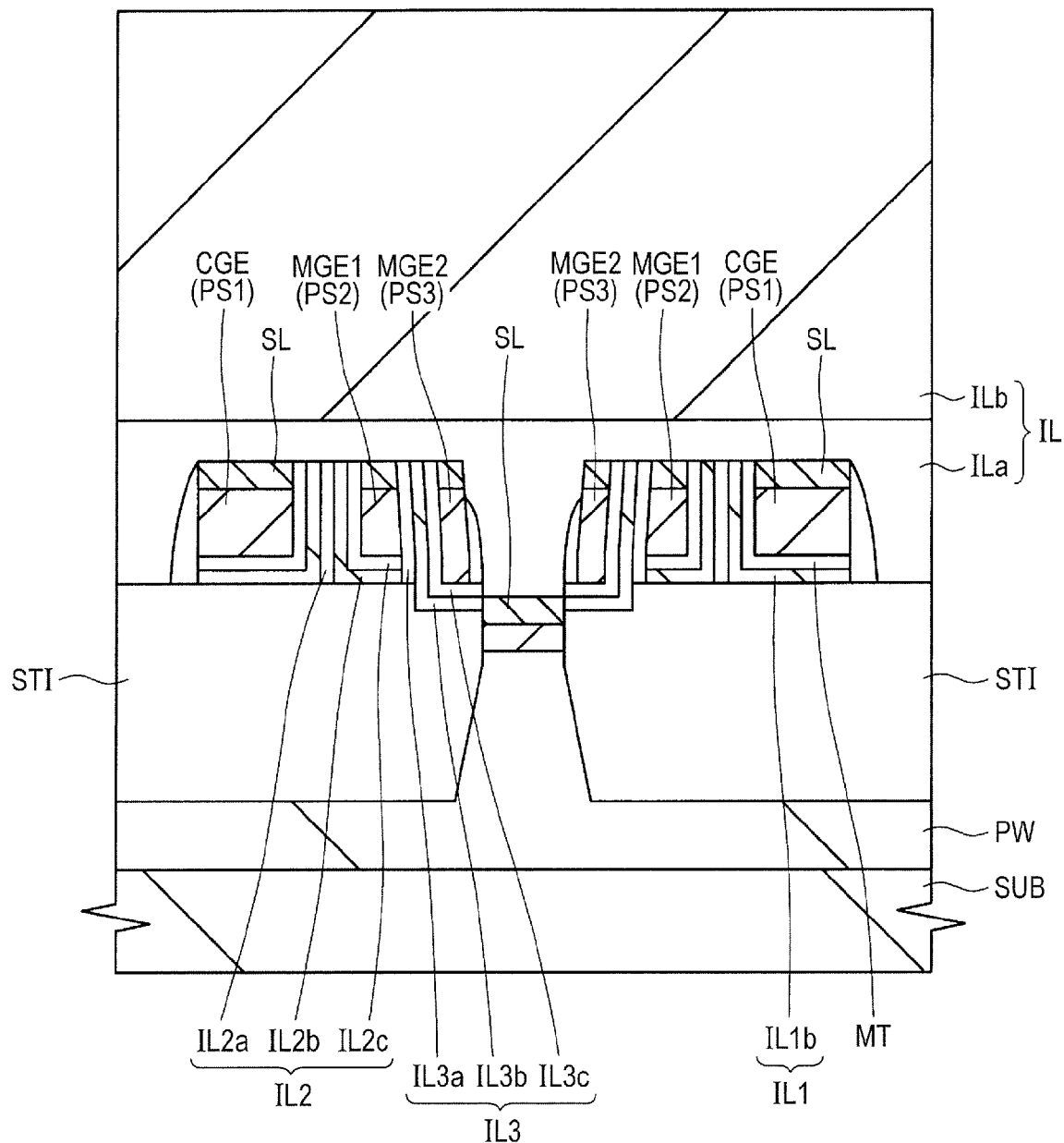
FIG. 7 is a main-portion cross-sectional view (main-portion cross-sectional view along the line D-D' shown in FIG. 2) of the MONOS-type nonvolatile memory cell according to Embodiment 1.
Figure 8A:
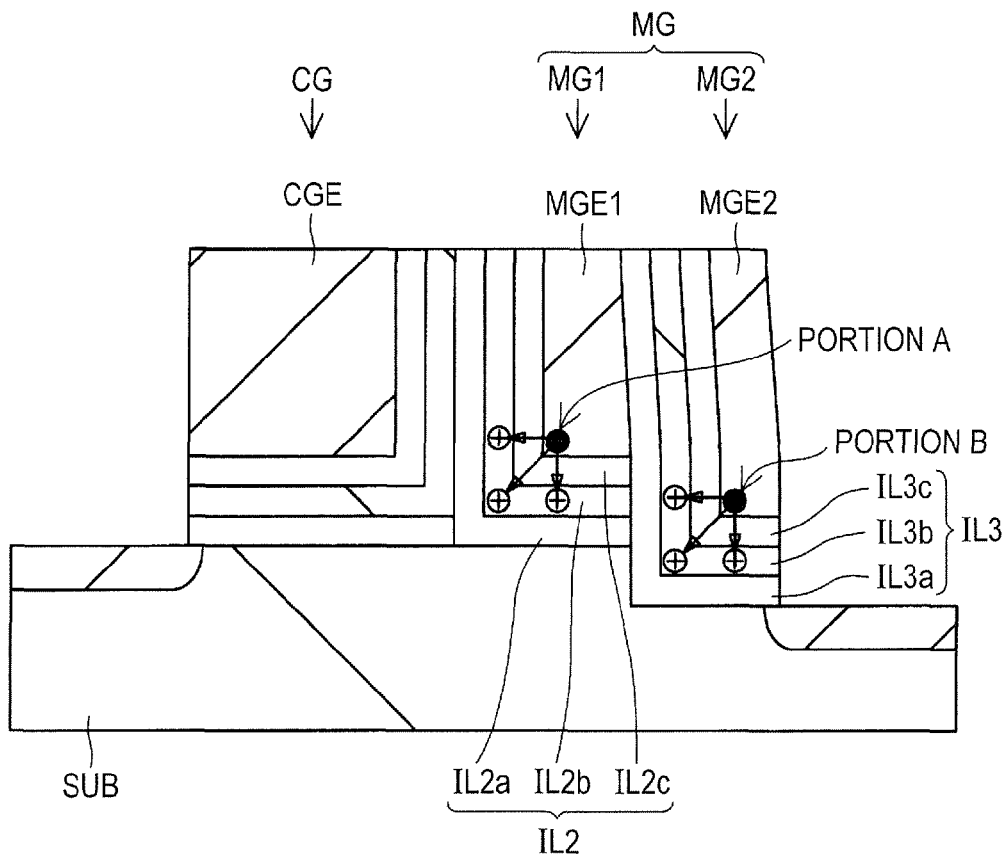
FIG. 8A is a main-portion cross-sectional view showing each of the selection gates of the MONOS-type nonvolatile memory cell according to Embodiment 1 and the memory gate (first and second memory gates) thereof in enlarged relation.
Figure 8B:
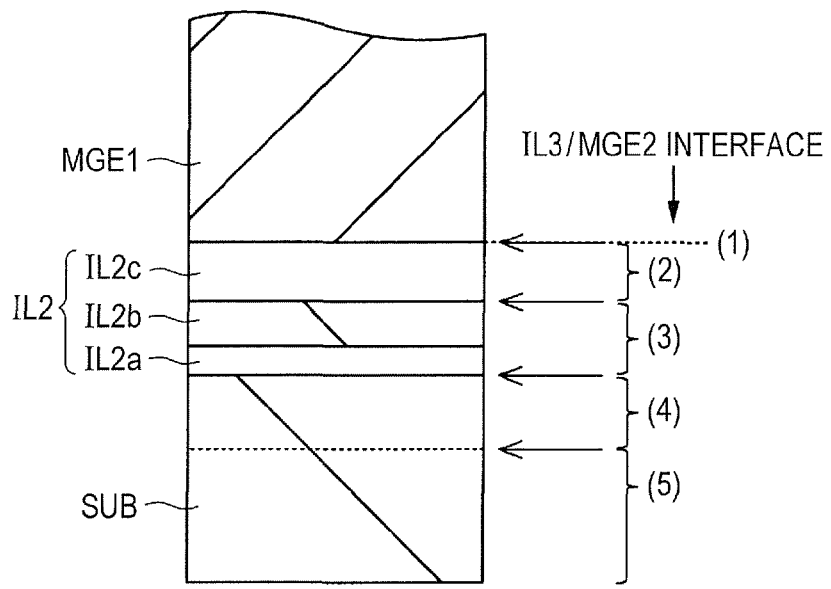
FIG. 8B is a schematic diagram illustrating the respective positions of the first and second memory gates of the MONOS-type nonvolatile memory cell according to Embodiment 1.

Next, a configuration of each of the memory cells according to Embodiment 1 will be described using FIGS. 4 to 8. FIG. 4 is a main-portion cross-sectional view along the line A-A' shown in FIG. 2. FIG. 5 is a main-portion cross-sectional view along the line B-B' shown in FIG. 2. FIG. 6 is a main-portion cross-sectional view along the line C-C' shown in FIG. 2. FIG. 7 is a main-portion cross-sectional view along the line D-D' shown in FIG. 2. FIG. 8A is a main-portion cross-sectional view showing each of the selection gates of the memory cell and the memory gate (first and second memory gates) thereof in enlarged relation. FIG. 8B is a schematic diagram illustrating the respective positions of the first and second memory gates of the memory cell.

As shown in FIGS. 4 to 7, a memory cell MC1 includes selection gates CG, memory gates MG, a source SR, and the drains DR. Each of the memory gates MG includes first and second memory gates MG1 and MG2.

An active region (active region or element formation region) formed with the memory cell MC1 has first, second, and third regions in a gate length direction. In the first region, each of the selection gates CG is formed. In the second region adjacent to the first region, each of the first memory gates MG1 is formed. In the third region adjacent to the second region, each of the second memory gates MG2 is formed. In the portions of a semiconductor substrate SUB which are located closer to the selection gates CG, the drains DR each made of a semiconductor region (diffusion layer) are formed. In the portion of the semiconductor substrate SUB which is located closer to each of the memory gates MG, the source SR made of a semiconductor region (diffusion layer) is formed. That is, in the gate length direction, the drains DR, the selection gates CG, the first memory gates MG1, the second memory gates MG2, and the source SR are formed to be arranged. The first region is a region where a channel for each of the selection gates CG is formed. The second region is a region where a channel for each of the first memory gates MG1 is formed. The third region is a region where a channel for each of the second memory gates MG2 is formed.

A specific description will be given below of the structure of the memory cell MC1.

The memory cell MC1 is formed in a p-well PW formed in the main surface (device formation surface) of the semiconductor substrate SUB made of, e.g., a p-type single crystal. Over the main surface of the semiconductor substrate SUB located between the source SR and the drains DR, the selection gates CG and the memory gates MG extend in adjacent relation via the first and second insulating films IL1 and IL2. In the gate width direction thereof, a plurality of the memory cells MC1 are adjacent to each other via isolation portions STI formed in the semiconductor substrate SUB.

Each of the selection gates CG has a structure in which, over the main surface of the semiconductor substrate SUB, a first gate insulating film GI1 made of the first insulating film IL1, a selection gate electrode CGE made of an n-type polycrystalline silicon film PS1, and a silicide film SL are successively stacked in order of increasing distance from the semiconductor substrate SUB. The first insulating film IL1 has a structure in which an insulating film IL1a and a high-dielectric-constant film (high-k film) IL1b are successively stacked in order of increasing distance from the semiconductor substrate SUB. When a high-dielectric-constant film is used in the first insulating film IL1, it is preferable to form a metal film MT as a metal compound film (barrier film) between the first insulating film IL1 and the selection gate electrode CGE.

The insulating film IL1a is made of, e.g., silicon dioxide and has a thickness of, e.g., about 1 nm. The high-dielectric-constant film IL1b is made of, e.g., hafnium oxide and has a thickness of, e.g., about 5 nm. The metal film MT is provided so as to prevent a problem from occurring at the contact interface between the high-dielectric-constant film IL1b and the polycrystalline silicon film PS1 when the high-dielectric-constant film IL1b and the polycrystalline silicon film PS1 are in direct contact. The metal film MT is made of, e.g., titanium nitride and has a thickness of, e.g., about 10 nm.

Note that, between each of the selection gate electrodes CGE and the semiconductor substrate SUB, the insulating film IL1a and the high-dielectric-constant film IL1b which are included in the first insulating film IL1 and the metal film MT are formed. Between the selection gate electrode CGE and a first memory gate electrode MGE1, the high-dielectric-constant film IL1b and the metal film MT are formed.

Each of the memory gates MG is formed on one side surface of the selection gate CG. In Embodiment 1, the memory gate MG includes the sidewall-shaped first memory gate MG1 formed over the one side surface of the selection gate CG via the metal film MT, the high-dielectric-constant film IL1b, and the second insulating film IL2, and the sidewall-shaped second memory gate MG2 formed over the side surface of the first memory gate MG1 via a third insulating film IL3. The first and second memory gates MG1 and MG2 are electrically coupled to each other at, e.g., a power supply portion.

The first memory gate MG1 has a structure in which, over the main surface of the semiconductor substrate SUB, a second gate insulating film GI2 made of the second insulating film IL2, the first memory gate electrode MGE1 made of an n-type polycrystalline silicon film PS2, and the silicide layer SL are successively stacked in order of increasing distance from the semiconductor substrate SUB.

The second insulating film IL2 is formed to extend over the semiconductor substrate SUB and one side surface of the selection gate electrode CGE. In other words, the second insulating film IL2 is formed to extend between the semiconductor substrate SUB and the first memory gate electrode MGE1 and between the selection gate electrode CGE and the first memory gate electrode MGE1. The second insulating film IL2 has a structure in which an insulating film IL2a, a charge storage film IL2b, and an insulating film IL2c are successively stacked in order of increasing distance from the semiconductor substrate SUB. The insulating films IL2a and IL2c function as block films for holding the charges stored in the charge storage film IL2b.

The second memory gate MG2 has a structure in which, over the main surface of the semiconductor substrate SUB, a third gate insulating film GI3 made of the third insulating film IL3, a second memory gate electrode MGE2 made of an n-type polycrystalline silicon film PS3, and the silicide film SL are successively stacked in order of increasing distance from the semiconductor substrate SUB.

The third insulating film IL3 is formed to extend over the semiconductor substrate SUB and one side surface of the first memory gate electrode MGE1. In other words, the third insulating film IL3 is formed to extend between the semiconductor substrate SUB and the second memory gate electrode MGE2 and between the first and second memory gate electrodes MGE1 and MGE2. The third insulating film IL3 has a structure in which an insulating film IL3a, a charge storage film IL3b, and an insulating film IL3c are successively stacked in order of increasing distance from the semiconductor substrate SUB. The insulating films IL3a and IL3c function as block films for holding the charges stored in the charge storage film IL3b.

Each of the insulating films IL2a and IL3a is made of, e.g., a silicon dioxide film and has a thickness of, e.g., about 4 nm. Each of the charge storage films IL2b and IL3b is an insulating film having a charge storage portion, made of, e.g., silicon nitride as an insulating film having a trap level, and having a thickness of, e.g., about 6 nm. The insulating film having the trap level is not limited to a silicon nitride film. For example, a high-dielectric-constant film having a dielectric constant higher than that of the silicon nitride film, such as an aluminum oxide (alumina) film, a hafnium oxide film, or a tantalum oxide film, may also be used as the insulating film having the trap level. When an insulating film having a trap level is used as each of the charge storage films IL2b and IL3b, charges are trapped by the trap level formed in the insulating film to be stored in the insulating film. Each of the insulating films IL2c and IL3c is made of, e.g., silicon dioxide containing nitrogen (silicon oxynitride) or silicon dioxide and has a thickness of, e.g., about 8 nm. As is the case with the charge storage films IL2b and IL3b, a high-dielectric-constant film having a dielectric constant higher than that of a silicon dioxide film may also be used as each of the insulating films IL2a, IL2c, IL3a, and IL3c.

The source SR includes an n-type source region SRE formed by diffusing an n-type impurity into the semiconductor substrate SUB, and the silicide film SL formed over the upper surface thereof. Likewise, each of the drains DR includes an n-type drain region DRE formed by diffusing an n-type impurity into the semiconductor substrate SUB, and the silicide film SL formed over the upper surface thereof.

The silicide layer SL is made of, e.g., nickel silicide (NiSi), cobalt silicide ($CoSi_2$), or the like and has a thickness of, e.g., about 20 nm. In each of the memory cells MC1, a voltage needs to be supplied to the selection gate electrodes CGE, the first memory gate electrodes MGE1, and the second memory gate electrodes MGE2. The operating speed of the memory cell MC1 largely depends on the respective resistance values of the selection gate electrodes CGE, the first memory gate electrodes MGE1, and the second memory gate electrodes MGE2. Accordingly, by forming the silicide films SL, it is attempted to reduce the respective resistance values of the selection gate electrodes CGE, the first memory gate electrodes MGE1, and the second memory gate electrodes MGE2.

The memory cell MC1 is covered with an interlayer insulating film IL. The interlayer insulating film IL is formed with, e.g., contact holes (the contact holes CL shown in FIG. 2 described above) reaching the drains DR. The interlayer insulating films IL includes, e.g., silicon dioxide films ILa and ILb. The drains DR are coupled to first-layer wires WL extending in directions crossing the memory gates MG (or selection gates CG) via plugs (not shown) embedded in the foregoing contact holes. Each of the foregoing plugs is formed of a multi-layer film including a relatively thin barrier film made of a multi-layer film of, e.g., titanium and titanium nitride, and a relatively thick conductive film made of tungsten, aluminum, or the like and formed so as to be covered with the barrier film. Each of the wires WL is formed of, e.g., an aluminum alloy film, a copper film, or the like.

The first characteristic feature of the memory cell MC1 is that one side surface of each of the selection gates CG is provided with the first and second memory gates MG1 and MG2. The second characteristic feature of the memory cell MC1 is that the lower surface of each of the second memory gate electrodes MGE2 is located at a height position lower than that of the lower surface of each of the first memory gate electrodes MGE1. An effect is achievable only by the first characteristic feature, but a larger effect can be obtained by combining the first characteristic feature with the second characteristic feature.

As shown in FIG. 8A, the memory gate MG includes the first and second memory gates MG1 and MG2. Accordingly, the memory gate MG has the corner portion (portion A in FIG. 8A) of the first memory gate electrode MGE1 which is located closer to the selection gate CG and the semiconductor substrate SUB, and the corner portion (portion B in FIG. 8A) of the second memory gate electrode MGE2 which is located closer to the first memory gate MG1 and the semiconductor substrate SUB.

During an erase operation, an electric field is concentrated on the foregoing corner portion (portion A in FIG. 8A) of the first memory gate electrode MGE1 so that holes are injected from the first memory gate electrode MGE1 into the charge storage film IL2b of the second insulating film IL2. Also, during the erase operation, an electric field is concentrated on the foregoing corner portion (portion B in FIG. 8A) of the second memory gate electrode MGE2 so that holes are injected from the second memory gate electrode MGE2 into the charge storage film IL3b of the third insulating film IL3. That is, the memory gate MG having a double-gate structure including the first and second memory gates MG1 and MG2 has two portions on which electric fields can be concentrated during an erase operation. Under the same erase conditions, the number of holes injected into the memory gate MG having the double-gate structure is larger than the number of holes injected into a memory gate having a single-gate structure having a portion on which an electric field can be concentrated during an erase operation. This can improve an erase speed.

An electric field is more likely to be concentrated on the foregoing corner portion (portion B in FIG. 8A) of the second memory gate electrode MGE2 when the lower surface of the second memory gate electrode MGE2 is located at a height position lower than that of the lower surface of the first memory gate electrode MGE1 than when the respective lower surfaces of the first and second memory gate electrodes MGE1 and MGE2 are located at the same height position, resulting in an increased number of injected holes. Accordingly, it is preferable to locate the lower surface of the second memory gate electrode MGE2 at a height position lower than that of the lower surface of the first memory gate electrode MGE1.

However, when the lower surface of the second memory gate electrode MGE2 is at a height position considerably lower than that of the lower surface of the first memory gate electrode MGE1, a problem arises during, e.g., an erase operation and a read operation. For example, during the erase operation, the effect of the concentration of an electric field deteriorates to reduce the number of holes injected from the second memory gate electrode MGE2 into the charge storage film IL3b of the third insulating film IL3, resulting in a lower-speed erase operation. During the read operation, a potential from each of the drains DR is less likely to be delivered to the memory gate electrode MG, resulting in a lower-speed read operation.

A study has been conducted on the level difference between the lower surface of the first memory gate electrode MGE1 (the contact interface between the first memory gate electrode MGE1 and the second insulating film IL2) and the lower surface of the second memory gate electrode MGE2 (the contact interface between the second memory gate electrode MGE2 and the third insulating film IL3). The result of the study will be described using FIG. 8B. Note that, in the description in the following cases (1) to (5), a contact interface refers to a surface parallel with the main surface of the semiconductor substrate SUB. Also, (1) to (5) shown in FIG. 8B correspond to the description in the following cases (1) to (5), respectively.

(1) In the case where the lower surface of the second memory gate electrode MGE2 is at the same height position as that of the contact interface between the first memory gate electrode MGE1 and the insulating film IL2c, an electric field is concentrated on the corner portion (portion B in FIG. 8A) of the second memory gate electrode MGE2, but a large effect is unlikely to be obtained. Accordingly, the memory gate electrode MG having the double-gate structure including the first and second memory gates MG1 and MG2 has an erase characteristic higher than that of the memory gate having the single-gate structure, but the effect thereof is not high.

(2) In the case where the lower surface of the second memory gate electrode MGE2 is located between the contact interface between the first memory gate electrode MGE1 and the insulating film IL2c and the contact interface between the insulating film IL2c and the charge storage film IL2b, an electric field is concentrated on the corner portion (portion B in FIG. 8A) of the second memory gate electrode MGE2 to increase an erase speed.

(3) In the case where the lower surface of the second memory gate electrode MGE2 is located between the contact interface between the insulating film IL2c and the charge storage film IL2b and the contact interface between the insulating film IL2a and the semiconductor substrate SUB, an electric field is more likely to be concentrated on the corner portion (portion B in FIG. 8A) of the second memory gate electrode MGE2 than in the case described above in the case (2), resulting in a further increased erase speed.

(4) In the case where the lower surface of the second memory gate electrode MGE2 is located in the range of 10 nm in the depth direction of the semiconductor substrate SUB from the contact interface between the insulating film IL2a and the semiconductor substrate SUB, the memory gate electrode MG has an erase characteristic approximately equal to or slightly lower than that obtained in the case (3) described above, but there is concern that a read operation is affected.

(5) In the case where the lower surface of the second memory gate electrode MGE2 is located at a depth of more than 10 nm in the depth direction of the semiconductor substrate SUB from the contact interface between the insulating film IL2a and the semiconductor substrate SUB, an electric field is less likely to be concentrated on the corner portion (portion B in FIG. 8A) of the second memory gate electrode MGE2 than in the cases (3) and (4) described above and the number of holes injected from the second memory gate electrode MGE2 into the charge storage film IL3b of the third insulating film IL3 is reduced, resulting in a lower-speed erase operation.

From the description given above in the cases (1) to (5), it can be considered that, in a proper case, the lower surface of the second memory gate electrode MGE2 is located at a height position lower than that of the lower surface of the first memory gate electrode MGE1 and higher than a depth of 10 nm from the contact interface between the second insulating film IL2 and the semiconductor substrate SUB. It can also be considered that, in an optimal case, the lower surface of the second memory gate electrode MGE2 is located at a height position lower than that of the lower surface of the first memory gate electrode MGE1 and higher than that of the contact interface between the second insulating film IL2 and the semiconductor substrate SUB.

<Basic Operations to Memory Cell>

A description will be given below of: (1) a read operation; (2) an erase operation; and (3) a write operation, which are three basic operations to a memory cell. To call these three operations, representative names are used. For example, the names of the erase operation and the write operation can also be switched to each other. The description will be given herein of a memory cell of an nMIS transistor type but, in principle, the same applies to a memory cell of a pMIS transistor type. By using the memory cell MC1 described above as an example of the memory cell of the nMIS transistor type, basic operations thereto will be described.

(1) Read Operation

By applying a voltage of, e.g., 1.35 V to the diffusion layer located closer to the selection gate electrode CGE and applying a voltage of, e.g., 1.35 V to the selection gate electrode CGE, the channel under the election gate electrode CGE is brought into an ON state. Here, an appropriate potential which allows the difference between the threshold voltage of the memory nMIS transistor obtained in a write state and the threshold voltage of the memory nMIS transistor obtained in an erase state (i.e., a middle potential between the threshold voltage in the write state and the threshold voltage in the erase state) to be determined is applied to each of the first and second memory gate electrodes MGE1 and MGE2. This allows the held charge information to be read as a current. When the middle potential between the threshold voltage in the write state and the middle potential in the threshold voltage in the erase state is set to 0 V here, the potential to be applied to each of the first and second memory gate electrodes MGE1 and MGE2 need not be boosted in a power supply circuit, which is appropriate for a high-speed read operation.

(2) Erase Operation

To each of the first and second memory gate electrodes MGE1 and MGE2, a voltage of, e.g., 12 V is applied. To the selection gate electrode CGE, a voltage of, e.g., 0 V is applied. To each of the diffusion layer located closer to the second memory gate electrode MGE2 and the diffusion layer located closer to the selection gate electrode CGE, a voltage of, e.g., 0 V is applied. However, the diffusion layer located closer to the selection gate electrode CGE may also be brought into an electrically open state. Also, a voltage of, e.g., 1 V is applied to the selection gate electrode CGE. As a result, holes are injected from the first memory gate electrode MGE1 into the charge storage film IL2b and from the second memory gate electrode MGE2 into the charge storage film IL3b to allow data to be erased.

Figure 9A:
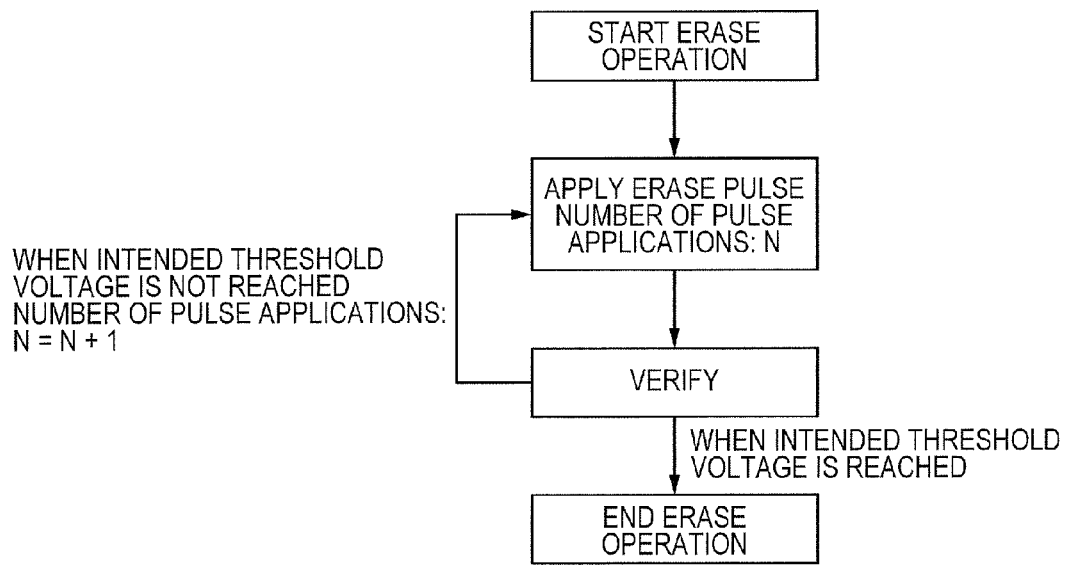
FIG. 9A is a flow chart showing an example of an erase operation to the MONOS-type nonvolatile memory cell according to Embodiment 1.

When data is actually erased, as shown in FIG. 9A, an erase pulse is applied to inject holes into the charge storage films IL2b and IL3b to erase data. Then, by a verification process, it is verified whether or not the memory cell MC1 has reached an intended threshold voltage. When the intended threshold voltage has not been reached, the erase pulse is applied again. Such a sequence as described above is repeatedly performed.

The voltages applied in a typical erase operation are as shown above, but erase conditions during the voltage application after the verification process need not necessarily be the same as erase conditions during the first voltage application. An example of the erase conditions in that case is shown in Table 1.

TABLE 1

| PULSE NUMBER | N = 1 | N > 1 |
|---|---|---|
| DIFFUSION LAYER LOCATED CLOSER TO SELECTION GATE | 0 V | 0 V |
| DIFFUSION LAYER LOCATED CLOSER TO MEMORY GATE | 0 V | 0 V |
| FIRST/SECOND MEMORY GATE | 12 V | 14 V |
| SELECTION GATE | 0 V | 0 V |
| WELL | 0 V | 0 V |

In another example of the voltages applied in the erase operation, as shown in Table 2, negative voltages may also be applied to the substrate (p-well PW), to the diffusion layer located closer to the selection gate electrode CGE, and to the diffusion layer located closer to the second memory gate electrode MGE2. In this case, the potential difference between each of the first and second memory gate electrodes MGE1 and MGE2 and the substrate (p-well PW) is larger than the potential difference between each of the first and second memory gate electrodes MGE1 and MGE2 and the selection gate electrode CGE. Accordingly, holes are injected into the charge storage film between each of the first and second memory gate electrodes MGE1 and MGE2 and the substrate (p-well PW). This achieves the effect of being able to efficiently annihilate the electrons injected into the charge storage film IL2b between the first memory gate electrode MGE1 and the substrate (p-well PW) and into the charge storage film IL3b between the second memory gate electrode MGE2 and the substrate (p-well PW) during a write operation.

TABLE 2

| PULSE NUMBER | N = 1 | N > 1 |
|---|---|---|
| DIFFUSION LAYER LOCATED CLOSER TO SELECTION GATE | −1 V | −1 V |
| DIFFUSION LAYER LOCATED CLOSER TO MEMORY GATE | −1 V | −1 V |
| FIRST/SECOND MEMORY GATE | 11 V | 13 V |
| SELECTION GATE | 0 V | 0 V |
| WELL | −1 V | −1 V |

(3) Write Operation

To each of the first and second memory gate electrodes MGE1 and MGE2, a voltage of, e.g., 10.5 V is applied and, to the selection gate electrode CGE, a voltage of, e.g., 0.9 V is applied. In addition, to the diffusion layer located closer to the second memory gate electrode MGE2, a voltage of, e.g., 4.6 V is applied and, to the diffusion layer located closer to the selection gate electrode CGE, a voltage lower than the voltage applied to the diffusion layer located closer to the second memory gate electrode MGE2, e.g., 0.3 V is applied. As a result, charges (electrons) are concentrically injected into the end portion of the first memory gate electrode MGE1 which is located closer to the selection gate electrode CGE and into the end portion of the second memory gate electrode MGE2 which is located closer to the first memory gate electrode MGE1. The injection method is called an SSI (Source Side Injection) injection method.

Figure 9B:
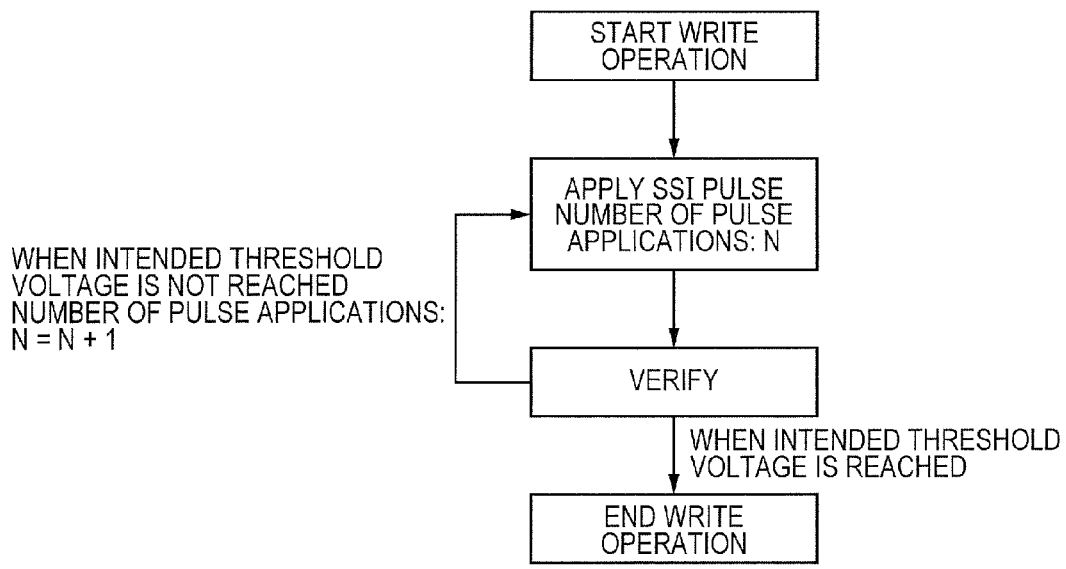
FIG. 9B is a flow chart showing an example of a write operation to the MONOS-type nonvolatile memory cell according to Embodiment 1.

When a data write operation is actually performed, as shown in FIG. 9B, voltage pulses (SSI pulses) for the SSI injection method are applied to inject electrons into the charge storage films IL2b and IL3b to perform the data write operation. Then, by a verification process, it is verified whether or not the memory cell MC1 has reached an intended threshold voltage. When the intended threshold voltage has not been reached, the SSI pulses are applied again. Such a sequence as described above is repeatedly performed.

The voltages applied in a typical write operation are as shown above but, in the same manner as in the data erase operation after the verification process, write conditions during the voltage application after the verification process need not necessarily be the same as write conditions during the first voltage application. An example of the write conditions in that case is shown in Table 3.

TABLE 3

| PULSE NUMBER | N = 1 | N > 1 |
|---|---|---|
| DIFFUSION LAYER LOCATED CLOSER TO SELECTION GATE | 0.3 V | 0.3 V |
| DIFFUSION LAYER LOCATED CLOSER TO MEMORY GATE | 4.5 V | 4.9 V |
| FIRST/SECOND MEMORY GATE | 10 V | 11 V |
| SELECTION GATE | 0.9 V | 0.9 V |
| WELL | 0 V | 0 V |

In another example of the voltages applied in the write operation, as shown in Table 4, a negative voltage may also be applied to the substrate (p-well PW). In this case, it is possible to increase the potential difference between the diffusion layer and the substrate (p-well PW), the potential difference between the first memory gate electrode MGE1 and the substrate (p-well PW), and the potential difference between the second memory gate electrode MGE2 and the substrate (p-well PW). This allows an increase in write speed.

TABLE 4

| PULSE NUMBER | N = 1 | N > 1 |
| --- | --- | --- |
| DIFFUSION LAYER LOCATED CLOSER TO SELECTION GATE | 0.3 V | 0.3 V |
| DIFFUSION LAYER LOCATED CLOSER TO MEMORY GATE | 4.5 V | 4.9 V |
| FIRST/SECOND MEMORY GATE | 10 V | 11 V |
| SELECTION GATE | 1.5 V | 1.5 V |
| WELL | −1 V | −1 V |

<Method of Manufacturing Semiconductor Device>

Figure 10:
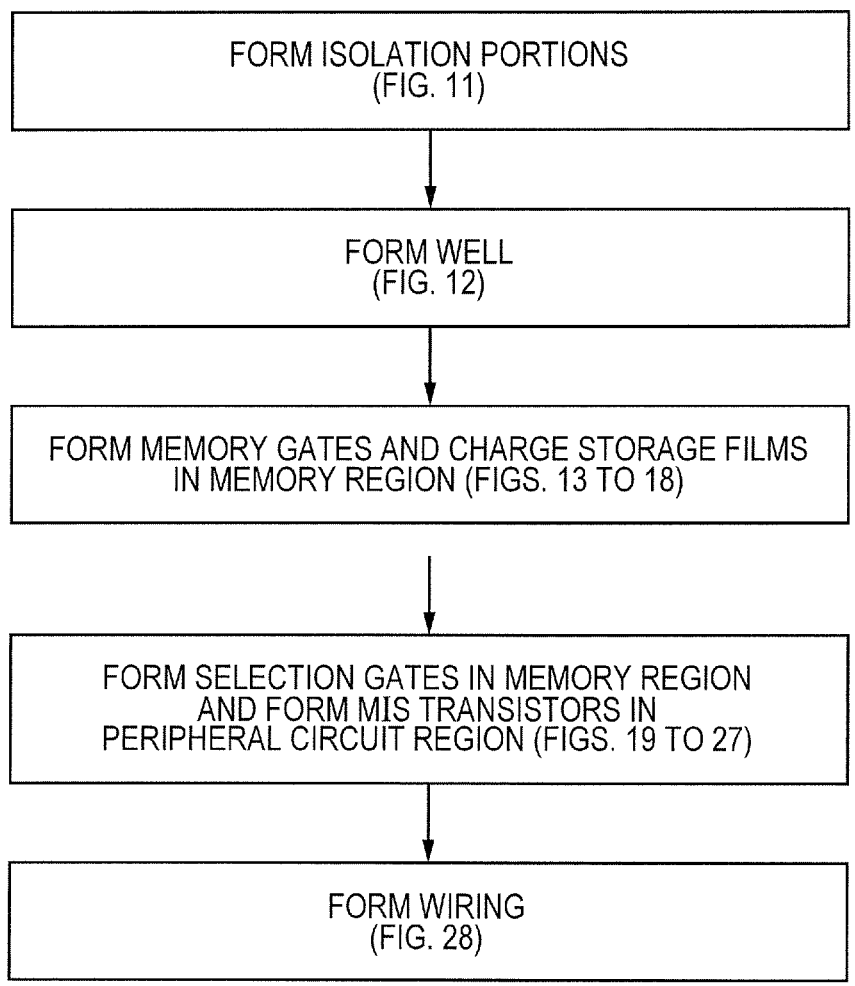
FIG. 10 is a flow chart showing an example of a manufacturing process of the MONOS-type nonvolatile memory cell according to Embodiment 1.

A method of manufacturing the semiconductor device according to Embodiment 1 will be described using FIGS. 10 to 28 in order of process steps. Here, by way of example, a method of manufacturing each of the memory cells formed in the memory region and each of the nMIS transistors formed in the peripheral circuit region will be described. FIG. 10 is a flow chart showing an example of a manufacturing process of the memory cell. FIGS. 11 to 28 are main-portion cross-sectional views of the memory cell formed in the memory region and the nMIS transistor formed in the peripheral circuit region during the manufacturing process of the semiconductor device.

Figure 11:
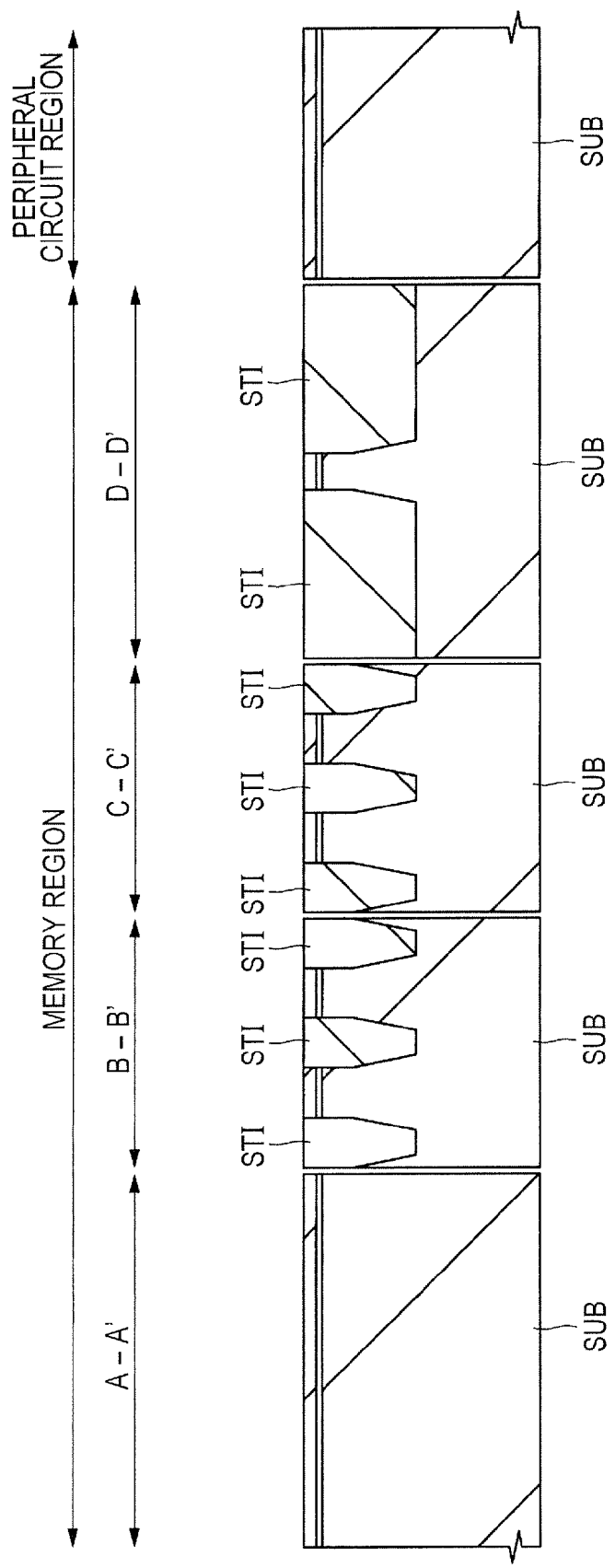
FIG. 11 is a main-portion cross-sectional view of each of the MONOS-type nonvolatile memory cells formed in a memory region and each of the n-channel MISFETs formed in a peripheral circuit region, which shows a manufacturing process of a semiconductor device according to Embodiment 1.

As shown in FIG. 11, in the main surface of the semiconductor substrate (which is a thin plate made of a semiconductor, having a generally circular two-dimensional shape, and referred to as a semiconductor wafer at this stage), e.g., the trench-type isolation portions STI, the active regions arranged so as to be surrounded by the isolation portions STI, and the like are formed. That is, after isolation trenches are formed in the predetermined portions of the semiconductor substrate SUB, an insulating film made of, e.g., silicon dioxide or the like is deposited over the main surface of the semiconductor substrate SUB. The insulating film is then polished by a CMP (Chemical Mechanical Polishing) method or the like so as to be left only in the isolation trenches to be embedded in the isolation trenches. Thus, the isolation portions STI are formed.

Figure 12:
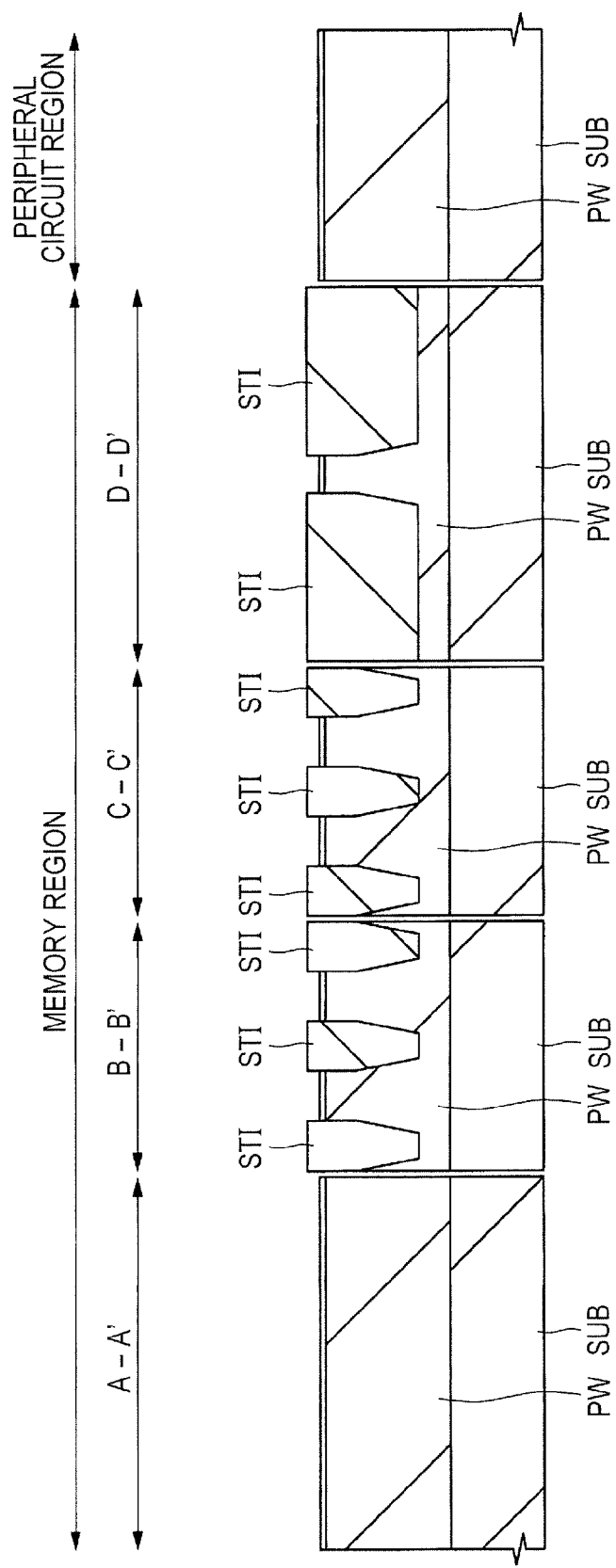
FIG. 12 is a main-portion cross-sectional view of the same portion as shown in FIG. 11 in the manufacturing process of the semiconductor device, which is subsequent to FIG. 11.

Next, as shown in FIG. 12, a p-type impurity is selectively ion-implanted into the semiconductor substrate SUB to form the p-well PW. Here, it may also be possible to ion-implant a predetermined impurity for forming a channel in the semiconductor substrate SUB in the memory region and ion-implant a predetermined impurity for forming a channel in the semiconductor substrate SUB in the peripheral circuit region, though the depiction thereof is omitted.

Figure 13:
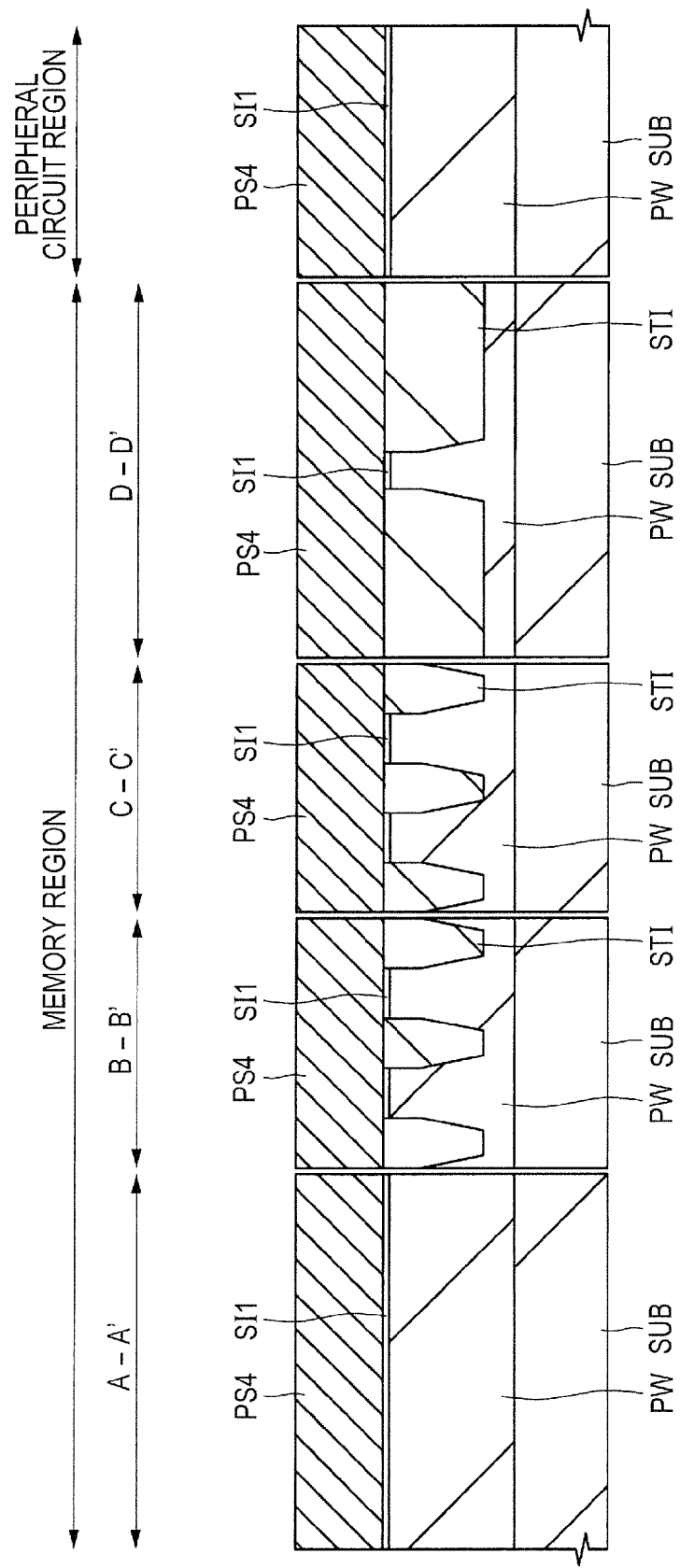
FIG. 13 is a main-portion cross-sectional view of the same portion as shown in FIG. 11 in the manufacturing process of the semiconductor device, which is subsequent to FIG. 12.

Next, as shown in FIG. 13, after the main surface of the semiconductor substrate SUB is etched by a wet etching method, a silicon dioxide film SI1 is formed in the main surface of the semiconductor substrate SUB by a thermal oxidation method. The silicon dioxide film SI1 has a thickness of, e.g., about 2 nm. Subsequently, over the silicon dioxide film SI1, a polycrystalline silicon film PS4 is deposited. The polycrystalline silicon film PS4 has a thickness of, e.g., about 120 nm.

Figure 14:
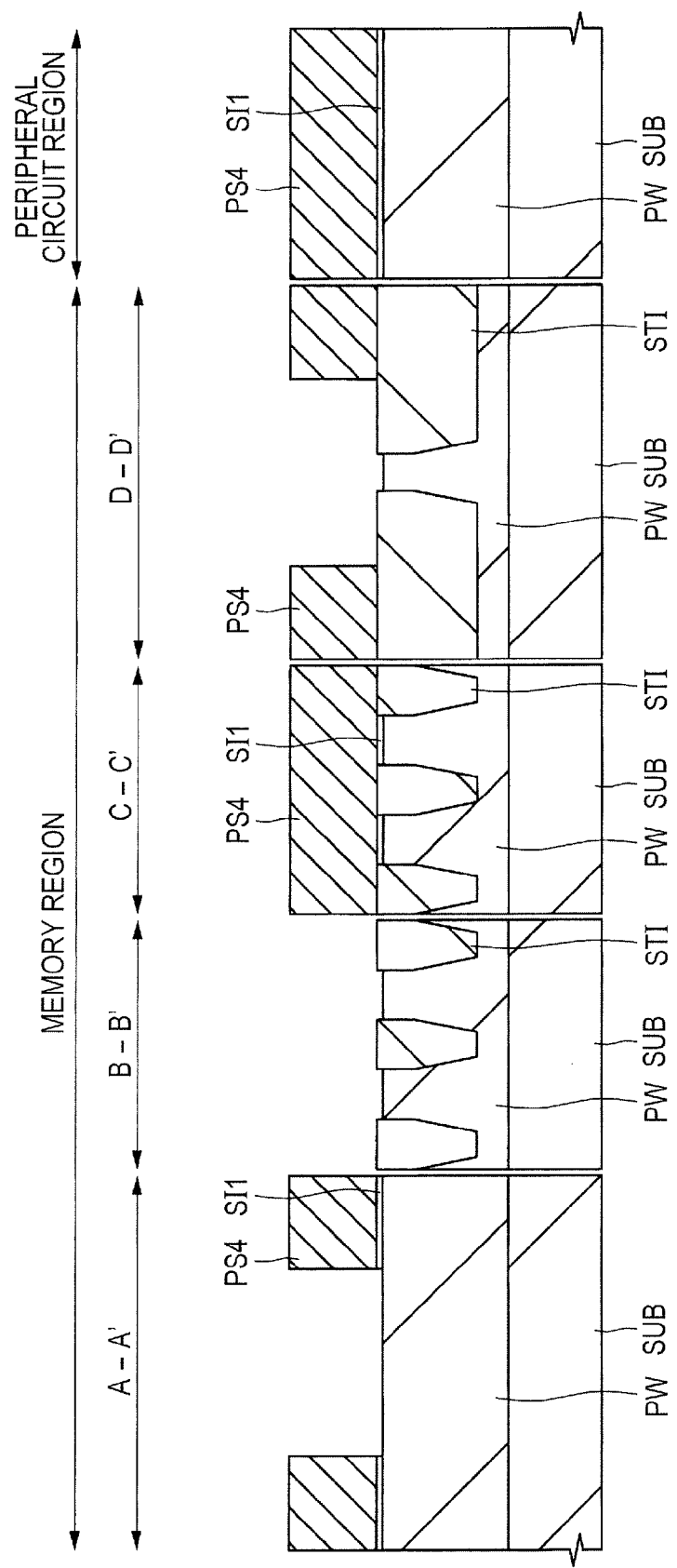
FIG. 14 is a main-portion cross-sectional view of the same portion as shown in FIG. 11 in the manufacturing process of the semiconductor device, which is subsequent to FIG. 13.

Next, as shown in FIG. 14, by a lithographic method and a dry etching method, the polycrystalline silicon film PS4 and the silicon dioxide film SI1 are removed from the regions where the memory gates MG are to be formed in the subsequent step. Thus, dummy patterns each made of the polycrystalline silicon film PS4 are formed.

Figure 15:
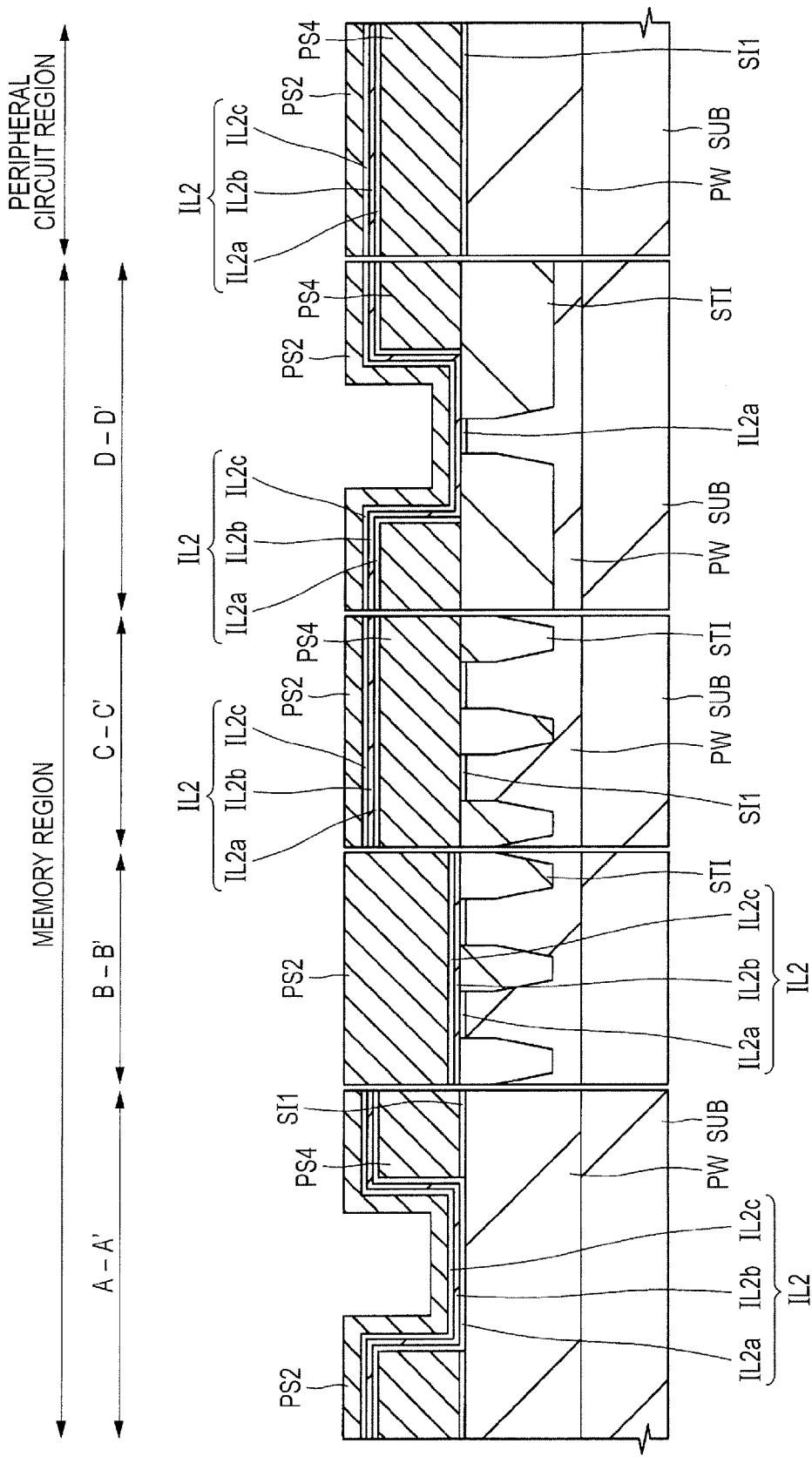
FIG. 15 is a main-portion cross-sectional view of the same portion as shown in FIG. 11 in the manufacturing process of the semiconductor device, which is subsequent to FIG. 14.

Next, as shown in FIG. 15, over the main surface of the semiconductor substrate SUB, the insulating film IL2a made of, e.g., silicon dioxide, the charge storage film IL2b made of, e.g., silicon nitride to serve as the insulating film having a trap level, and the insulating film IL2c made of, e.g., silicon oxynitride are successively formed to form the second insulating film IL2. The insulating film IL2a is formed by, e.g., a thermal oxidation method. The charge storage film IL2b is formed by, e.g., a CVD (Chemical Vapor Deposition) method. The insulating film IL2c is formed by, e.g., a CVD method. The insulating film IL2a has a thickness of, e.g., about 4 nm. The insulating film IL2b has a thickness of, e.g., about 6 nm. The insulating film IL2c has a thickness of, e.g., about 8 nm.

As the charge storage film IL2b, a high-dielectric-constant film having a dielectric constant higher than that of a silicon nitride film, such as, e.g., an aluminum oxide (alumina) film, a hafnium oxide film, or a tantalum oxide film may also be used. To improve the processibility of the memory gates MG to be formed in the subsequent step, regions where dummy patterns having the same shapes as those of the memory cells MC1 are formed may also be provided.

Subsequently, over the main surface of the semiconductor substrate SUB, a polycrystalline silicon film PS2 is deposited. The polycrystalline silicon film PS2 is formed by a CVD method and has a thickness of, e.g., about 40 nm.

Figure 16:
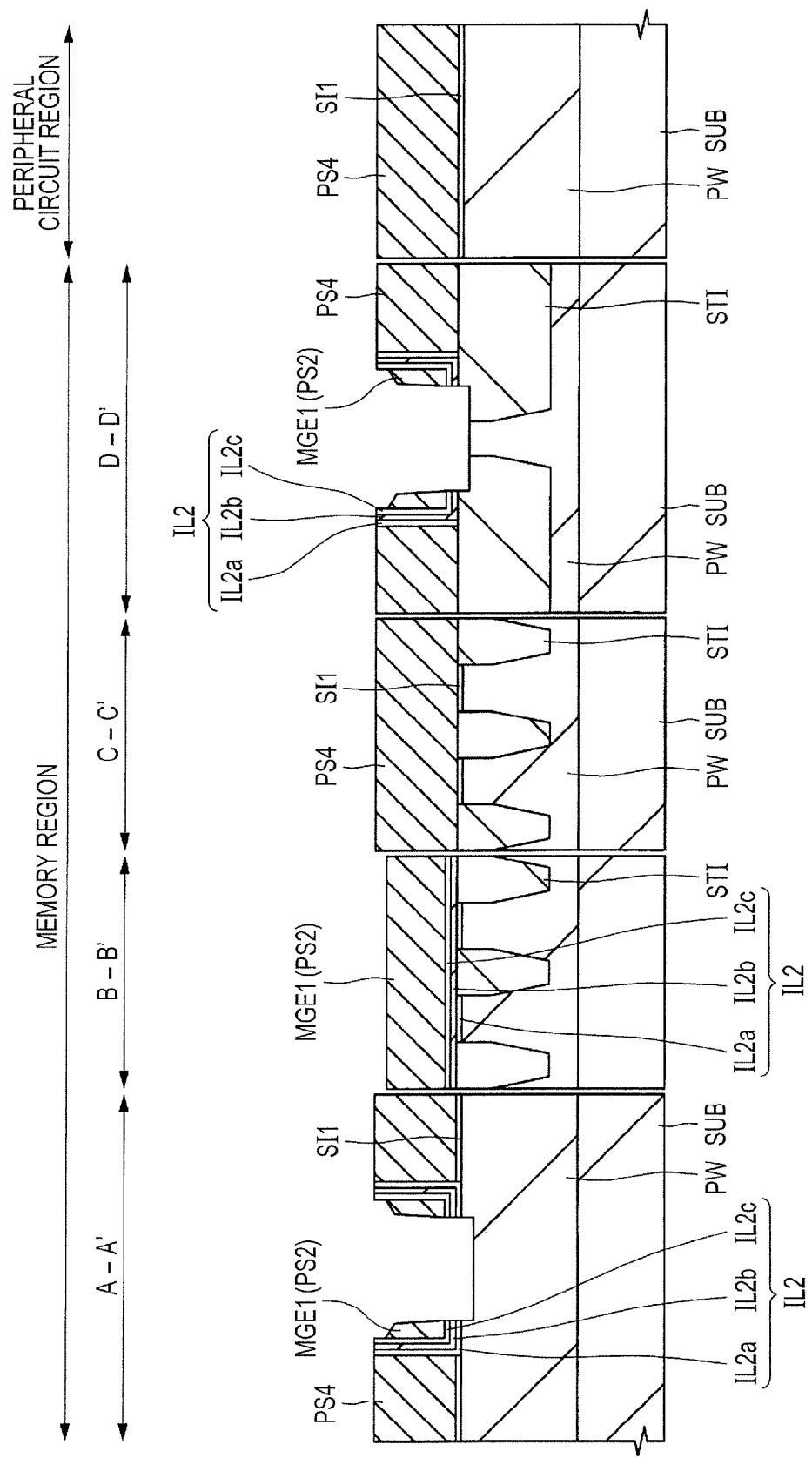
FIG. 16 is a main-portion cross-sectional view of the same portion as shown in FIG. 11 in the manufacturing process of the semiconductor device, which is subsequent to FIG. 15.

Next, as shown in FIG. 16, the polycrystalline silicon film PS2 is processed by an anisotropic dry etching method. Thus, in the memory region, the first memory gate electrodes MGE1 each made of the polycrystalline silicon film PS2 and having a sidewall shape are formed over the side surfaces of the dummy patterns each made of the polycrystalline silicon film PS4 via the second insulating films IL2. While the first memory gate electrodes MGE1 are formed, the exposed second insulating films IL2 are removed and the semiconductor substrate SUB exposed between the adjacent first memory gate electrodes MGE1 is removed in the depth direction thereof to form trench portions in the main surface of the semiconductor substrate SUB.

To remove an etching damage, it is desirable to remove the semiconductor substrate SUB over a depth of 10 nm or more in the depth direction. However, in the trenches, the second memory gate electrodes MGE2 are formed in the subsequent step. To prevent a reduction in the number of the holes injected from the second memory gate electrodes MGE2 into the charge storage film IL3b of the third insulating film IL3 during the erase operation and the resulting reduction in the speed of the erase operation, as has been described above using FIG. 8B, it is desirable to remove the semiconductor substrate SUB over a depth shallower than 28 nm (the thickness of the second insulating film IL2 (4 nm+6 nm+8 nm)+10 nm). Accordingly, it is desirable to remove the semiconductor substrate SUB over a depth of, e.g., about 10 to 28 nm in the depth direction.

Between the dummy patterns each made of the polycrystalline silicon film PS4 and the first memory gate electrodes MGE1, the second insulating films IL2 in each of which the insulating film IL2a, the charge storage film IL2b, and the insulating film IL2c are successively stacked in order of increasing distance from the dummy pattern made of the polycrystalline silicon film PS4 are formed. On the other hand, between the semiconductor substrate SUB and the first memory gate electrodes MGE1, the second insulating films IL2 in each of which the insulating film IL2a, the charge storage film IL2b, and the insulating film IL2c are successively stacked in order of increasing distance from the semiconductor substrate SUB are formed.

Figure 17:
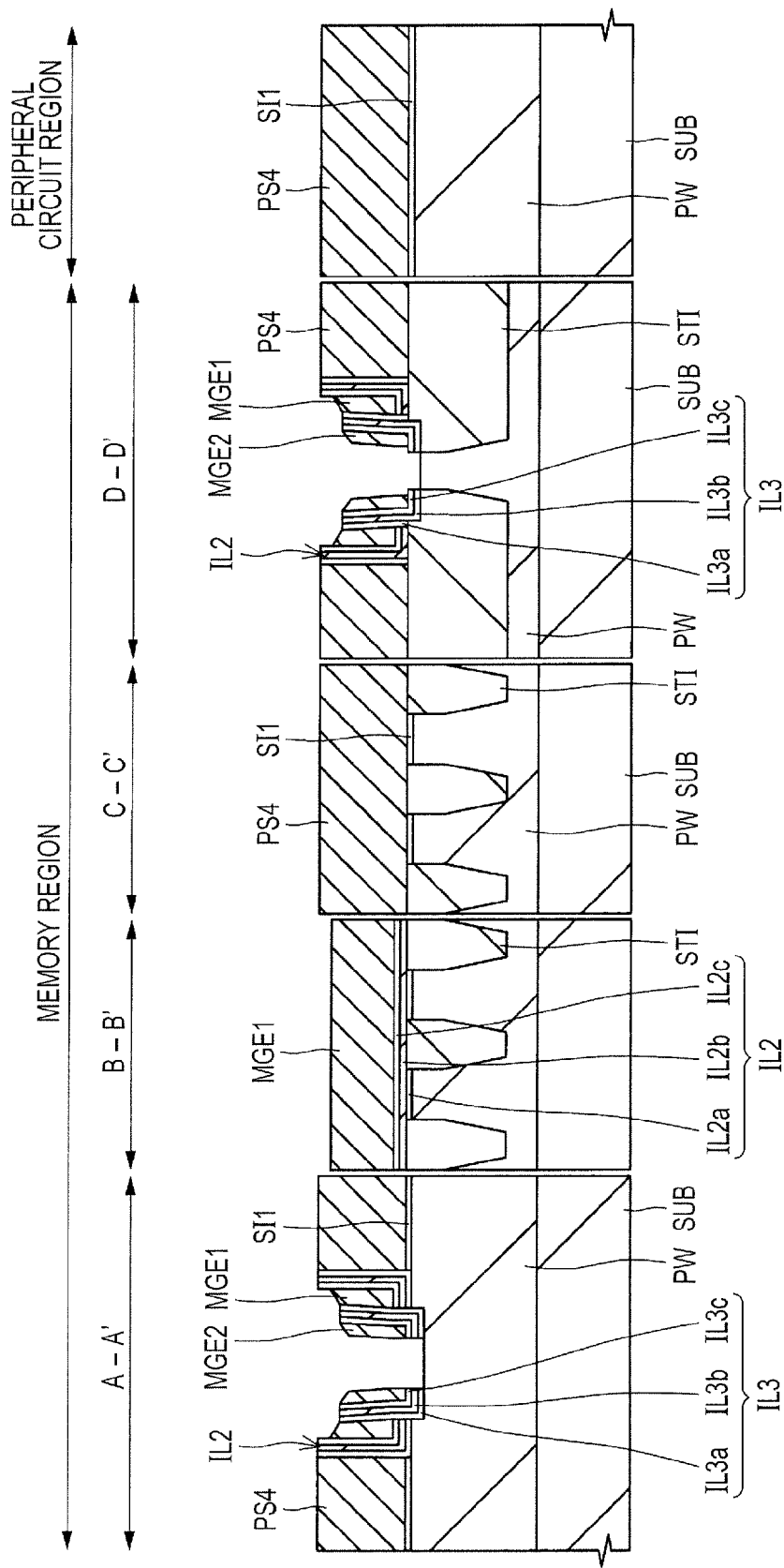
FIG. 17 is a main-portion cross-sectional view of the same portion as shown in FIG. 11 in the manufacturing process of the semiconductor device, which is subsequent to FIG. 16.

Next, as shown in FIG. 17, in the same manner as in the manufacturing step described above using FIGS. 15 and 16, the second memory gate electrodes MGE2 are formed over the respective side surfaces of the first memory gate electrodes MGE1. Between the first and second memory gate electrodes MGE1 and MGE2, the third insulating films IL3 in each of which the insulating film IL3a, the charge storage film IL3b, and the insulating film IL3c are successively stacked in order of increasing distance from the first memory gate MG1 are formed. On the other hand, between the semiconductor substrate SUB and the second memory gate electrodes MGE2, the third insulating films IL3 in each of which the insulating film IL3a, the charge storage film IL3b, and the insulating film IL3c are successively stacked in order of increasing distance from the semiconductor substrate SUB are formed.

Figure 18:
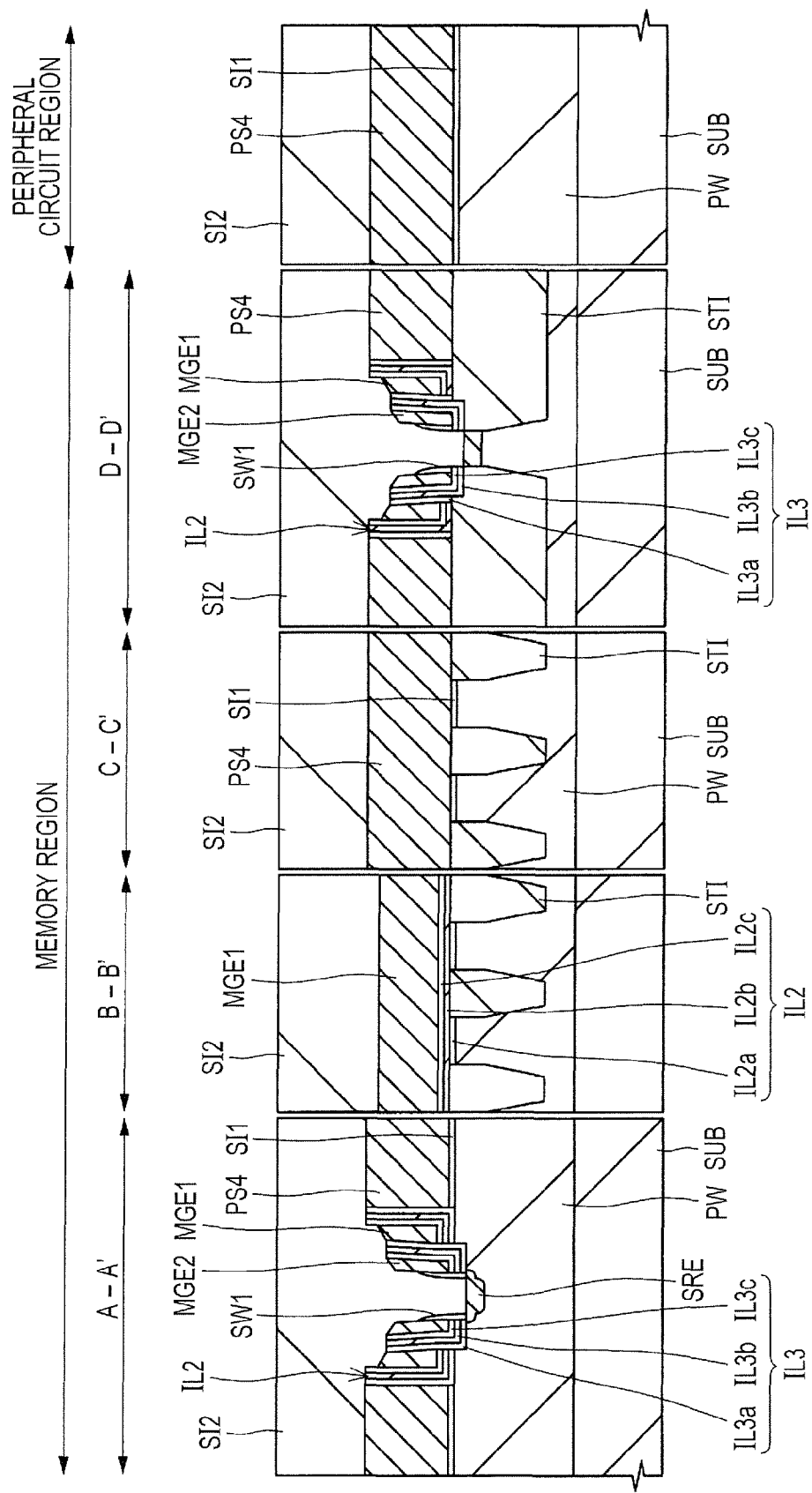
FIG. 18 is a main-portion cross-sectional view of the same portion as shown in FIG. 11 in the manufacturing process of the semiconductor device, which is subsequent to FIG. 17.

Next, as shown in FIG. 18, into the semiconductor substrate SUB interposed between the adjacent second memory gate electrodes MGE2 in the memory region, an n-type impurity, e.g., arsenic is ion-implanted to form a relatively-lower-concentration $n^-$-type semiconductor region. Subsequently, over the main surface of the semiconductor substrate SUB, an insulating film is deposited and processed by an anisotropic dry etching method. Thus, in the memory region, sidewalls SW1 are formed over the respective side surfaces of the second memory gate electrodes MGE2. Subsequently, into the semiconductor substrate SUB interposed between the adjacent second memory gate electrodes MGE2 in the memory region, an n-type impurity, e.g., arsenic is ion-implanted to form a relatively-higher-concentration $n^+$-type semiconductor region and thus form the source region SRE including the relatively-lower-concentration $n^-$-type semiconductor region and the relatively-higher-concentration $n^+$-type semiconductor region.

Subsequently, over the main surface of the semiconductor substrate SUB, a silicon dioxide film SI2 is formed. Here, the silicon dioxide film SI2 is removed by a wet etching method in the subsequent step. Accordingly, as the silicon dioxide film SI2, e.g., a SOG (Spin On Glass) film having a high wet etching rate or the like is preferred.

Figure 19:
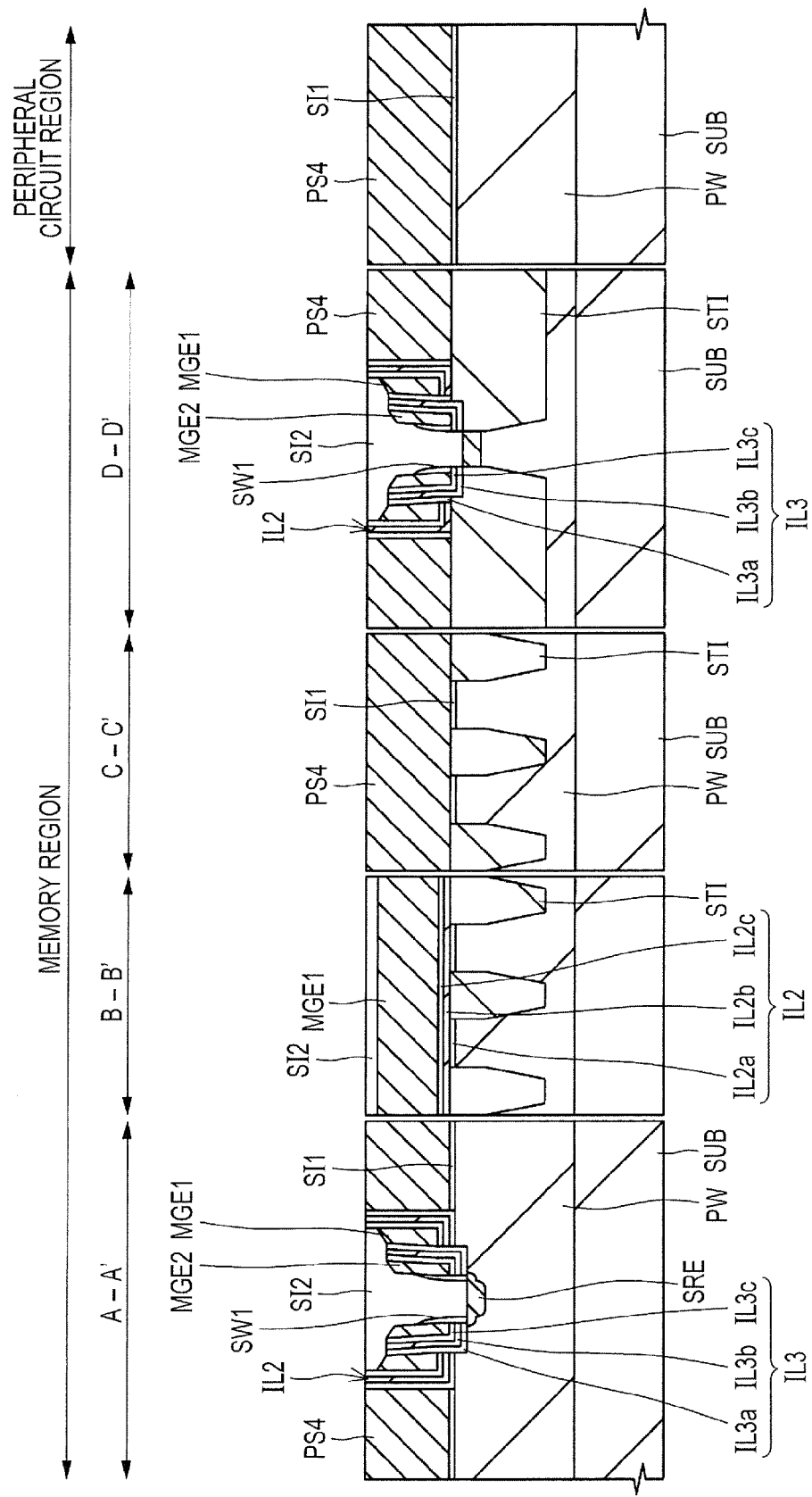
FIG. 19 is a main-portion cross-sectional view of the same portion as shown in FIG. 11 in the manufacturing process of the semiconductor device, which is subsequent to FIG. 18.

Next, as shown in FIG. 19, polishing which ends at the polycrystalline silicon film PS4 is performed by a CMP method to remove the silicon dioxide film SI2 over the polycrystalline silicon film PS4.

Figure 20:
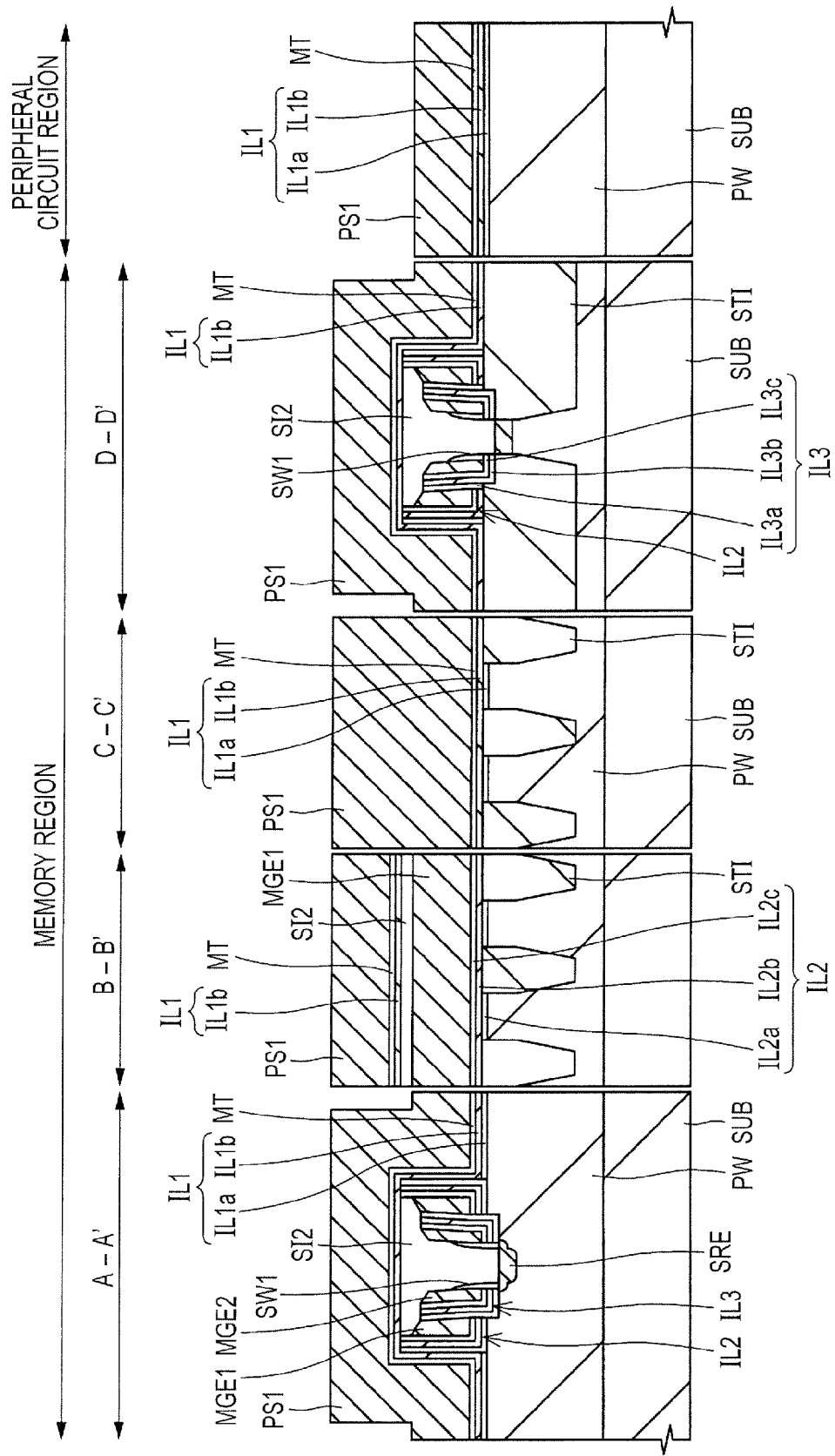
FIG. 20 is a main-portion cross-sectional view of the same portion as shown in FIG. 11 in the manufacturing process of the semiconductor device, which is subsequent to FIG. 19.

Next, as shown in FIG. 20, by a dry etching method and a wet etching method, the polycrystalline silicon film PS4 and the silicon dioxide film SI1 are removed. Subsequently, over the main surface of the semiconductor substrate SUB exposed in the memory region and the peripheral circuit region, the insulating film IL1a made of, e.g., silicon dioxide is formed by a thermal oxidation method. The insulating film IL1a has a thickness of, e.g., about 1 nm. Subsequently, over the main surface of the semiconductor substrate SUB, the high-dielectric-constant film IL1b made of, e.g., hafnium oxide is formed to form the first insulating film IL1 including the insulating film IL1a and the high-dielectric-constant film IL1b. The high-dielectric-constant film IL1b has a thickness of, e.g. about 5 nm. Subsequently, over the first insulating film IL1, the metal film MT made of, e.g., titanium nitride is formed. The metal film MT functions as a barrier film which prevents a reaction between the high-dielectric-constant film IL1b and the selection gate electrode CGE. The metal film MT has a thickness of, e.g., about 10 nm. Subsequently, over the metal film MT, the polycrystalline silicon film PS1 is deposited. The polycrystalline silicon film PS1 has a thickness of, e.g., about 100 nm.

Figure 21:
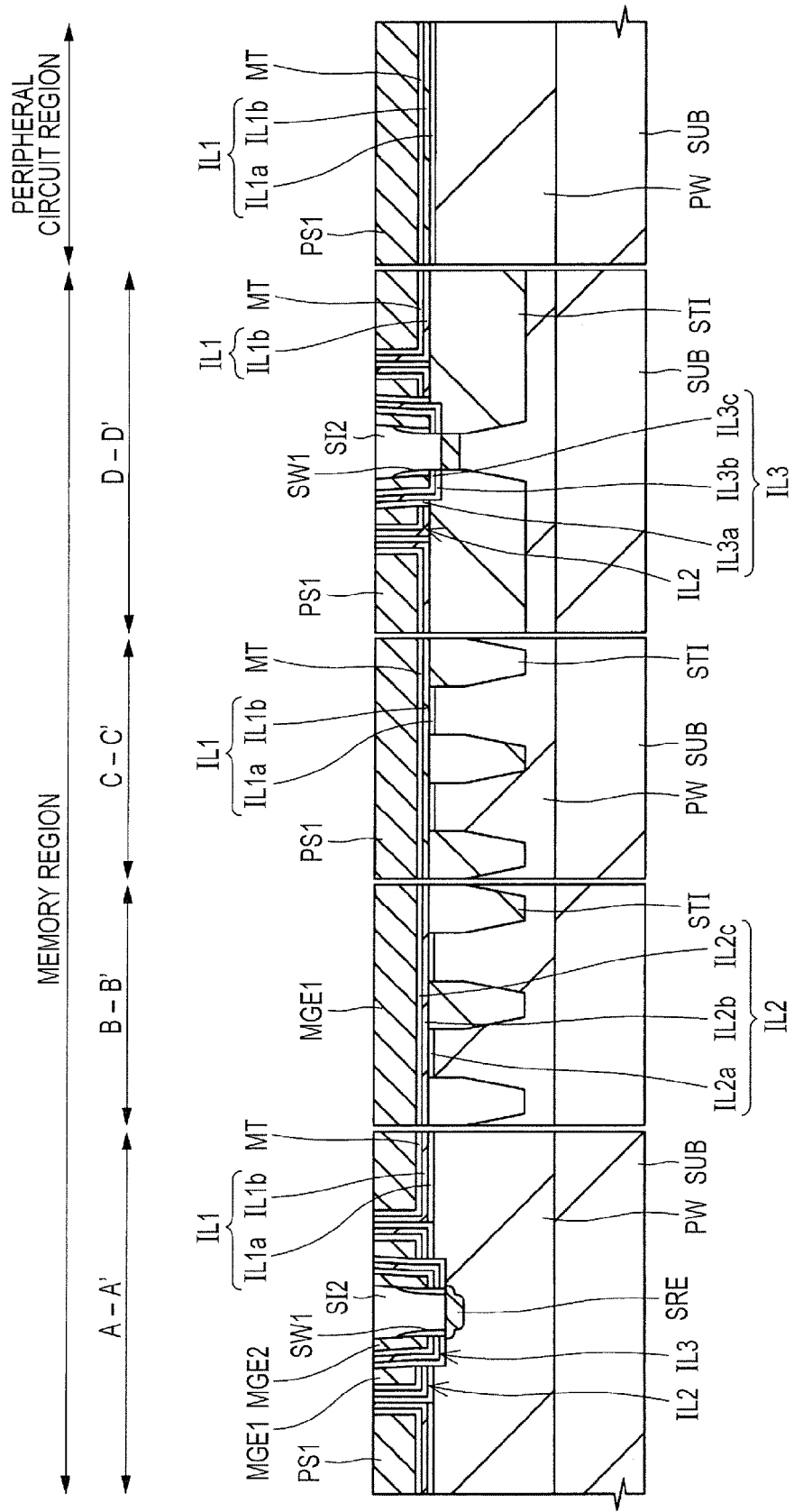
FIG. 21 is a main-portion cross-sectional view of the same portion as shown in FIG. 11 in the manufacturing process of the semiconductor device, which is subsequent to FIG. 20.

Next, as shown in FIG. 21, the polycrystalline silicon film PS1, the metal film MT, the first, second, and third insulating films IL1, IL2, and IL3, the silicon dioxide film SI2, and the first and second memory gate electrodes MGE1 and MGE2 are polished by a CMP method to have planarized top surfaces. A height from the main surface of the semiconductor substrate SUB to each of the top surfaces is, e.g., about 80 nm.

Figure 22:
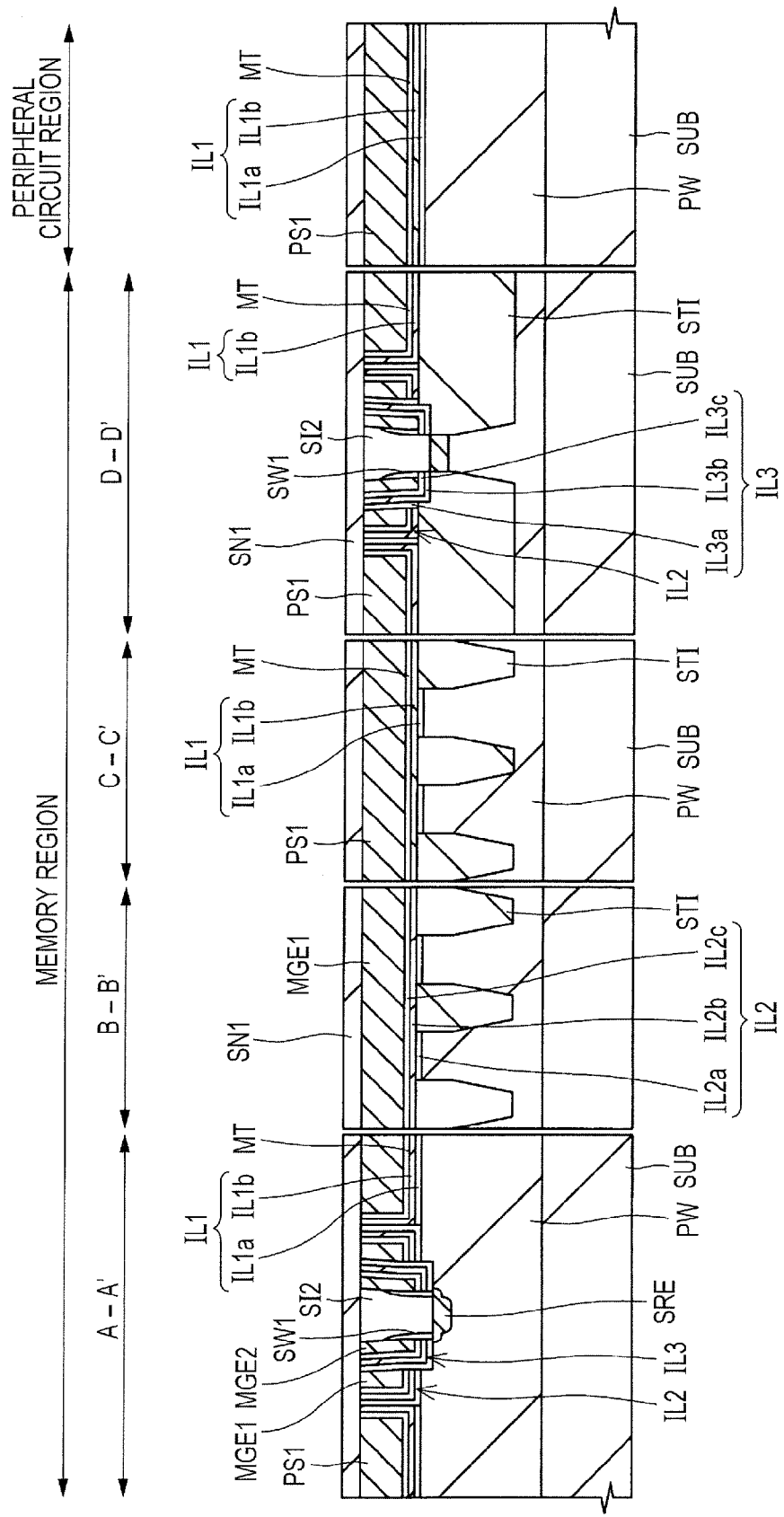
FIG. 22 is a main-portion cross-sectional view of the same portion as shown in FIG. 11 in the manufacturing process of the semiconductor device, which is subsequent to FIG. 21.

Next, as shown in FIG. 22, over the main surface of the semiconductor substrate SUB, a silicon nitride film SN1 is deposited.

Figure 23:
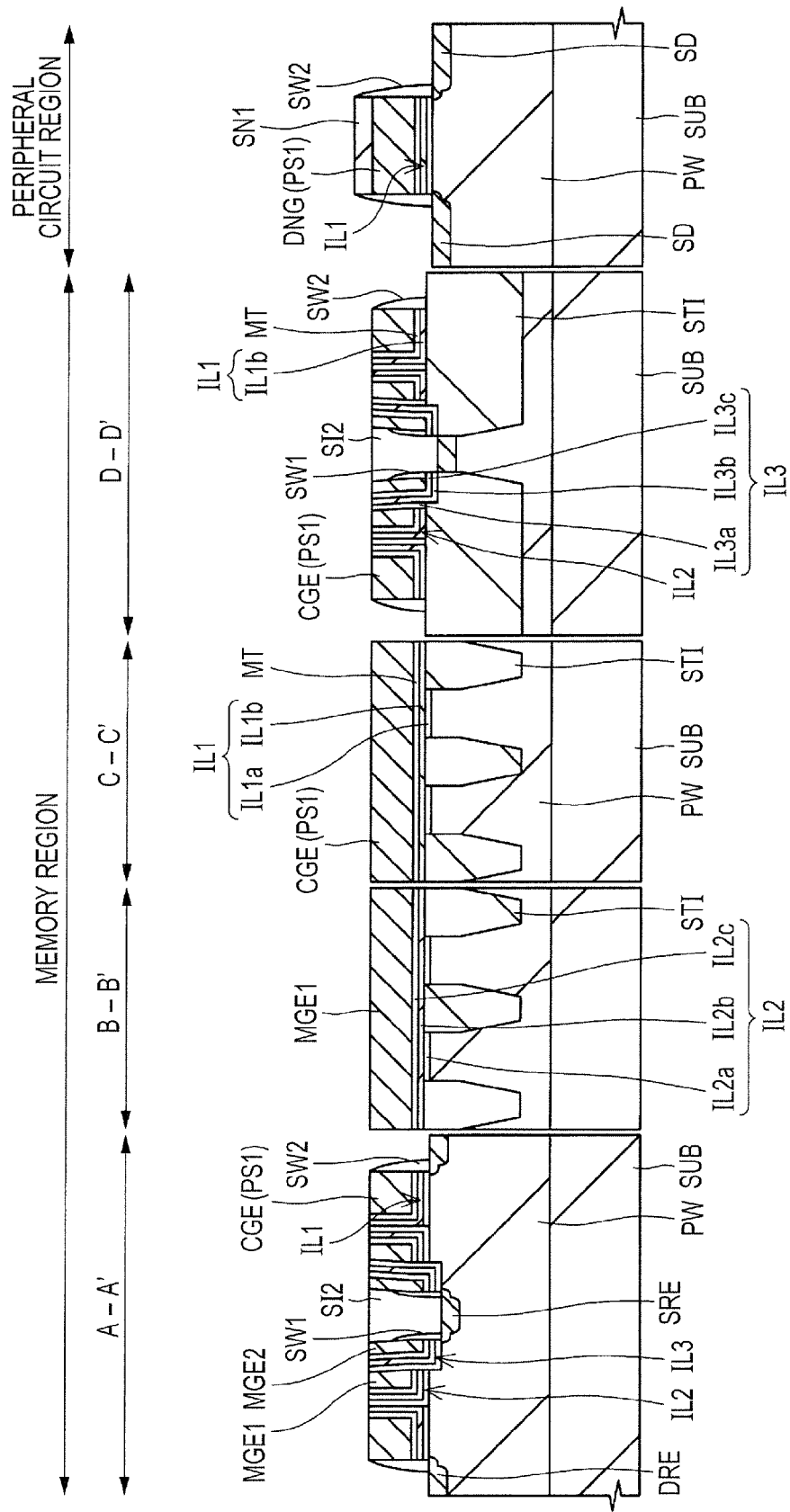
FIG. 23 is a main-portion cross-sectional view of the same portion as shown in FIG. 11 in the manufacturing process of the semiconductor device, which is subsequent to FIG. 22.

Next, as shown in FIG. 23, the silicon nitride film SN1 is removed from the region other than the area of the peripheral circuit region where the gate electrode of the nMIS transistor is formed. Subsequently, by a lithographic method and a dry etching method, the polycrystalline silicon film PS1, the metal film MT, and the first insulating film IL1 are processed. Thus, in the memory region, the selection gate electrodes CGE each made of the polycrystalline silicon film PS1 are formed. Between each of the selection gate electrodes CGE and the first memory gate electrode MGE1, the second insulating film IL2, the high-dielectric-constant film IL1b forming the first insulating film ILL and the metal film MT are formed in order of increasing distance from the first memory gate electrode MGE1. Between the semiconductor substrate SUB and each of the selection gate electrodes CGE, the first insulating film IL1 and the metal film MT are formed in order of increasing distance from the semiconductor substrate SUB. On the other hand, in the peripheral circuit region, a dummy gate electrode DNG for the nMIS transistor which is made of the polycrystalline silicon film PS1 is formed.

Subsequently, an n-type impurity, e.g., arsenic is ion-implanted into the semiconductor substrate SUB interposed between the adjacent selection gate electrodes CGE in the memory region and into the semiconductor substrate SUB in the peripheral circuit region to form relatively-lower-concentration $n^-$-type semiconductor regions. Subsequently, over the main surface of the semiconductor substrate SUB, an insulating film is deposited and processed using an anisotropic dry etching method. Thus, in the memory region, sidewalls SW2 are formed over the respective side surfaces of the selection gate electrodes CGE which are located opposite to the first and second memory gate electrodes MGE1 and MGE2 while, in the peripheral circuit region, the sidewalls SW2 are formed over the both side surfaces of the dummy gate electrode DNG.

Subsequently, an n-type impurity, e.g., arsenic is ion-implanted into the semiconductor substrate SUB interposed between the adjacent selection gate electrodes CGE in the memory region and into the semiconductor substrate SUB in the peripheral circuit region to form relatively-higher-concentration $n^+$-type semiconductor regions. Thus, in the memory region, the drain regions DRE each including the relatively-lower-concentration $n^-$-type semiconductor region and the relatively-higher-concentration $n^+$-type semiconductor region are formed while, in the peripheral circuit region, source/drain regions SD of the nMIS transistor each including the relatively-lower-concentration $n^-$-type semiconductor region and the relatively-higher-concentration $n^+$-type semiconductor region are simultaneously formed.

Figure 24:
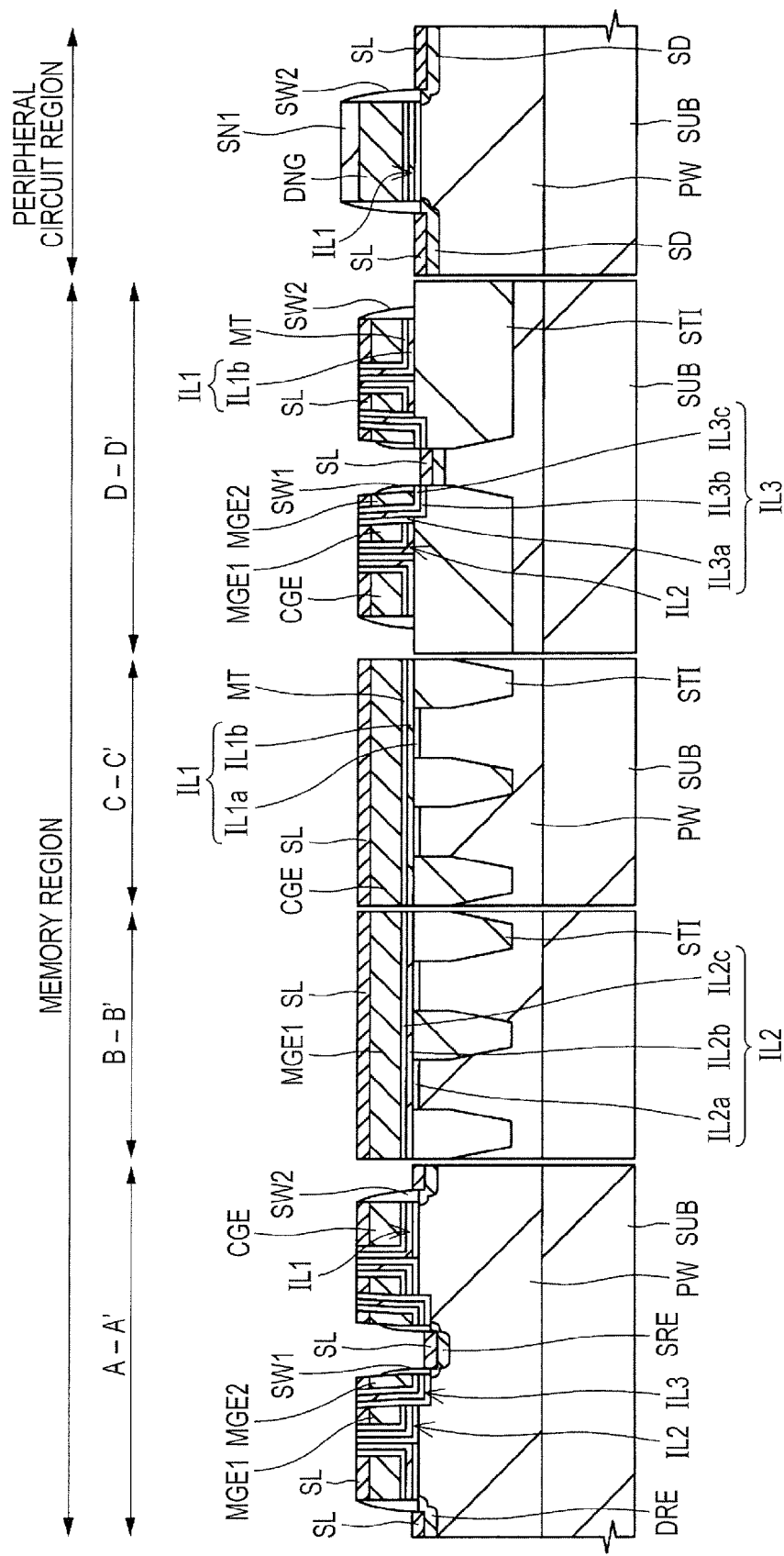
FIG. 24 is a main-portion cross-sectional view of the same portion as shown in FIG. 11 in the manufacturing process of the semiconductor device, which is subsequent to FIG. 23.

Next, as shown in FIG. 24, the silicon dioxide film SI2 is removed by a wet etching method. Thus, in the memory region, the respective upper surfaces of the first and second memory gate electrodes MGE1 and MGE2, the selection gate electrodes, the source region SRE, and the drain regions DRE are exposed while, in the peripheral circuit region, the upper surfaces of the source/drain regions are exposed.

Subsequently, by a salicide (Self Align silicide) process, the silicide films SL are formed in the respective upper surfaces of the first and second memory gate electrodes MGE1 and MGE2, the selection gate electrodes CGE, the source region SRE, and the drain regions DRE in the memory region, while being formed in the upper surfaces of the source/drain regions SD in the peripheral circuit region. For the silicide films SL, e.g., nickel silicide, cobalt silicide, or the like is used.

By forming the silicide films SL, it is possible to reduce the coupling resistance between each of the silicide films SL and the plug formed thereover or the like. In the memory cell region, it is possible to reduce the respective resistances of the first and second memory gate electrodes MGE1 and MGE2, the selection gate electrodes CGE, the source region SRE, and the drain regions DRE. In the peripheral circuit region, it is possible to reduce the resistances of the source/drain regions SD of the nMIS transistor.

By the manufacturing steps that have been described heretofore, in the memory region, as shown in, e.g., FIG. 4 described above, the selection gates CG in each of which the first gate insulating film GI1 made of the first insulating film IL1, the selection gate electrode CGE, and the silicide film SL are stacked are formed. Also, the first memory gates MG1 in each of which the second gate insulating film GI2 made of the second insulating film IL2, the first memory gate electrode MGE1, and the silicide film SL are stacked are formed, and the second memory gates MG2 in each of which the third gate insulating film GI3 made of the third insulating film IL3, the second memory gate electrode MGE2, and the silicide film SL are stacked are formed. Thus, the memory gates MG each including the first and second memory gates MG1 and MG2 are formed. Also, the source SR is formed in which the source region SRE and the silicide film SL are stacked, and the drains DR in each of which the drain region DRE and the silicide film SL are stacked are formed.

In this manner, in the memory region, as shown in, e.g., FIG. 4 described above, the memory cell MC1 including the memory gates MGE, the selection gates CG, the source SR, and the drains DR is generally completed.

Figure 25:
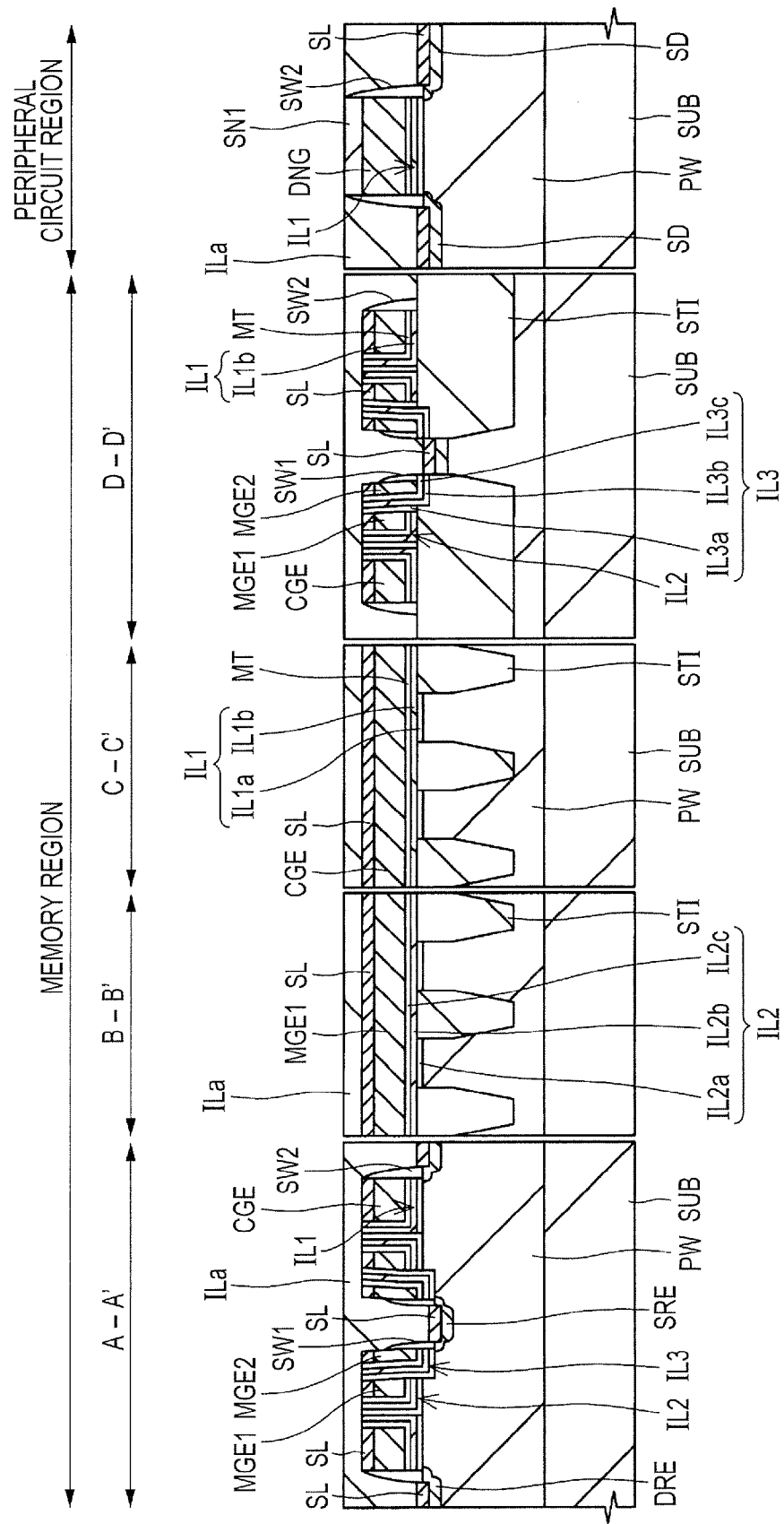
FIG. 25 is a main-portion cross-sectional view of the same portion as shown in FIG. 11 in the manufacturing process of the semiconductor device, which is subsequent to FIG. 24.

Next, as shown in FIG. 25, over the main surface of the semiconductor substrate SUB, the silicon dioxide film ILa is deposited by a CVD method. Then, polishing which ends at the silicon nitride film SN1 is performed by, e.g., a CMP method to planarize the top surface of the silicon dioxide film ILa.

Figure 26:
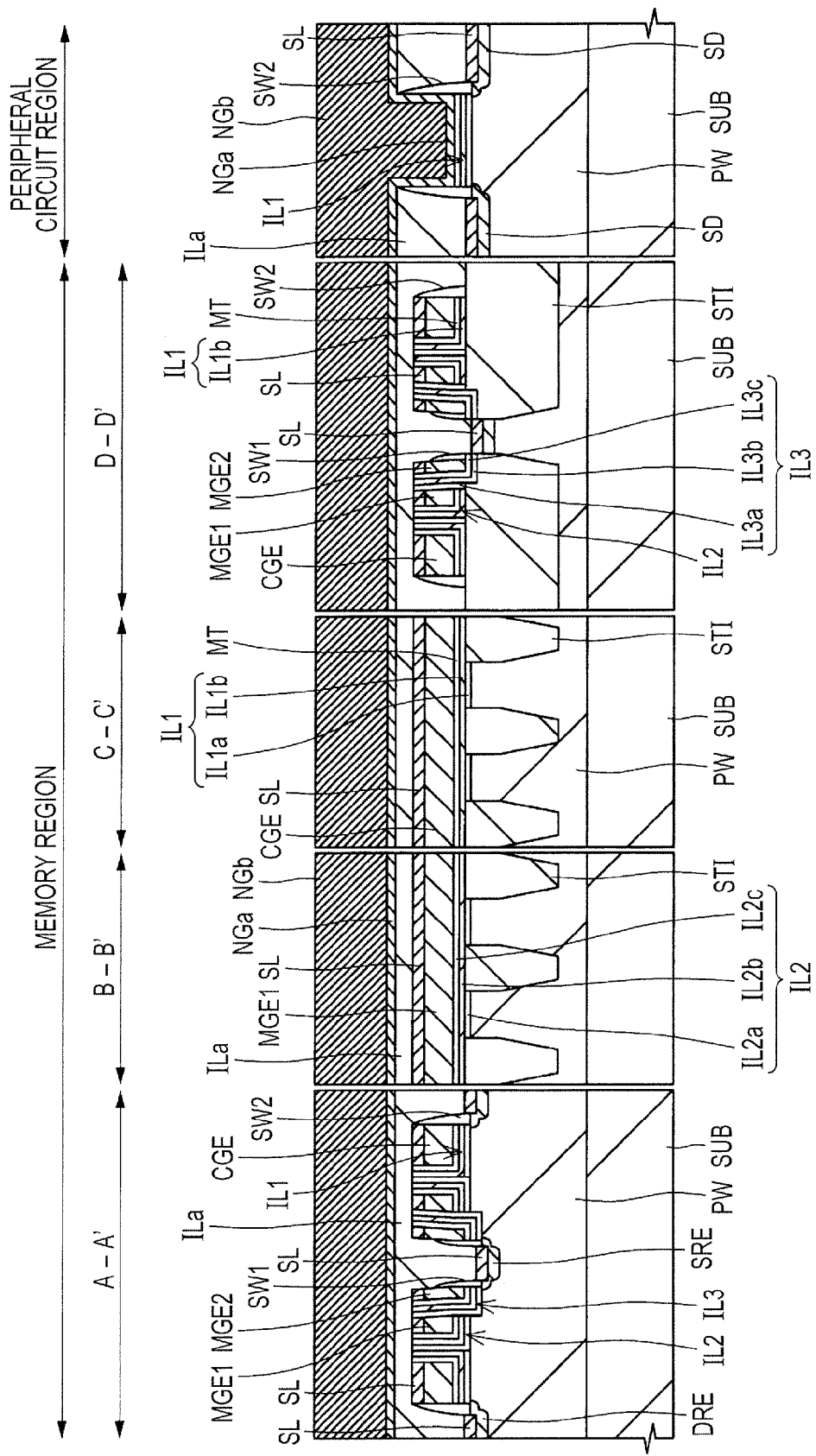
FIG. 26 is a main-portion cross-sectional view of the same portion as shown in FIG. 11 in the manufacturing process of the semiconductor device, which is subsequent to FIG. 25.

Then, as shown in FIG. 26, the silicon nitride film SN1 is removed by a wet etching method. Subsequently, the dummy gate electrode DNG in the peripheral circuit region is removed therefrom.

Subsequently, over the main surface of the semiconductor substrate SUB, a metal electrode film NGa and an aluminum film NGb are successively deposited. The metal electrode film NGa is a multi-layer film in which, e.g., tantalum nitride, titanium, and aluminum are successively formed in order of increasing distance from the main surface of the semiconductor substrate SUB. The metal electrode film NGa has a thickness of, e.g., about 20 nm. Here, the description has been given of the method of manufacturing the nMIS transistor as the semiconductor element formed in the peripheral circuit region. However, in the case of manufacturing a pMIS transistor, a multi-layer film is used in which, e.g., tantalum nitride, titanium nitride, and tantalum nitride are successively formed in order of increasing distance from the main surface of the semiconductor substrate SUB.

Figure 27:
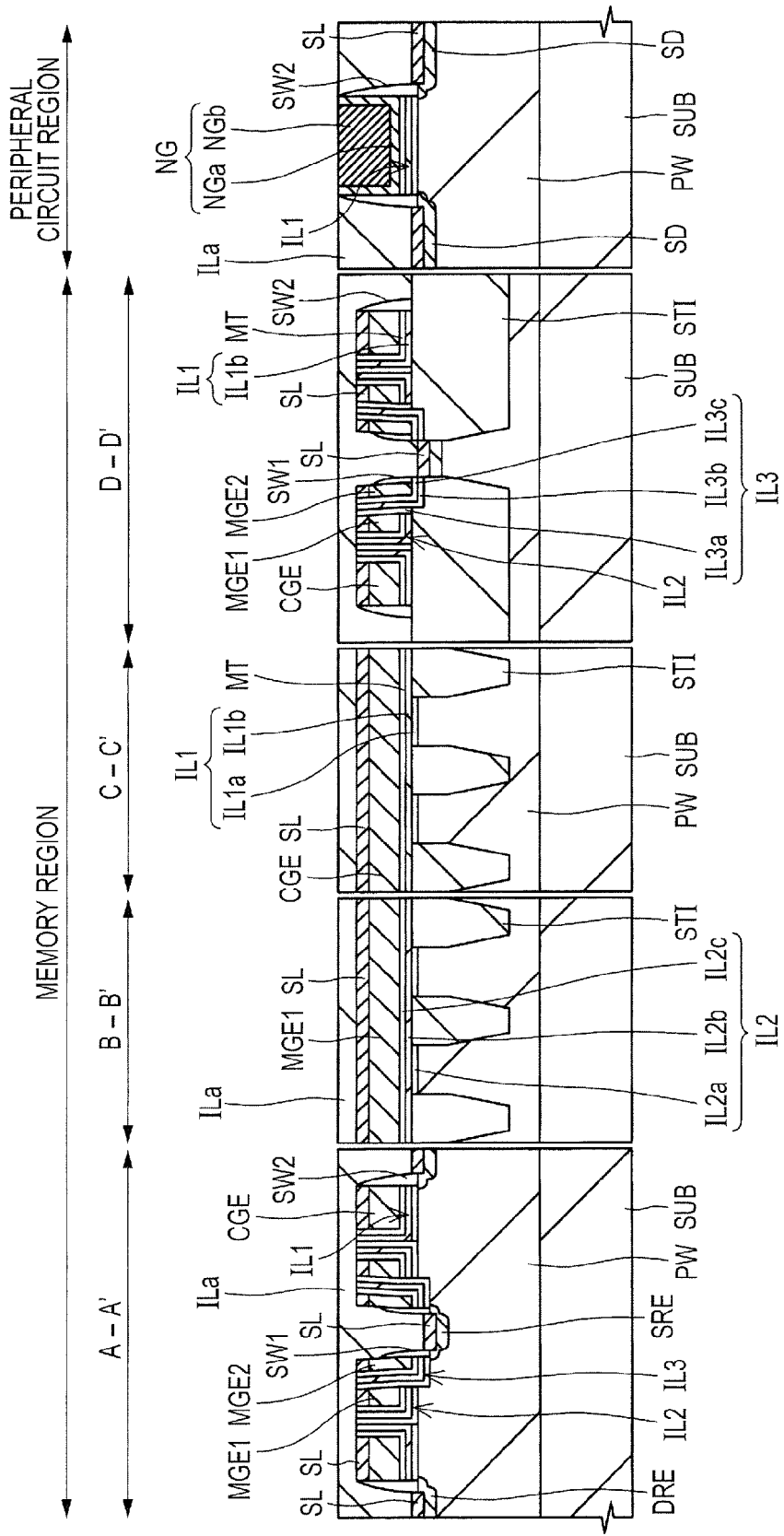
FIG. 27 is a main-portion cross-sectional view of the same portion as shown in FIG. 11 in the manufacturing process of the semiconductor device, which is subsequent to FIG. 26.

Next, as shown in FIG. 27, polishing which ends at the silicon dioxide film ILa is performed by, e.g., a CMP method to form a gate electrode NG of the nMIS transistor including the metal electrode film NGa and the aluminum film NGb in the peripheral circuit region.

By the manufacturing steps that have been described heretofore, in the peripheral circuit region, the nMIS transistor including the gate in which the first insulating film IL1 and the gate electrode NG are stacked and the source/drain in which the source/drain regions SD and the silicide films SL are stacked is generally completed.

Figure 28:
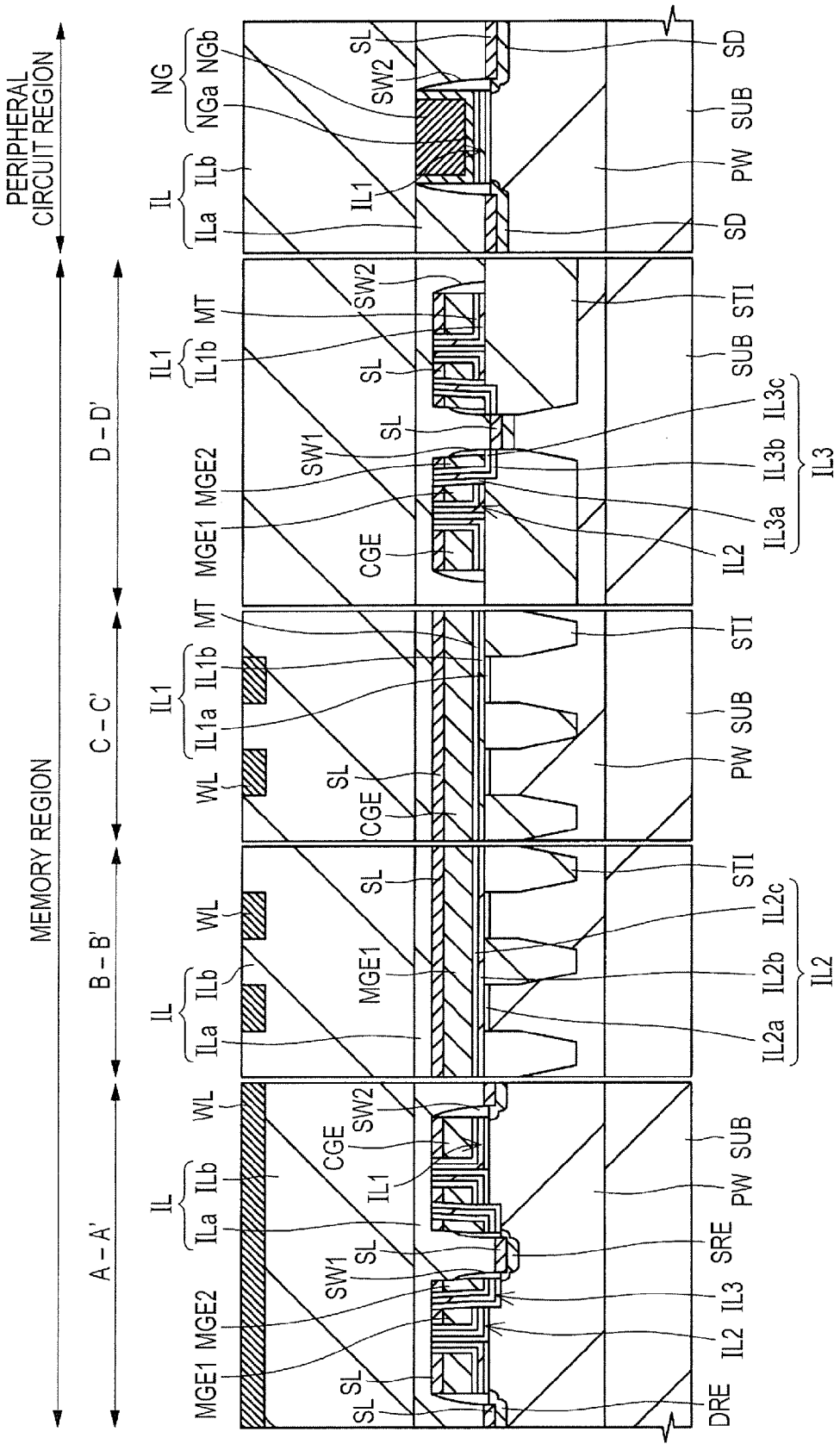
FIG. 28 is a main-portion cross-sectional view of the same portion as shown in FIG. 11 in the manufacturing process of the semiconductor device, which is subsequent to FIG. 27.

Next, as shown in FIG. 28, over the main surface of the semiconductor substrate SUB, the silicon dioxide film ILb is deposited by a CVD method to form the interlayer insulating film IL including the silicon dioxide films ILa and ILb.

Subsequently, in the memory region, contact holes (not shown (the contact holes CL shown in FIG. 2 described above)) reaching the silicide films SL over the drain regions DRE are formed in the interlayer insulating film IL. At the same time, in the peripheral circuit region, a contact hole (not shown) reaching the gate electrode NG of the nMIS transistor and contact holes (not shown) reaching the silicide films SL over the source/drain regions SD are formed in the interlayer insulating film IL.

Subsequently, in the foregoing contact holes, plugs (not shown) are formed. Each of the plugs is formed of a multi-layer film including, e.g., a relatively thin barrier film made of a multi-layer film of titanium and titanium nitride, and a relatively thick conductive film made of tungsten, aluminum, or the like and formed so as to be covered with the barrier film.

Subsequently, the first-layer wires WL electrically coupled to the foregoing plugs are formed. Thereafter, by further forming upper-layer wires, the semiconductor device is manufactured.

Figure 29:
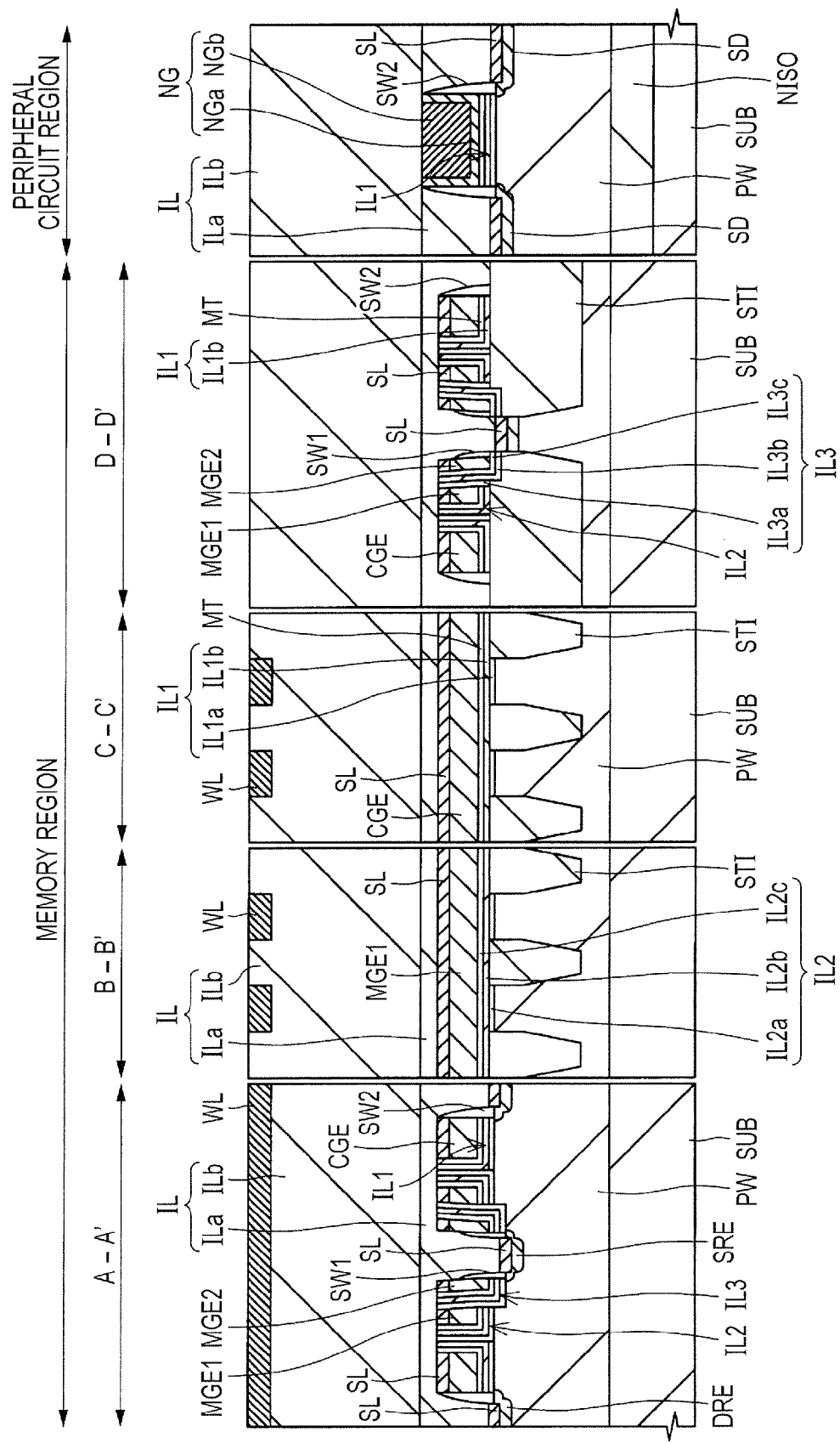
FIG. 29 is a main-portion cross-sectional view of each of the MONOS-type nonvolatile memory cells formed in a memory region and each of the n-channel MISFETs formed in a peripheral region, which shows a semiconductor device according to a modification of Embodiment 1.

Note that the semiconductor device according to Embodiment 1 and the manufacturing method thereof are not limited to the semiconductor device and the manufacturing method each described above. For example, as shown in FIG. 29, an embedded N-well NISO may also be formed by selectively ion-implanting an n-type impurity into the semiconductor substrate SUB in the peripheral circuit region.

<Effect of Embodiment 1>

Figure 30:
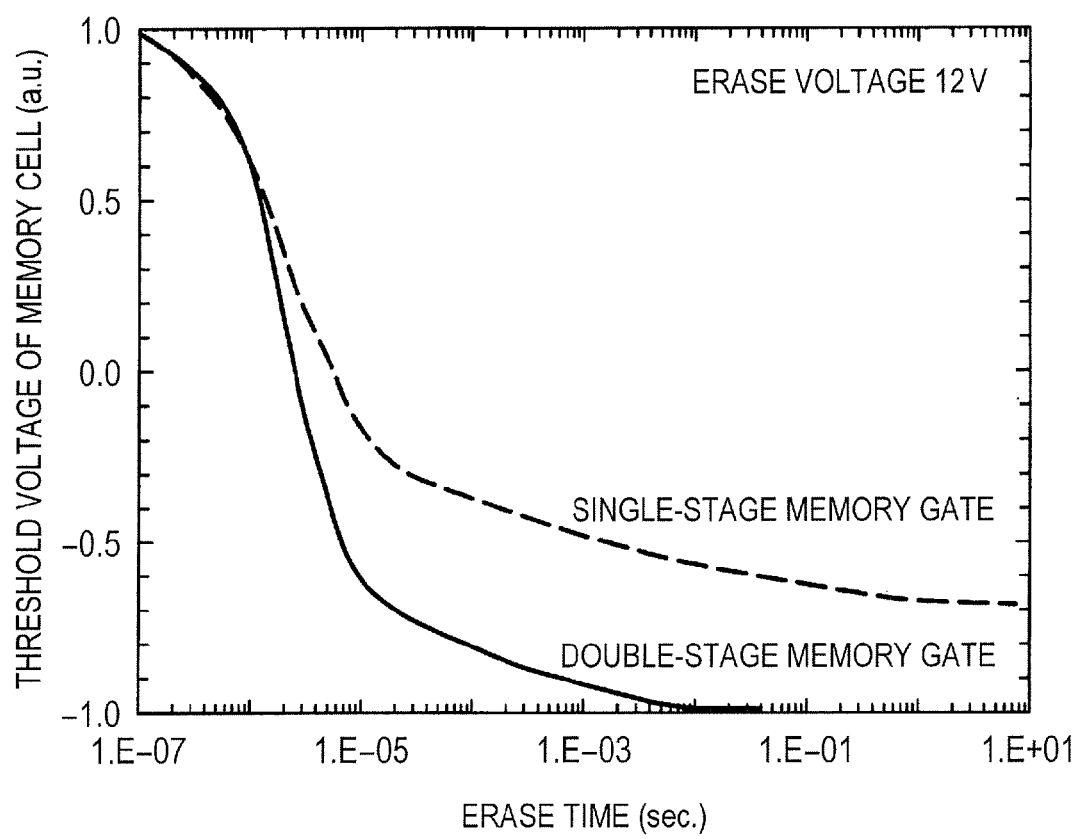
FIG. 30 is a graph illustrating the effect of the erase characteristic of the MONOS-type nonvolatile memory cell according to Embodiment 1.

FIG. 30 is a graph illustrating the effect of the erase characteristic of the memory cell according to Embodiment 1.

It can be seen that, in the memory cell having a memory gate formed of two gates (first and second memory gates) according to Embodiment 1, an erase speed is higher than that in a memory cell having a memory gate formed of one gate. This may be conceivably because, by providing a step in the main surface of the semiconductor substrate in a region where the second memory gate is formed, an electric field is concentrated on the corner portion (portion B in FIG. 8A) of the second memory gate electrode formed conformal to the stepped portion to increase the erase speed during an erase operation.

Figure 31:
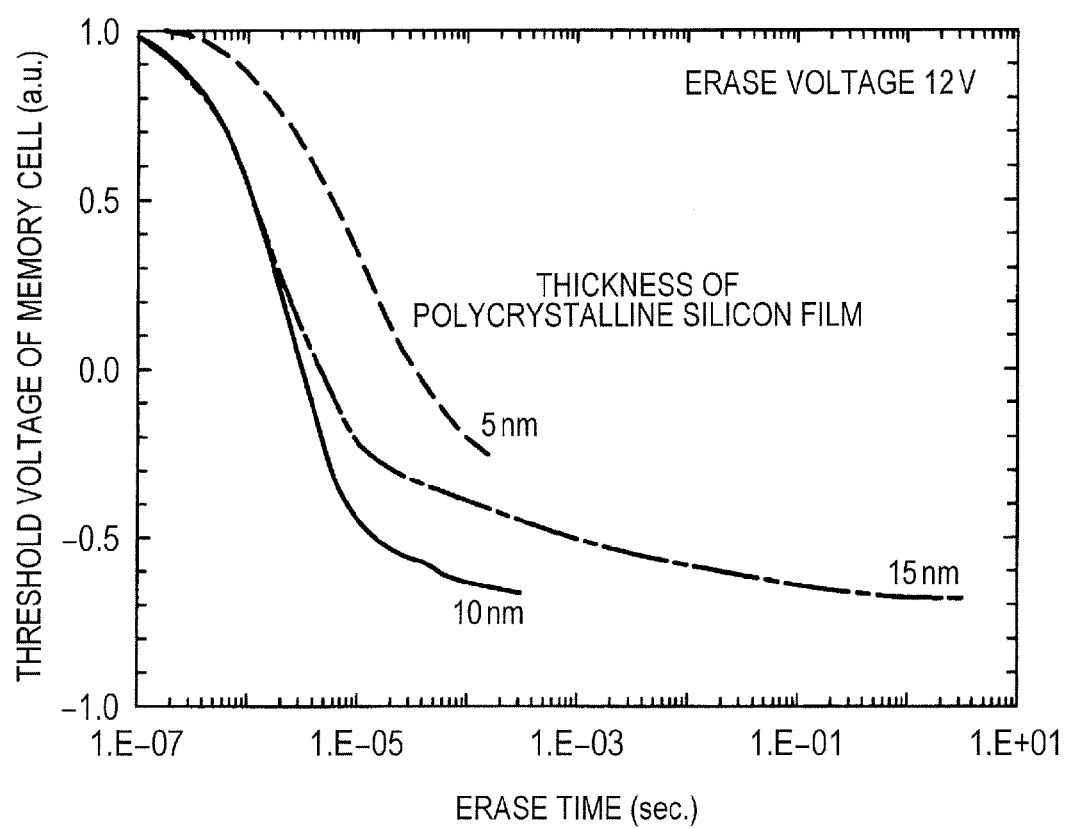
FIG. 31 is a graph illustrating the dependence of the erase characteristic of the MONOS-type nonvolatile memory cell according to Embodiment 1 on the thickness of each of the memory gate electrodes thereof.

FIG. 31 is a graph illustrating the dependence of the erase characteristic of the memory cell according to Embodiment 1 on the thickness of each of the memory gate electrodes (first and second memory gate electrodes).

It can be seen that the thickness of the memory gate electrode (each of the first and second memory gate electrodes) forming the memory gate according to Embodiment 1 is more preferably adjusted to be about 10 nm. It can be considered that such dependence of the erase characteristic of the memory cell on the thickness of the memory gate electrode results from the distribution of holes injected into the charge storage film during an erase operation, how an erase voltage is applied, or the like.

Thus, according to Embodiment 1, each of the memory gates MG is formed of the first and second memory gates MG1 and MG2 (first characteristic feature). In addition, the lower surface of the second memory gate electrode MGE2 is located lower in level than the lower surface of the first memory gate electrode MGE1 (second characteristic feature). This causes an electric field to be concentrated on each of the corner portion of the first memory gate electrode MGE1 which is located closer to the selection gate CG and the semiconductor substrate SUB and the corner portion of the second memory gate electrode MGE2 which is located closer to the first memory gate MG1 and the semiconductor substrate SUB during an erase operation. As a result, holes are injected into each of the second and third insulating films IL2 and IL3 to allow an increase in erase speed.

In the semiconductor device according to Embodiment 1, each of the memory gates MG is formed of two gates (first and second memory gates MG1 and MG2). However, it is also possible to form the memory gate MG of three or more gates and obtain the same effect as obtained from the memory cell MC1 having the memory gates MG each formed of the two gates.

Embodiment 2

Configuration of Semiconductor Device

Figure 32:
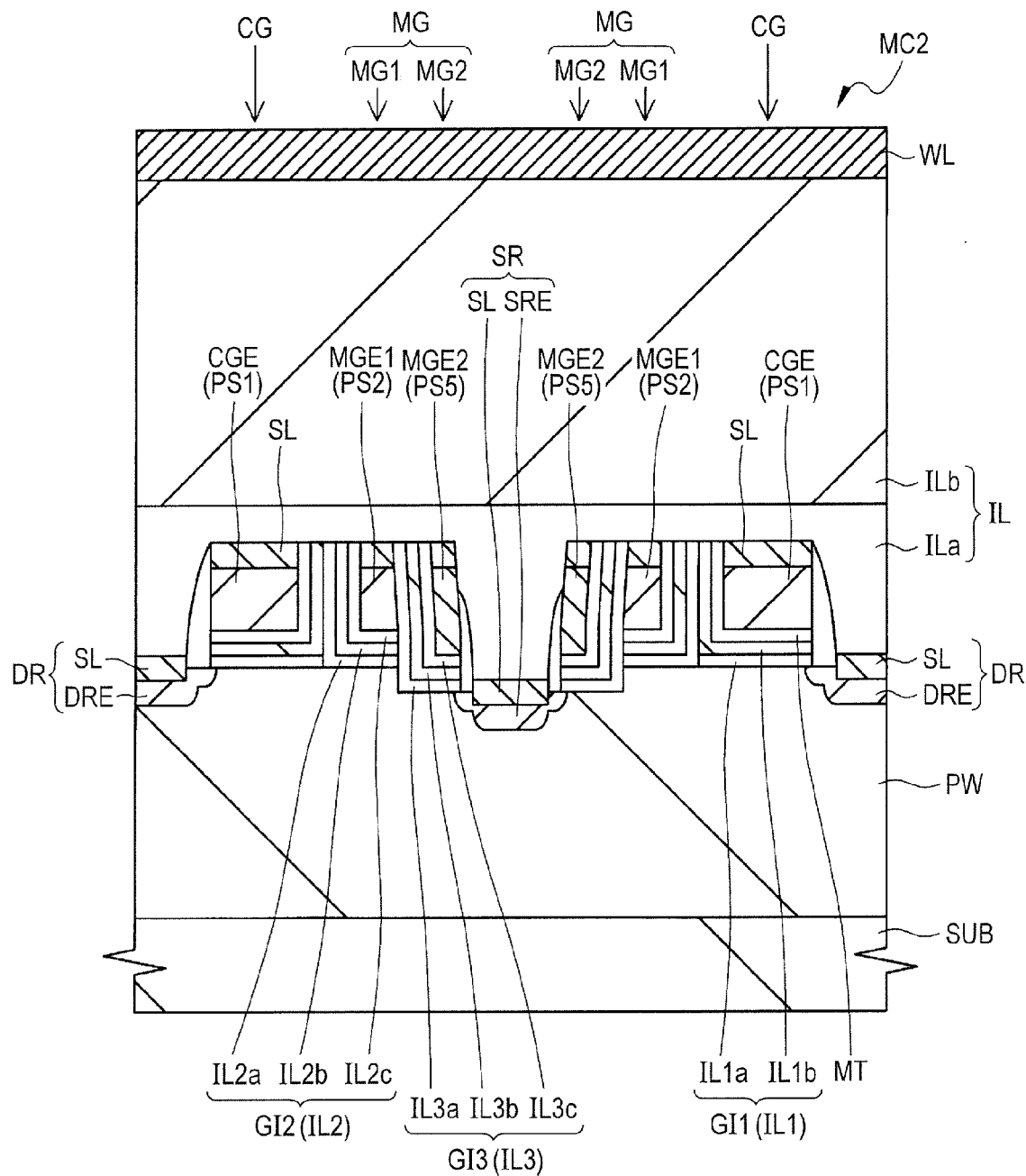
FIG. 32 is a main-portion cross-sectional view (main-portion cross-sectional view along the line A-A' shown in FIG. 2) of a MONOS-type nonvolatile memory cell according to Embodiment 2.
Figure 33:
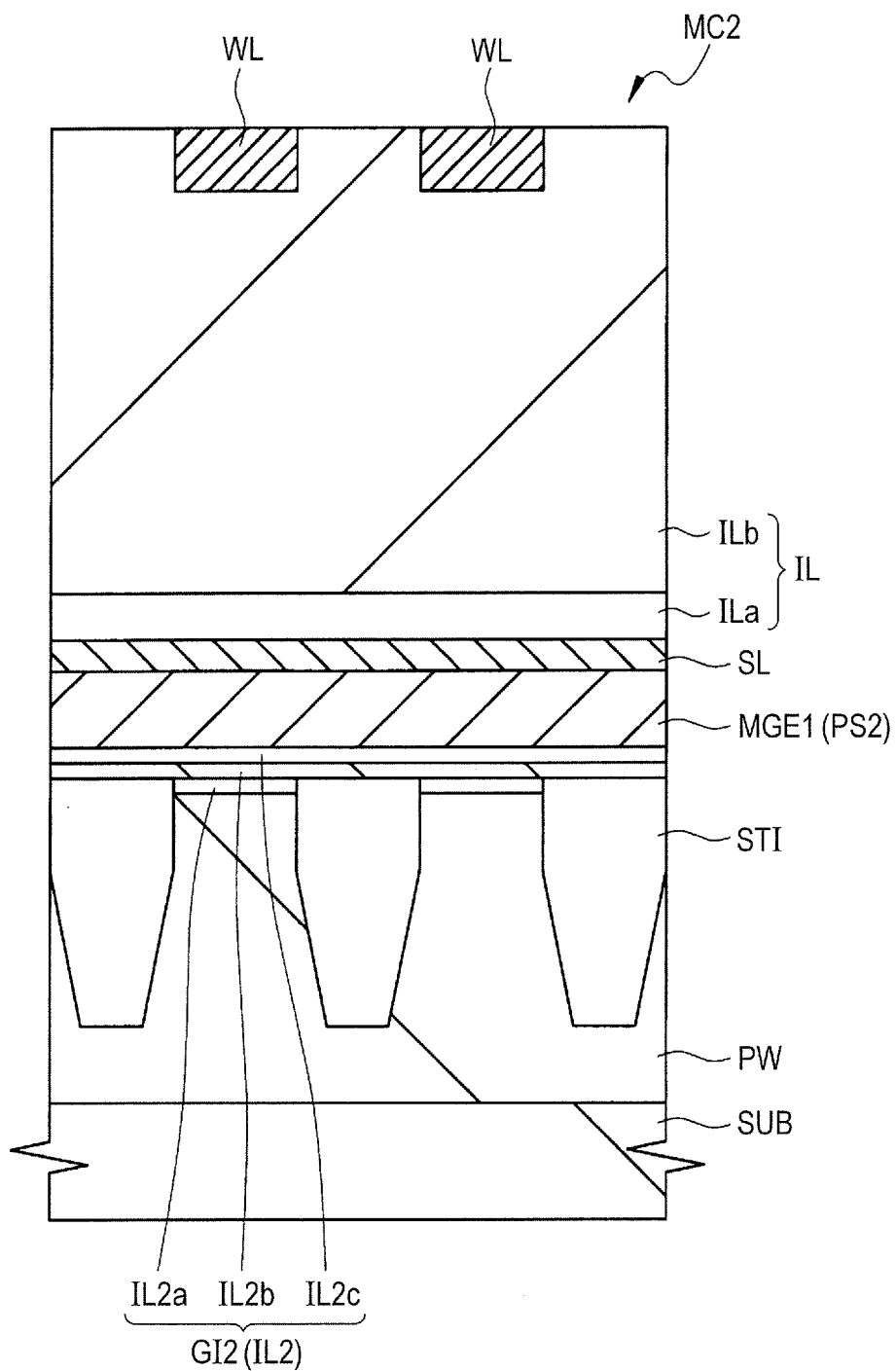
FIG. 33 is a main-portion cross-sectional view (main-portion cross-sectional view along the line B-B' shown in FIG. 2) of the MONOS-type nonvolatile memory cell according to Embodiment 2.
Figure 34:
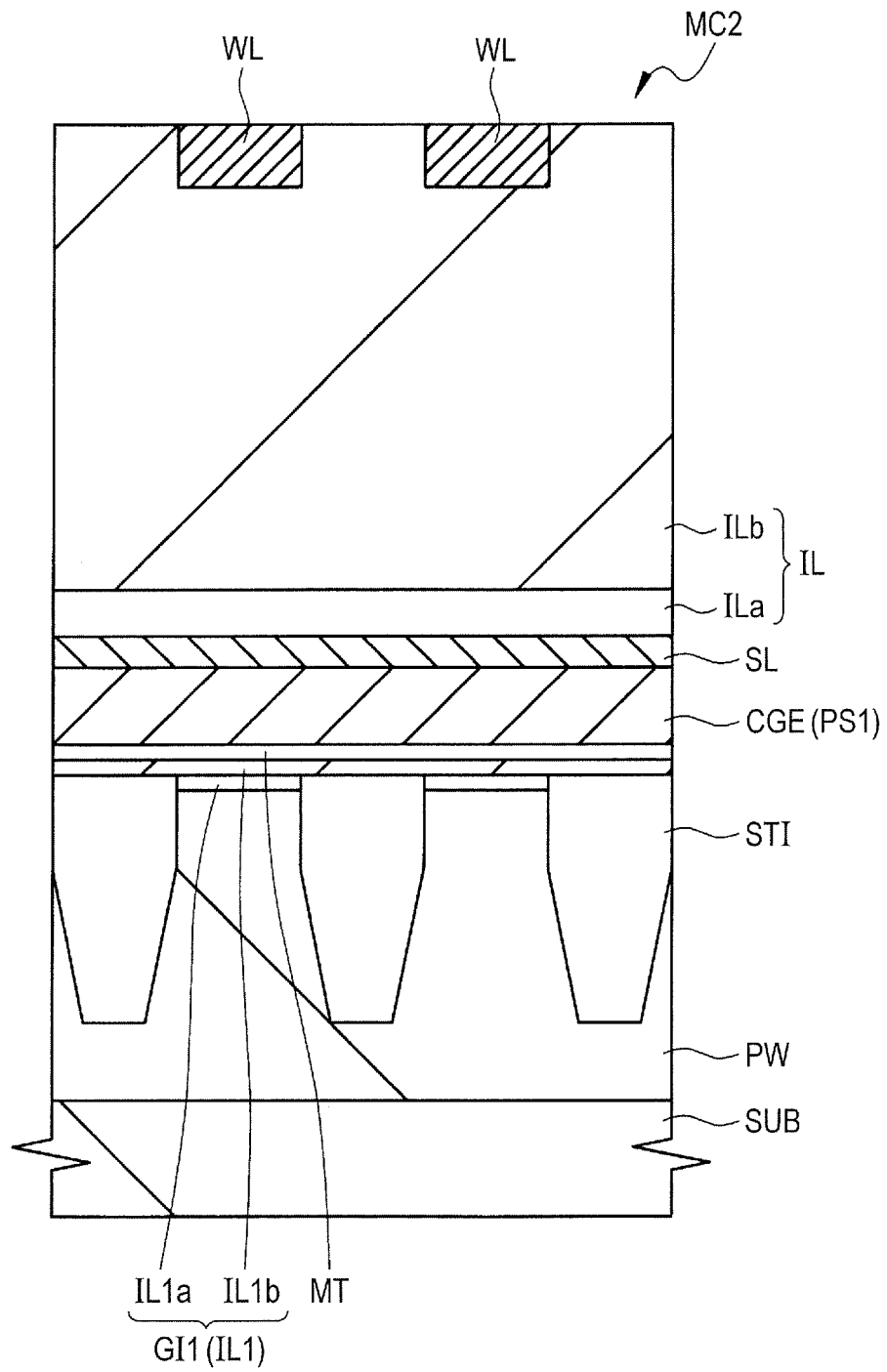
FIG. 34 is a main-portion cross-sectional view (main-portion cross-sectional view along the line C-C' shown in FIG. 2) of the MONOS-type nonvolatile memory cell according to Embodiment 2.
Figure 35:
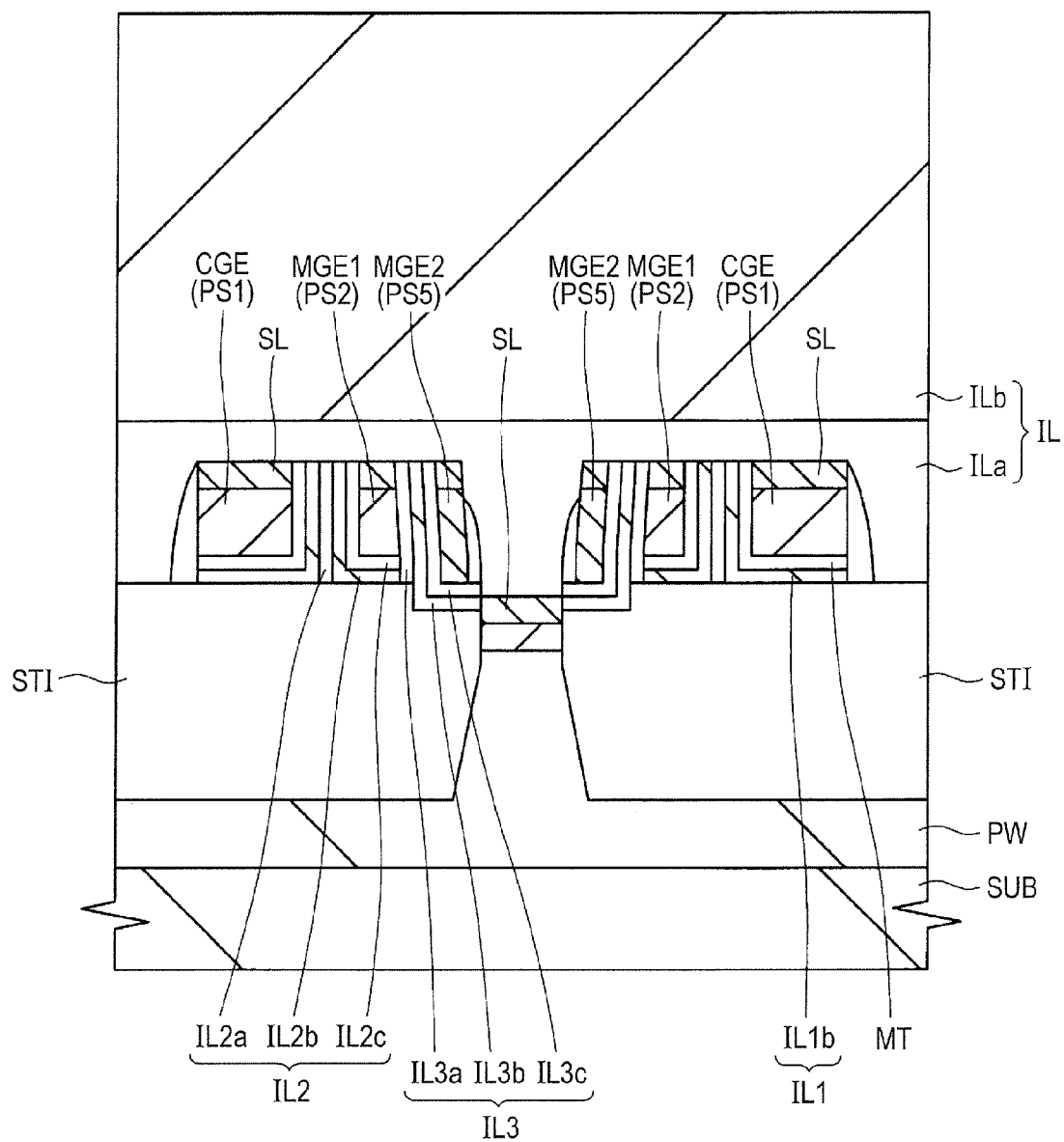
FIG. 35 is a main-portion cross-sectional view (main-portion cross-sectional view along the line D-D' shown in FIG. 2) of the MONOS-type nonvolatile memory cell according to Embodiment 2.

A configuration of a memory cell according to Embodiment 2 will be described using FIGS. 32 to 35. FIG. 32 is a main-portion cross-sectional view along the line A-A' shown in FIG. 2. FIG. 33 is a main-portion cross-sectional view along the line B-B' shown in FIG. 2. FIG. 34 is a main-portion cross-sectional view along the line C-C' shown in FIG. 2. FIG. 35 is a main-portion cross-sectional view along the line D-D' shown in FIG. 2.

A memory cell MC2 according to Embodiment 2 is different from the memory cell MC1 according to Embodiment 1 described above in the conductivity type of the polycrystalline silicon film forming each of the first and second memory gate electrodes MGE1 and MGE2.

That is, in the memory cell MC1 according to Embodiment 1 described above, each of the first and second memory gate electrodes MGE1 and MGE2 is made of an n-type polycrystalline silicon film. By contrast, in the memory cell MC2 according to Embodiment 2, either one or each of the first and second memory gate electrodes MGE1 and MGE2 is made of a p-type polycrystalline silicon film having a hole injection efficiency higher than that of an n-type polycrystalline silicon film. Each of FIGS. 32 to 35 shows the memory gate MG including the first memory gate electrode MGE1 made of the n-type polycrystalline silicon film PS2, and the second memory gate electrode MGE2 made of a p-type polycrystalline silicon film PS5.

When the first memory gate electrode MGE1 is formed using an n-type polycrystalline silicon film and the second memory gate electrode MGE2 is formed using a p-type polycrystalline silicon film, the second memory gate MGE2 has a higher hole injection efficiency.

When the first memory gate electrode MGE1 is formed using a p-type polycrystalline silicon film and the second memory gate electrode MGE2 is formed using an n-type polycrystalline silicon film, the first memory gate MG1 has a higher hole injection efficiency. When the p-type polycrystalline silicon film is used, the threshold voltage of the memory cell MC2 is increased. However, since the second memory gate electrode MGE2 located closer to the source SR which determines the threshold voltage is formed of the n-type polycrystalline silicon film, an increase in threshold voltage is suppressed.

When each of the first and second memory gate electrodes MGE1 and MGE2 is formed using a p-type polycrystalline silicon film, each of the first and second memory gate MG1 and MG2 has a higher hole injection efficiency. In this case, the threshold voltage of the memory cell MC2 is increased. Accordingly, it is necessary to adjust the threshold voltage by performing, e.g., the introduction of a predetermined impurity into a channel or the like.

The configuration of the semiconductor device according to Embodiment 2 is otherwise the same or substantially the same as that of the semiconductor device according to Embodiment 1 described above so that a description thereof is omitted.

<Operation of Memory Cell>

The operation of the memory cell MC2 is the same or substantially the same as the operation of the memory cell MC1 according to Embodiment 1 described above so that a description thereof is omitted.

<Method of Manufacturing Semiconductor Device>

In a manufacturing process of the memory gates MG described above using FIGS. 15 to 17 in Embodiment 1, a p-type polycrystalline silicon film is formed instead of the n-type polycrystalline silicon film deposited over the main surface of the semiconductor substrate SUB.

<Effect of Embodiment 2>

In Embodiment 2, the p-type polycrystalline silicon film having a hole injection efficiency higher than that of the n-type polycrystalline silicon film is used for either one or each of the first and second memory gate electrodes MGE1 and MGE2. Accordingly, data can be erased more efficiently from the memory cell MC2 according to Embodiment 2 than from the memory cell MC1 according to Embodiment 1 described above.

Embodiment 3

Configuration of Semiconductor Device

Figure 36:
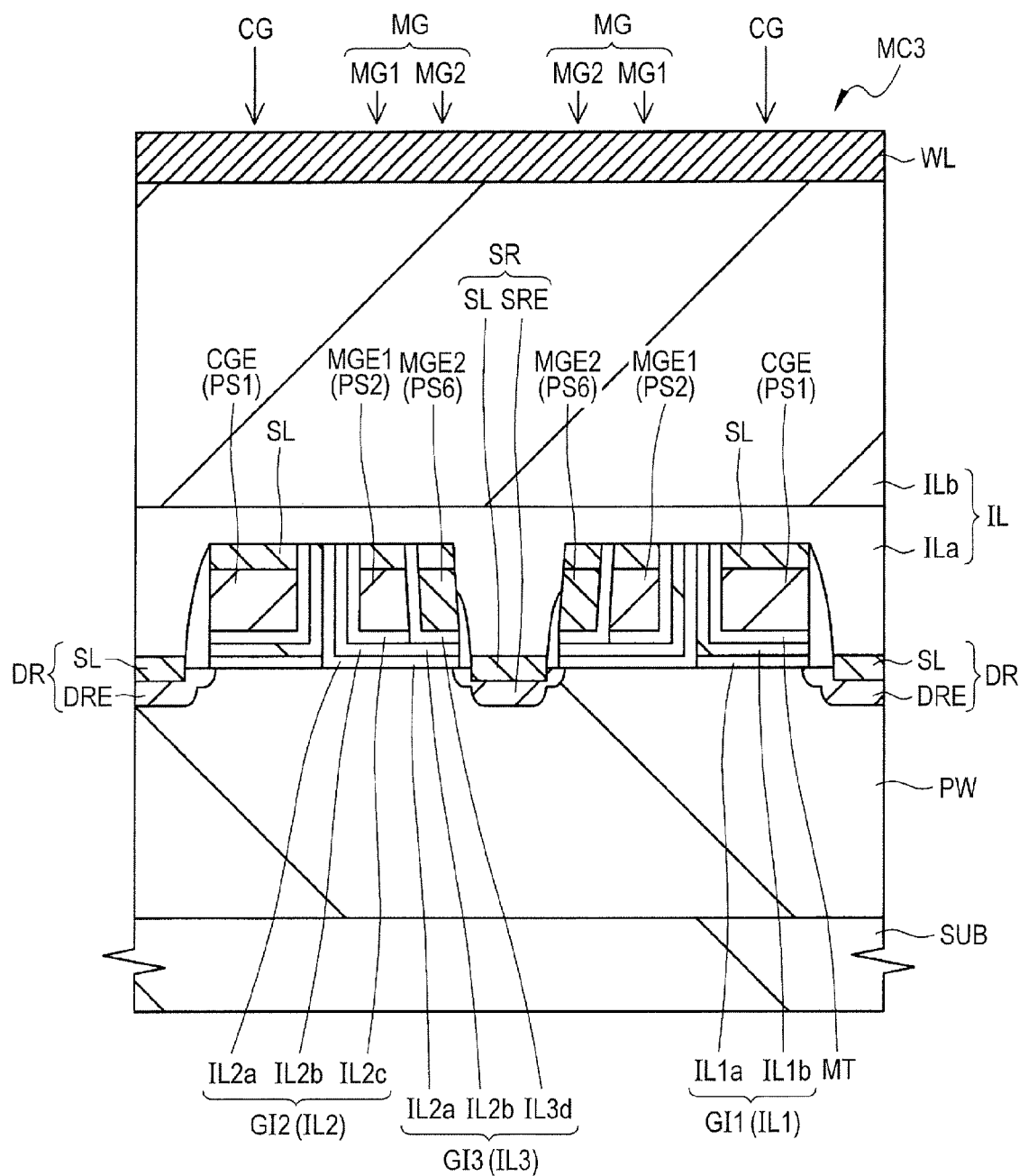
FIG. 36 is a main-portion cross-sectional view (main-portion cross-sectional view along the line A-A' shown in FIG. 2) of a MONOS-type nonvolatile memory cell according to Embodiment 3.
Figure 37:
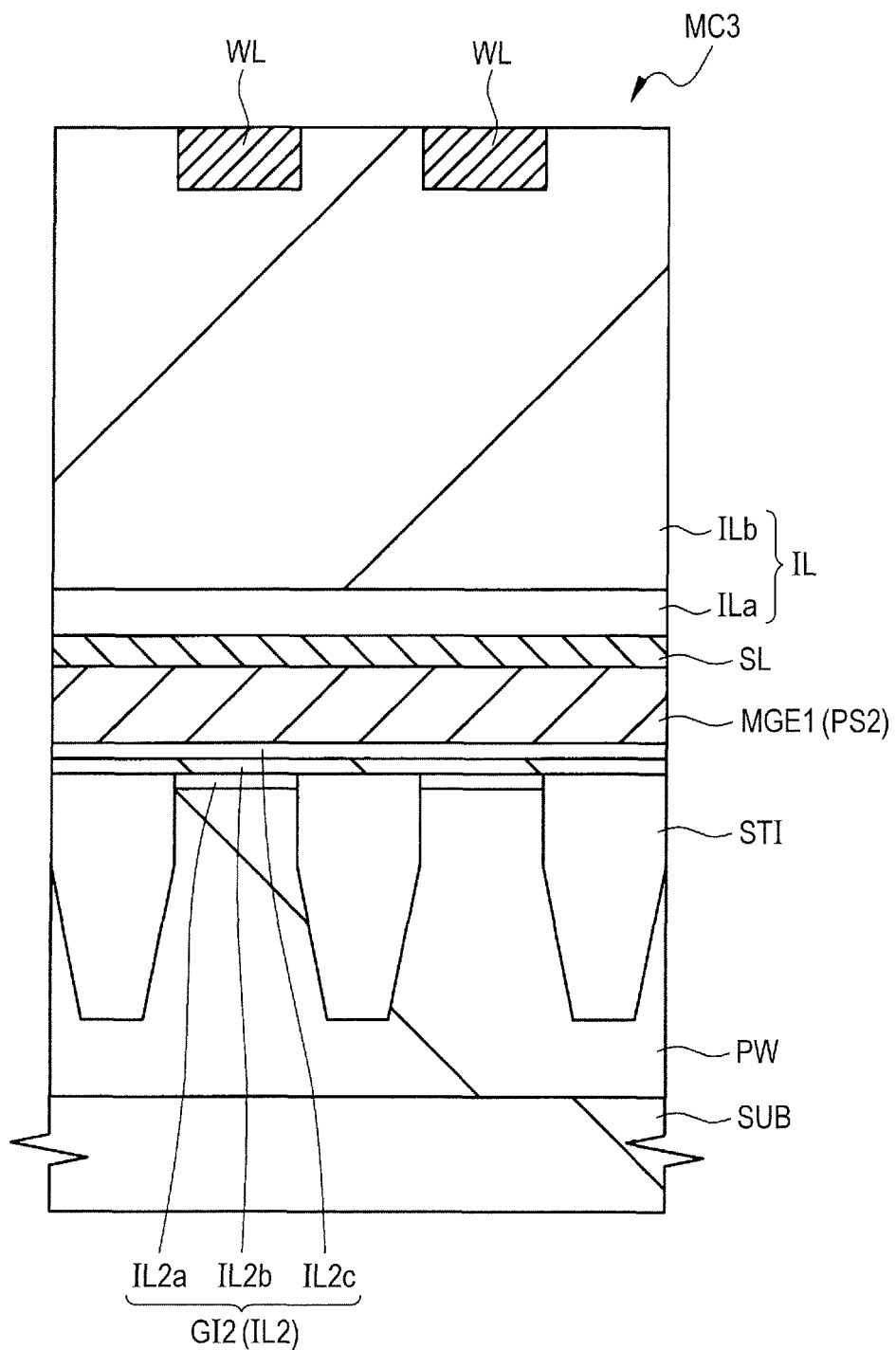
FIG. 37 is a main-portion cross-sectional view (main-portion cross-sectional view along the line B-B' shown in FIG. 2) of the MONOS-type nonvolatile memory cell according to Embodiment 3.
Figure 38:
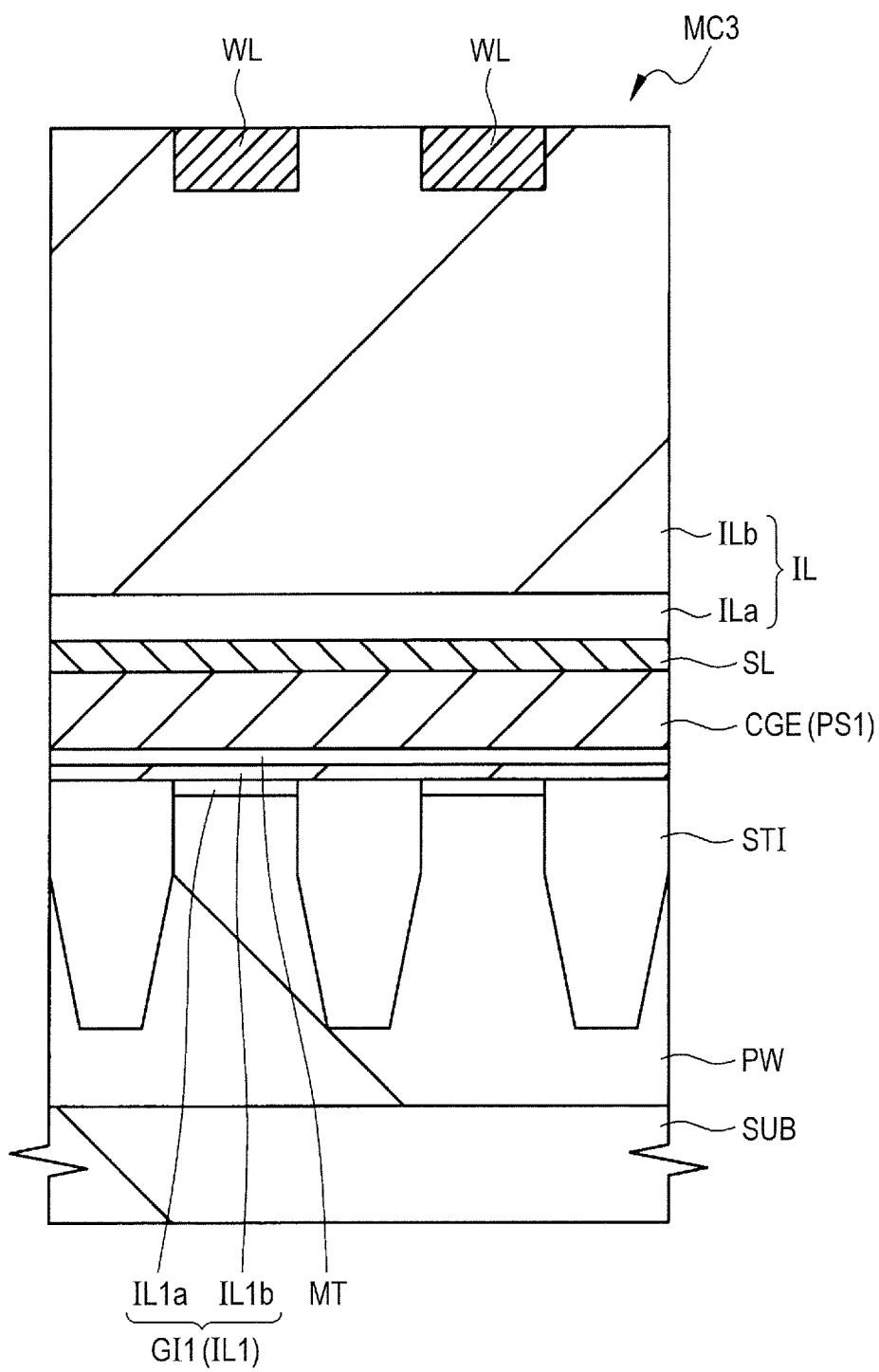
FIG. 38 is a main-portion cross-sectional view (main-portion cross-sectional view along the line C-C' shown in FIG. 2) of the MONOS-type nonvolatile memory cell according to Embodiment 3.
Figure 39:
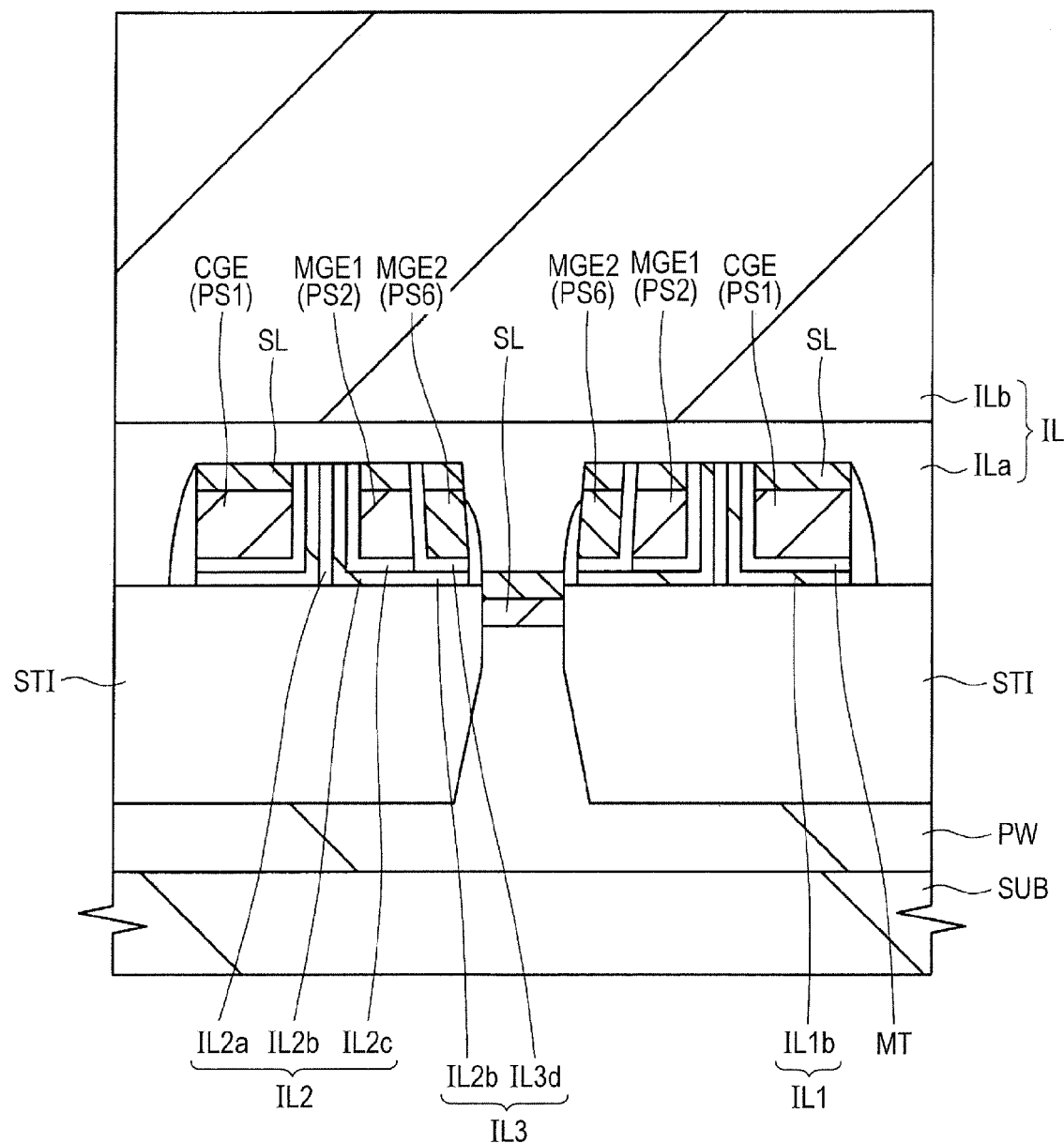
FIG. 39 is a main-portion cross-sectional view (main-portion cross-sectional view along the line D-D' shown in FIG. 2) of the MONOS-type nonvolatile memory cell according to Embodiment 3.

A configuration of a memory cell according to Embodiment 3 will be described using FIGS. 36 to 39. FIG. 36 is a main-portion cross-sectional view along the line A-A' shown in FIG. 2. FIG. 37 is a main-portion cross-sectional view along the line B-B' shown in FIG. 2. FIG. 38 is a main-portion cross-sectional view along the line C-C' shown in FIG. 2. FIG. 39 is a main-portion cross-sectional view along the line D-D' shown in FIG. 2.

A memory cell MC3 according to Embodiment 3 is different from the memory cell MC1 according to Embodiment 1 described above in the conductivity type of the polycrystalline silicon film forming each of the second memory gate electrodes MGE1 of the memory nMIS transistors and the height of the main surface of the semiconductor substrate SUB formed with the second memory gates MG2.

That is, in the memory cell MC1 according to Embodiment 1 described above, each of the first and second memory gate electrodes MGE1 and MGE2 is made of the n-type polycrystalline silicon film. By further forming a step in the main surface of the semiconductor substrate SUB, the lower surface of the second memory gate electrode MGE2 is located lower in level than the lower surface of the first memory gate electrode MGE1 so as to cause an electric field to be concentrated on the corner portion of the second memory gate electrode MGE2 which is located closer to the first memory gate MG1 and the semiconductor substrate SUB. By contrast, in the memory cell MC3 according to Embodiment 3, the first memory gate electrode MGE1 is made of an n-type polycrystalline silicon film, while the second memory gate electrode MGE2 is made of a p-type polycrystalline silicon film. In addition, the lower surface of the second memory gate electrode MGE2 is at the same height position as that of the lower surface of the first memory gate electrode MGE1.

The potential electric potential of the p-type polycrystalline silicon film is higher than the potential electric potential of the n-type polycrystalline silicon film by about 1.1 V. Accordingly, even when the same voltage is applied to each of the first memory gate electrode MGE1 made of the n-type polycrystalline silicon film and the second memory gate electrode MGE2 made of the p-type polycrystalline silicon film, a potential difference of about 1.1 V is produced therebetween. As a result, even though a step is not formed in the main surface of the semiconductor substrate SUB, by using the potential difference, it is possible to cause an electric field to be concentrated on the corner portion of the second memory gate electrode MGE2 which is located closer to the first memory gate MG1 and the semiconductor substrate SUB. This enhances the efficiency of hole injection into the third insulating film IL3.

The configuration of the semiconductor device according to Embodiment 3 is otherwise the same or substantially the same as that of the semiconductor device according to Embodiment 1 described above so that a description thereof is omitted.

<Operation of Memory Cell>

The operation of the memory cell MC3 is the same or substantially the same as the operation of the memory cell MC1 according to Embodiment 1 described above so that a description thereof is omitted.

<Method of Manufacturing Semiconductor Device>

After the manufacturing step described above using FIG. 15 in Embodiment 1 (step of depositing the polycrystalline silicon film PS2 over the main surface of the semiconductor substrate SUB), the polycrystalline silicon film PS2 is processed by a lithographic method and an anisotropic dry etching method. Thus, in the memory region, over the side surfaces of dummy patterns each made of the polycrystalline silicon film PS4, the first memory gate electrodes MGE1 each made of the polycrystalline silicon film PS2 are formed via the second insulating films IL2 each including the insulating film IL2a, the charge storage film IL2b, and the insulating film IL2c. During the formation of the first memory gate electrodes MGE1, the insulating films IL2c are used as etching stoppers. The insulating films IL2c are removed by etching. However, the charge storage films IL2b and the insulating films IL2a in the layers located thereunder remain so that the semiconductor substrate SUB is not etched.

Subsequently, over the main surface of the semiconductor substrate SUB, an insulating film IL3d made of, e.g., silicon oxynitride and a p-type polycrystalline silicon film PS6 are successively formed. The insulating film IL3d has a thickness of, e.g., about 8 nm.

Subsequently, by a lithographic method and an anisotropic dry etching method, the p-type polycrystalline silicon film PS6, the insulating film IL3d, the charge storage film IL2b, and the insulating film IL2a are successively processed. As a result, in the memory region, over the side surfaces of the first memory gate electrodes MGE1, the second memory gate electrodes MGE2 each made of the p-type polycrystalline silicon film PS6 are formed via the insulating films IL3d. Between the first and second memory gate electrodes MGE1 and MGE2, the insulating films IL3d are formed. On the other hand, between the semiconductor substrate SUB and the second memory gate electrodes MGE2, the third insulating films IL3 in each of which the insulating film IL2a, the charge storage film IL2b, and the insulating film IL3d are successively stacked in order of increasing distance from the semiconductor substrate SUB are formed.

<Effect of Embodiment 3>

In Embodiment 3, the p-type polycrystalline silicon film having a hole injection efficiency higher than that of the n-type polycrystalline silicon film is used for each of the second memory gate electrodes MGE2. Accordingly, data can be erased more efficiently from the memory cell MC3 according to Embodiment 3 than from the memory cell MC1 according to Embodiment 1. In addition, since the insulating films IL3a and the charge storage film IL3b each formed in the manufacturing process according to Embodiment 1 described above are not formed in a manufacturing process according to Embodiment 3, the number of the manufacturing process steps can be reduced.

Embodiment 4

Configuration of Semiconductor Device

Figure 40:
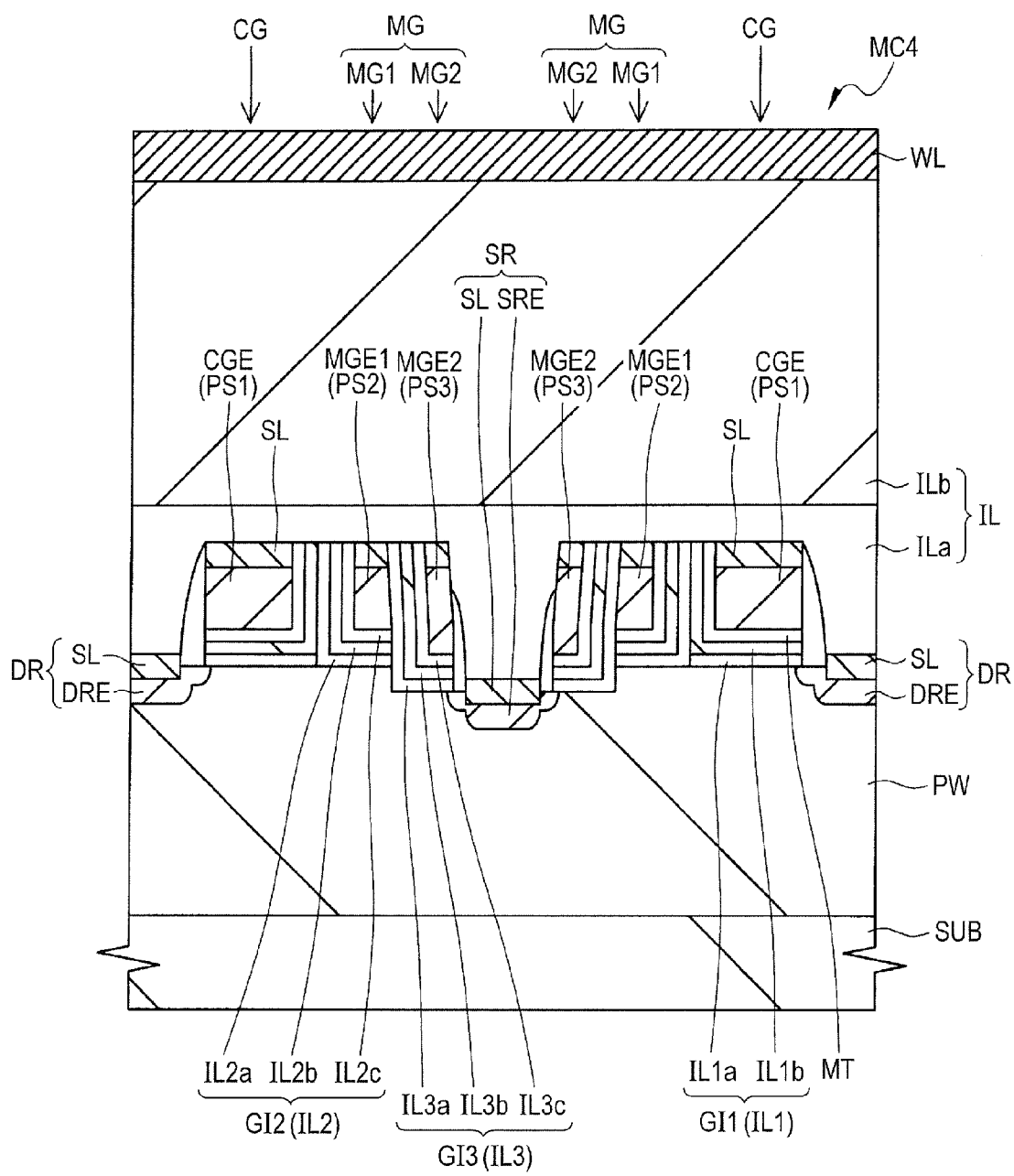
FIG. 40 is a main-portion cross-sectional view (main-portion cross-sectional view along the line A-A' shown in FIG. 2) of a MONOS-type nonvolatile memory cell according to Embodiment 4.
Figure 41:
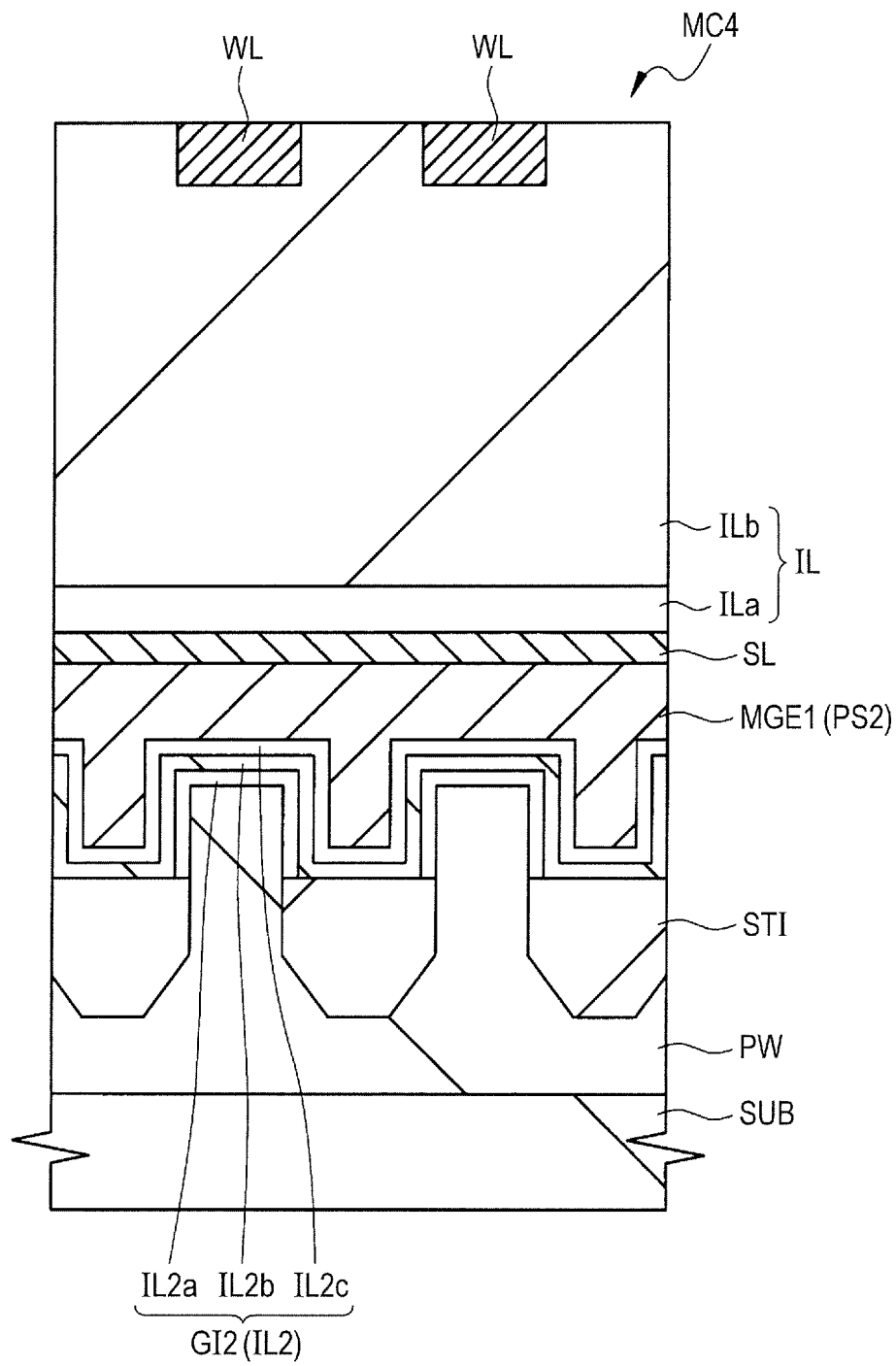
FIG. 41 is a main-portion cross-sectional view (main-portion cross-sectional view along the line B-B' shown in FIG. 2) of the MONOS-type nonvolatile memory cell according to Embodiment 4.
Figure 42:
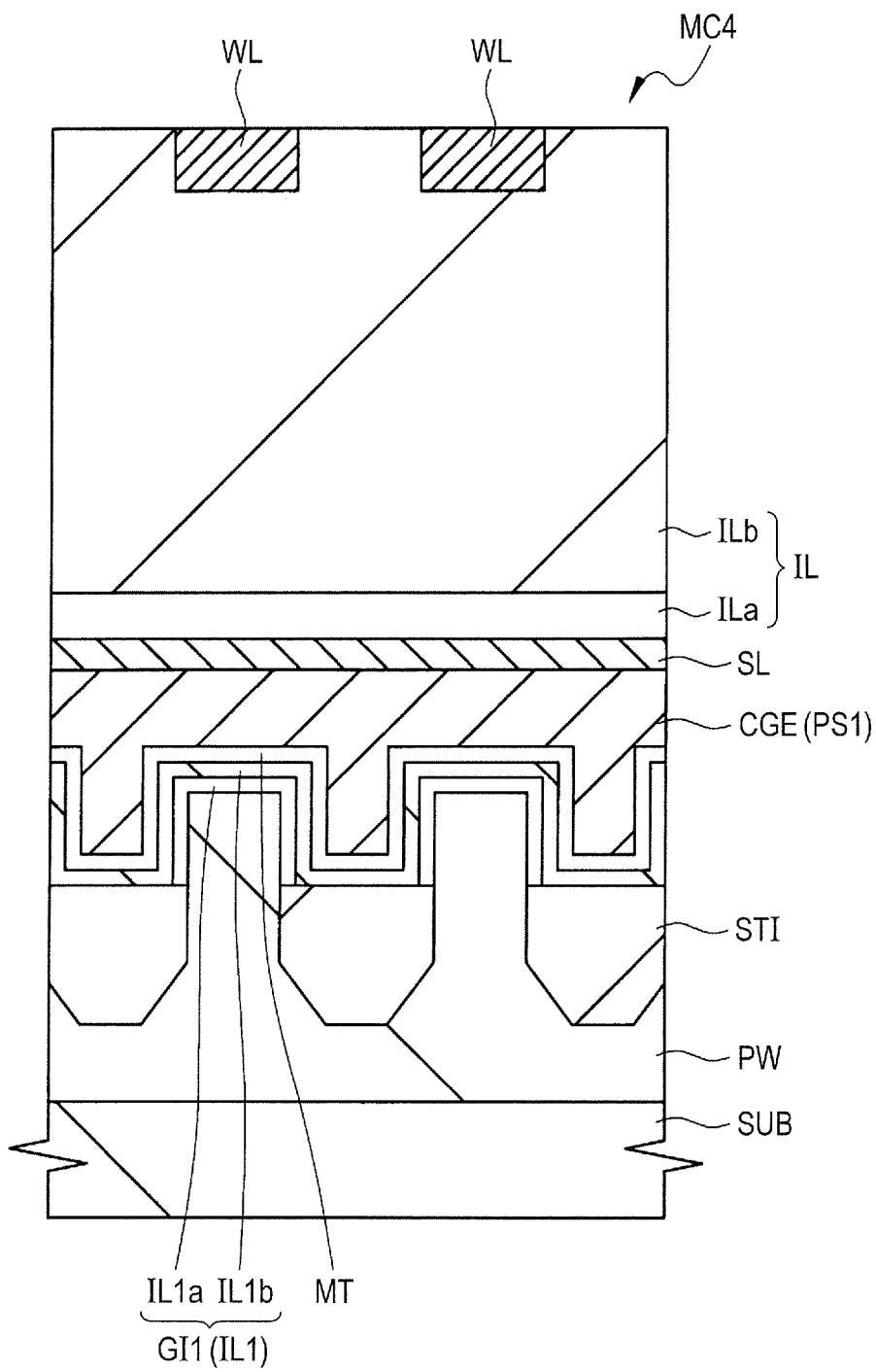
FIG. 42 is a main-portion cross-sectional view (main-portion cross-sectional view along the line C-C' shown in FIG. 2) of the MONOS-type nonvolatile memory cell according to Embodiment 4.
Figure 43:
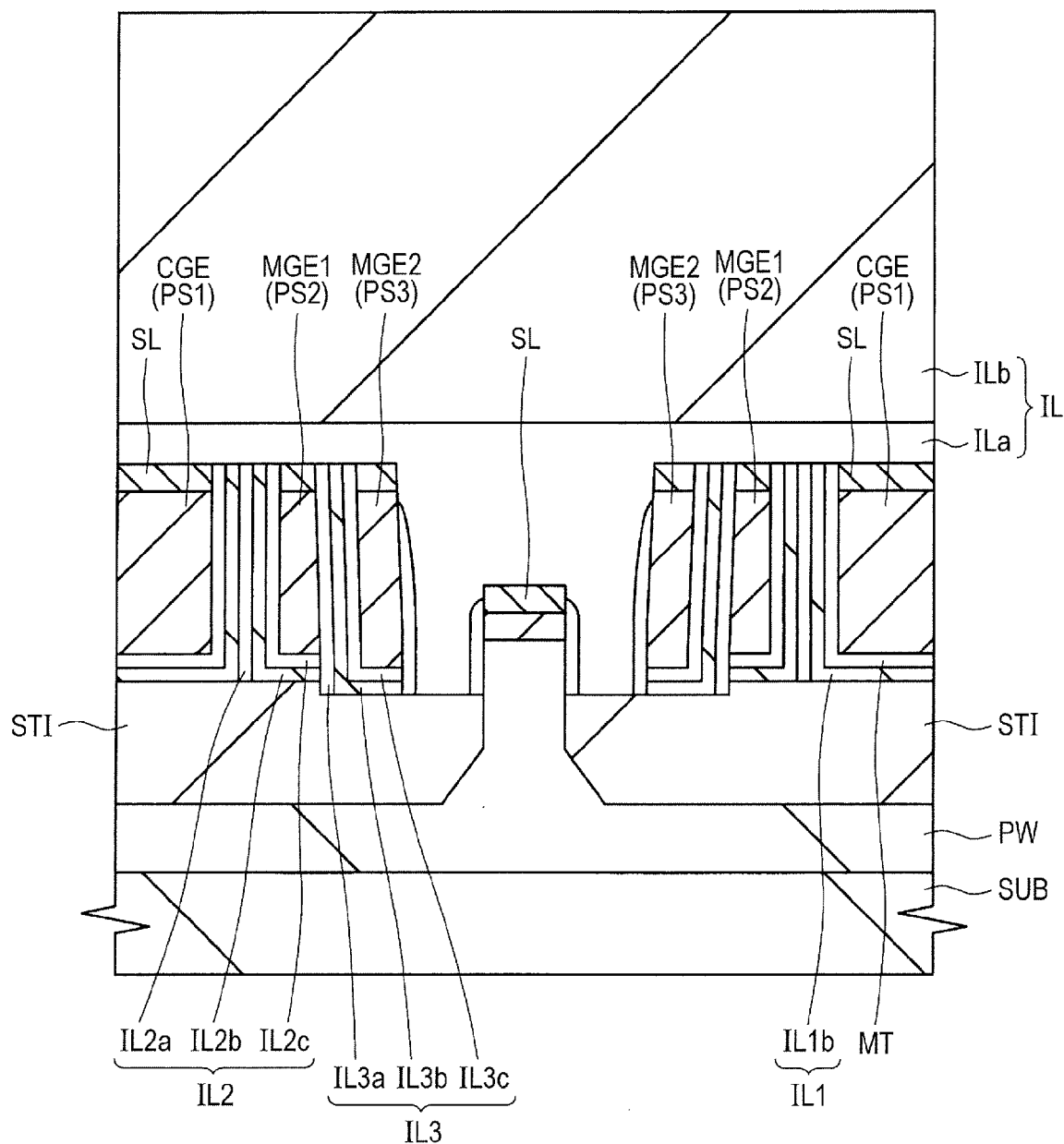
FIG. 43 is a main-portion cross-sectional view (main-portion cross-sectional view along the line D-D' shown in FIG. 2) of the MONOS-type nonvolatile memory cell according to Embodiment 4.

A configuration of a memory cell according to Embodiment 4 will be described using FIGS. 40 to 43. FIG. 40 is a main-portion cross-sectional view along the line A-A' shown in FIG. 2. FIG. 41 is a main-portion cross-sectional view along the line B-B' in FIG. 2. FIG. 42 is a main-portion cross-sectional view along the line C-C' shown in FIG. 2. FIG. 43 is a main-portion cross-sectional view along the line D-D' shown in FIG. 2.

A memory cell MC4 according to Embodiment 4 is different from the memory cell MC1 according to Embodiment 1 described above in the structure of each of MIS transistors.

That is, the memory cell MC1 according to Embodiment 1 described above has a planar-type transistor structure. By contrast, the memory cell MC4 according to Embodiment 4 has a Fin-type transistor structure in which the main surface of the semiconductor substrate SUB in each of active regions is at a height position higher than that of the upper surface of each of the isolation portions STI.

The configuration of the semiconductor device according to Embodiment 4 is otherwise the same or substantially the same as that of the semiconductor device according to Embodiment 1 described above so that a description thereof is omitted.

<Operation of Memory Cell>

The operation of the memory cell MC4 is the same or substantially the same as the operation of the memory cell MC1 according to Embodiment 1 described above so that a description thereof is omitted.

<Method of Manufacturing Semiconductor Device>

In the steps of forming the isolation portions STI described above using FIG. 11 in Embodiment 1, after the isolation trenches are formed in the predetermined portions of the semiconductor substrate SUB, an insulating film made of, e.g., silicon dioxide or the like is deposited over the main surface of the semiconductor substrate SUB. Then, the insulating film is processed by a dry etching method so as to be left only in the isolation trenches. At this time, the insulating film is processed such that the upper surface thereof embedded in each of the isolation trenches is lower in level than the main surface of the semiconductor substrate SUB in each of the active regions.

<Effect of Embodiment 4>

Figure 44:
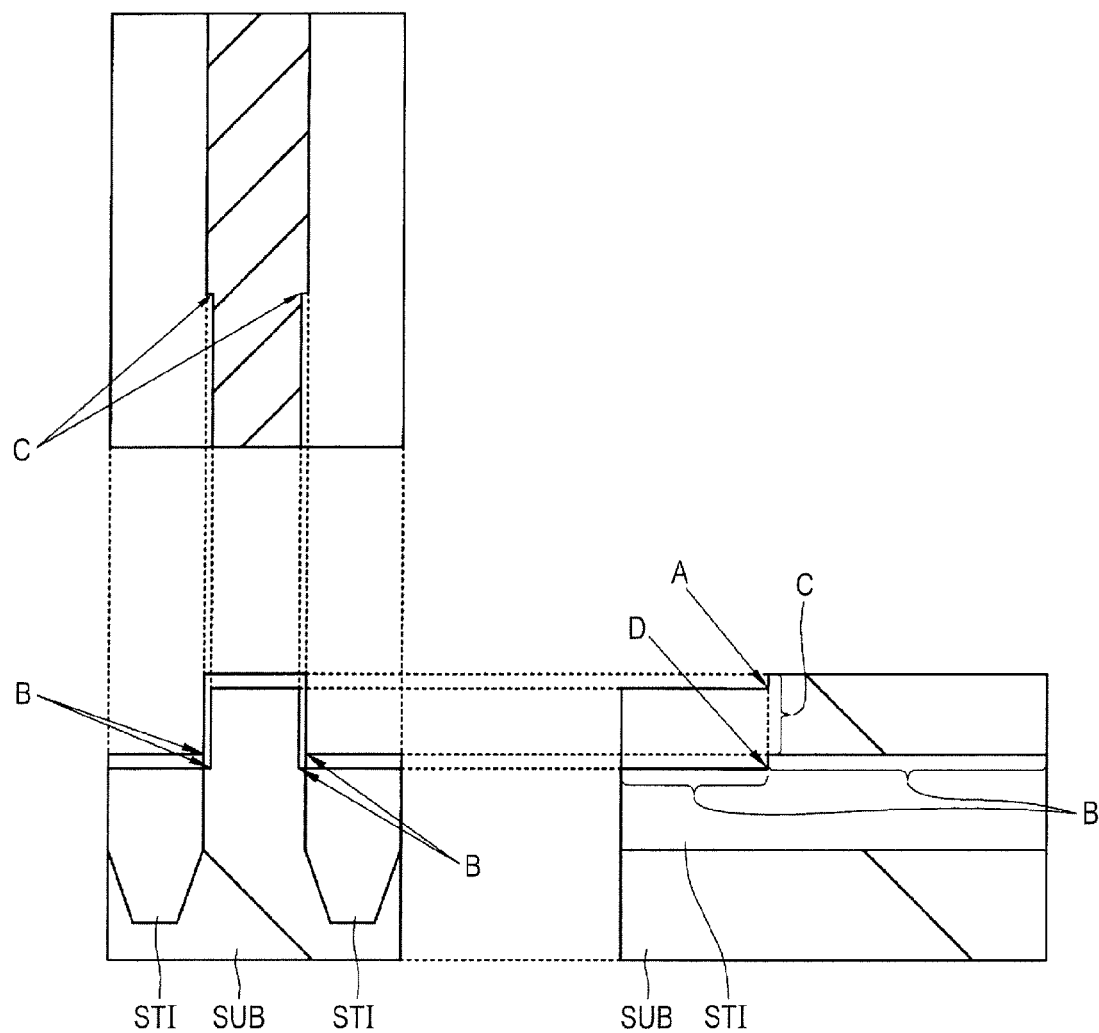
FIG. 44 is a schematic view illustrating a portion on which an electric field is concentrated during an erase operation to the MONOS-type nonvolatile memory cell according to Embodiment 4.

FIG. 44 is a schematic view illustrating the portion on which an electric field is concentrated during an erase operation to the memory cell according to Embodiment 4. FIG. 44 shows only the semiconductor substrate SUB and the isolation portions STI.

As shown in FIG. 44, by providing the memory cell MC4 with the Fin-type transistor structure, corner portions can be formed at the respective positions in each of the second memory gate electrodes MGE2 which correspond to the portions A, B, C, and D.

The portion A serves as each of the boundaries between the first and second memory gates MG1 and MG2 and is formed by etching performed in the depth direction of the semiconductor substrate SUB immediately after the formation of the first memory gates MG1. The semiconductor substrate SUB is etched over, e.g., about 10 to 28 nm in the depth direction.

The portion B is formed by the etching of the insulating film embedded in the isolation trench of each of the isolation portions STI. Similarly to the portion A, the portion B serves as each of the boundaries between the first and second memory gates MG1 and MG2 and is formed by the etching of the insulating film IL2a and by the etching performed in the depth direction of the semiconductor substrate SUB immediately after the formation of the first memory gates MG1.

The portion C is formed when, after the formation of the first memory gates MG1, the unneeded insulating film IL2a is removed and the insulating films IL3a is oxidized.

Similarly to the portions A and B, the portion D serves as each of the boundaries between the first and second memory gates MG1 and MG2 and is formed by the etching of the insulating film IL2a and by the etching performed in the depth direction of the semiconductor substrate SUB immediately after the formation of the first memory gates MG1.

An electric field can be concentrated on each of the corner portions of the second memory gate electrodes MGE2 formed at the positions corresponding to the foregoing portions A, B, C, and D during an erase operation. Accordingly, in the memory cell MC4 according to Embodiment 4, the efficiency of hole injection into the third insulating film IL3 is higher than in the memory cell MC1 according to Embodiment 1 described above.

Embodiment 5

Configuration of Semiconductor Device

Figure 45:
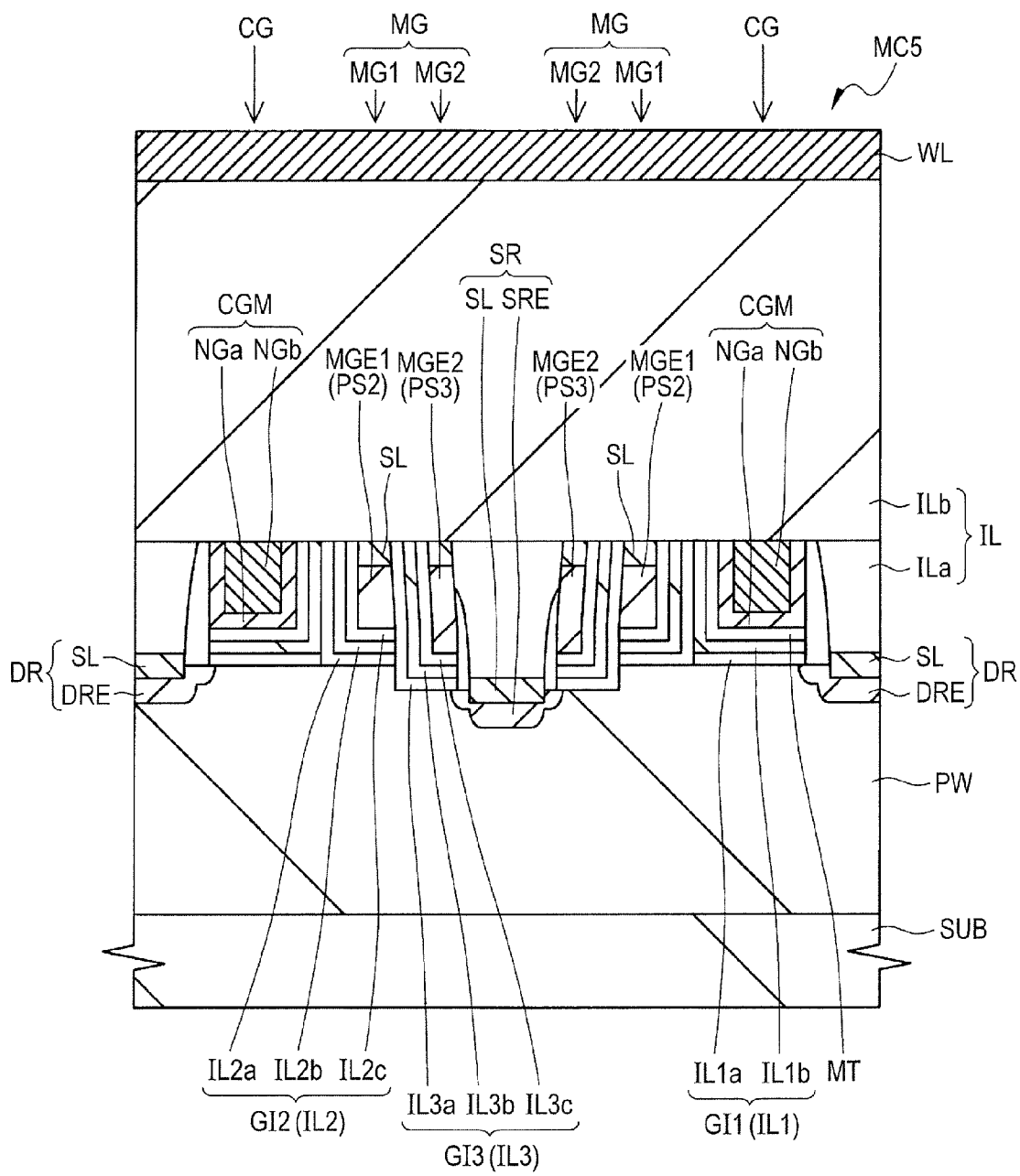
FIG. 45 is a main-portion cross-sectional view (main-portion cross-sectional view along the line A-A' shown in FIG. 2) of a MONOS-type nonvolatile memory cell according to Embodiment 5.
Figure 46:
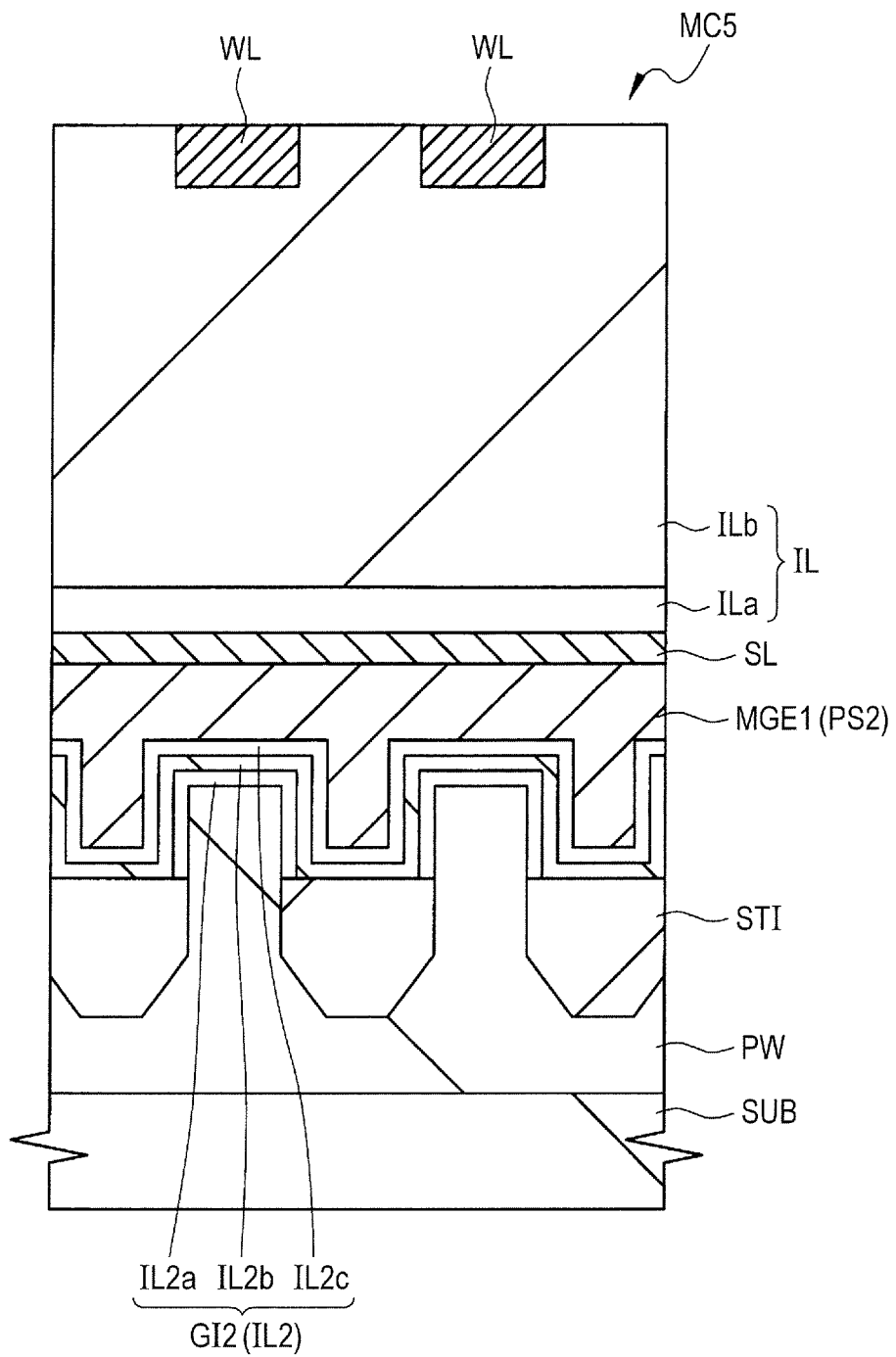
FIG. 46 is a main-portion cross-sectional view (main-portion cross-sectional view along the line B-B' shown in FIG. 2) of the MONOS-type nonvolatile memory cell according to Embodiment 5.
Figure 47:
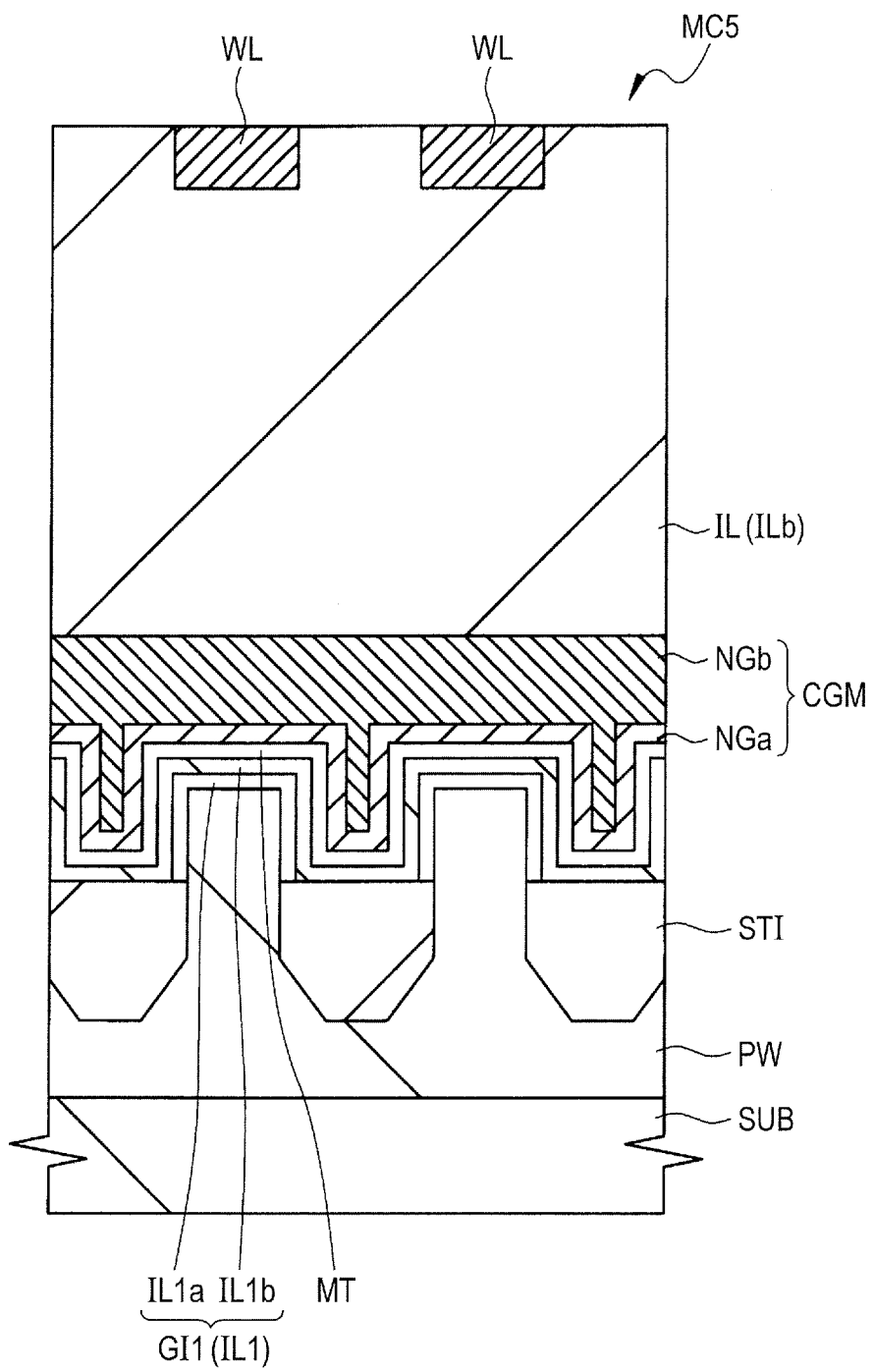
FIG. 47 is a main-portion cross-sectional view (main-portion cross-sectional view along the line C-C' shown in FIG. 2) of the MONOS-type nonvolatile memory cell according to Embodiment 5.
Figure 48:
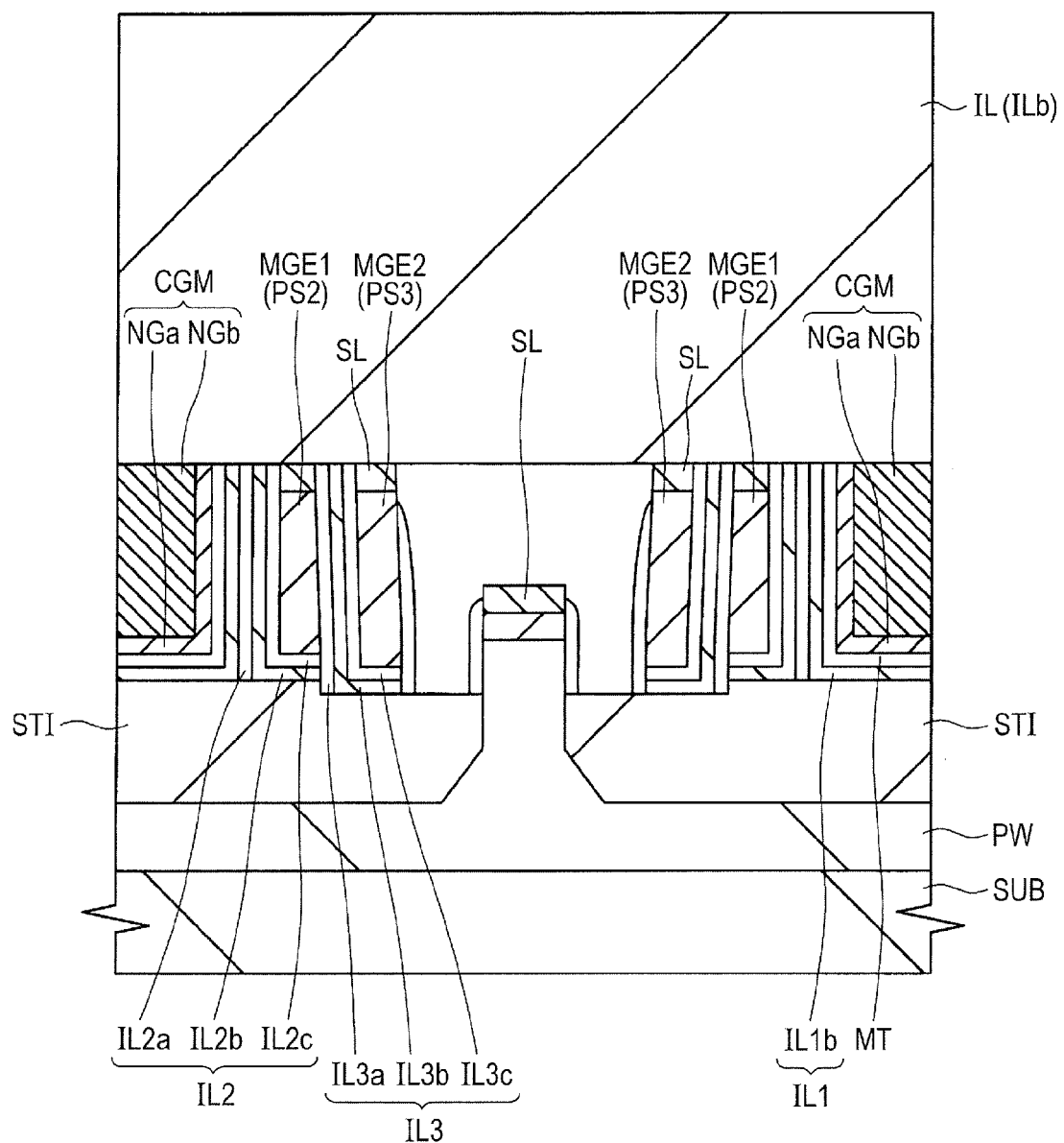
FIG. 48 is a main-portion cross-sectional view (main-portion cross-sectional view along the line D-D' shown in FIG. 2) of the MONOS-type nonvolatile memory cell according to Embodiment 5.

A configuration of a memory cell according to Embodiment 5 will be described using FIGS. 45 to 48. FIG. 45 is a main-portion cross-sectional view along the line A-A' shown in FIG. 2. FIG. 46 is a main-portion cross-sectional view along the line B-B' shown in FIG. 2. FIG. 47 is a main-portion cross-sectional view along the line C-C' shown in FIG. 2. FIG. 48 is a main-portion cross-sectional view along the line D-D' shown in FIG. 2.

A memory cell MC5 according to Embodiment 5 is different from the memory cell MC1 according to Embodiment 1 described above in the structure of each of the MIS transistors and the material forming the selection gates CG.

That is, the memory cell MC1 according to Embodiment 1 described above has the planar-type transistor structure in which each of the selection gates CG includes the first gate insulating film GI1 made of the first insulating film IL1, the selection gate electrode CGE made of the n-type polycrystalline silicon film PS1, and the silicide film SL. By contrast, the memory cell MC5 according to Embodiment 5 has a Fin-type transistor structure in which the main surface of the semiconductor substrate SUB in each of active regions is at a height position higher than that of the upper surface of each of the isolation portions STI. The selection gate CG includes the first gate insulating film GI1 made of the first insulating film ILL and a metal selection gate electrode CGM made of a multi-layer film including, e.g., the metal electrode film NGa, and the aluminum film NGb.

The configuration of the semiconductor device according to Embodiment 5 is otherwise the same or substantially the same as that of the semiconductor device according to Embodiment 1 described above so that a description thereof is omitted.

<Operation of Memory Cell>

The operation of the memory cell MC5 is the same or substantially the same as the operation of the memory cell MC1 according to Embodiment 1 described above so that a description thereof is omitted.

<Method of Manufacturing Semiconductor Device>

A method of manufacturing the semiconductor device according to Embodiment 5 will be described using FIGS. 49 to 66 in order of process steps. Here, by way of example, a method of manufacturing each of the memory cells formed in the memory region and each of the nMIS transistors formed in the peripheral circuit region will be described. FIGS. 49 to 66 are main-portion cross-sectional views of the memory cell formed in the memory region and the nMIS transistor formed in the peripheral circuit region during a manufacturing process of the semiconductor device.

Figure 49:
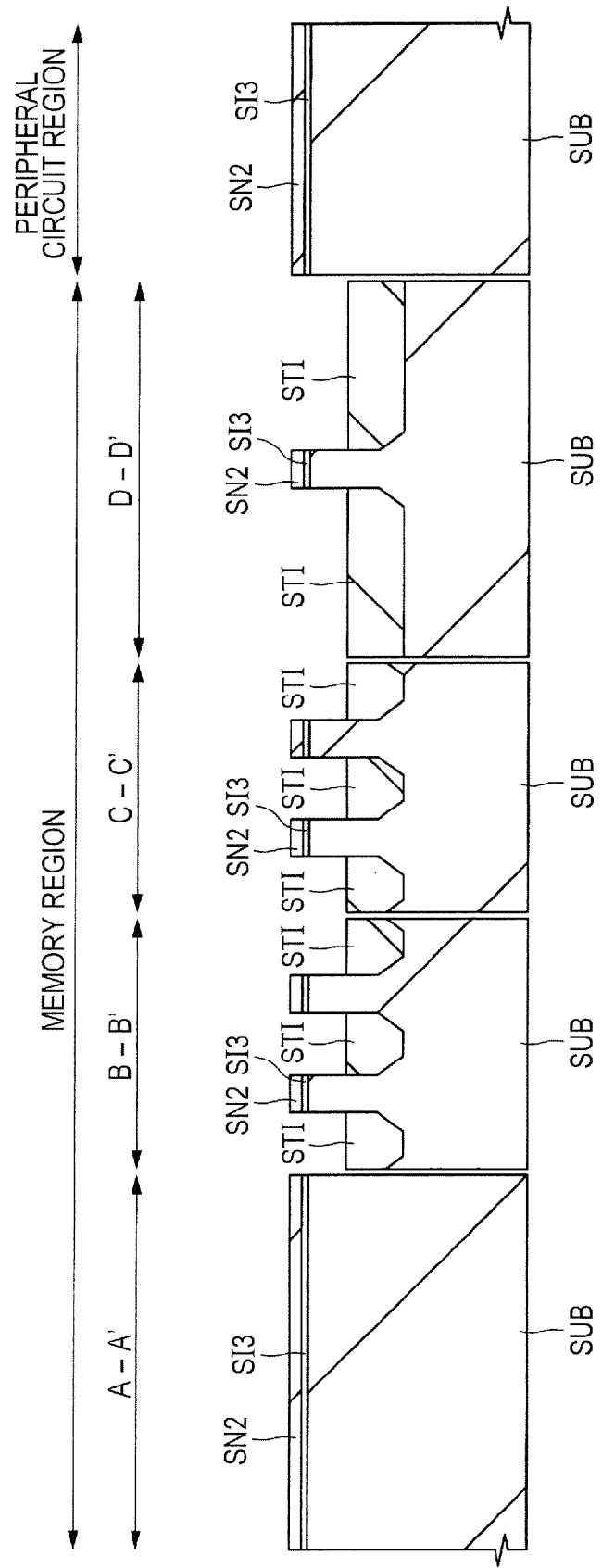
FIG. 49 is a main-portion cross-sectional view of each of the MONOS-type nonvolatile memory cells formed in a memory region and each of the n-channel MISFETs formed in a peripheral circuit region, which shows a manufacturing process of a semiconductor device according to Embodiment 5.

As shown in FIG. 49, a silicon dioxide film SI3 is formed over the main surface of the semiconductor substrate SUB by a thermal oxidation method. Then, over the silicon dioxide film SI3, a silicon nitride film SN2 is deposited. The silicon dioxide film SI3 has a thickness of, e.g., about 10 nm. The silicon nitride film SN2 has a thickness of, e.g., about 50 nm. Subsequently, by a lithographic method and a dry etching method, isolation trenches are formed in the predetermined portions of the semiconductor substrate SUB. Then, over the main surface of the semiconductor substrate SUB, an insulating film made of, e.g., silicon dioxide is deposited. Subsequently, the insulating film is etched by a dry etching method until the upper surface of the insulating film reaches a height position lower than that of the main surface of the semiconductor substrate SUB to form the isolation portions STI in each of which the insulating film is embedded in the isolation trench.

Figure 50:
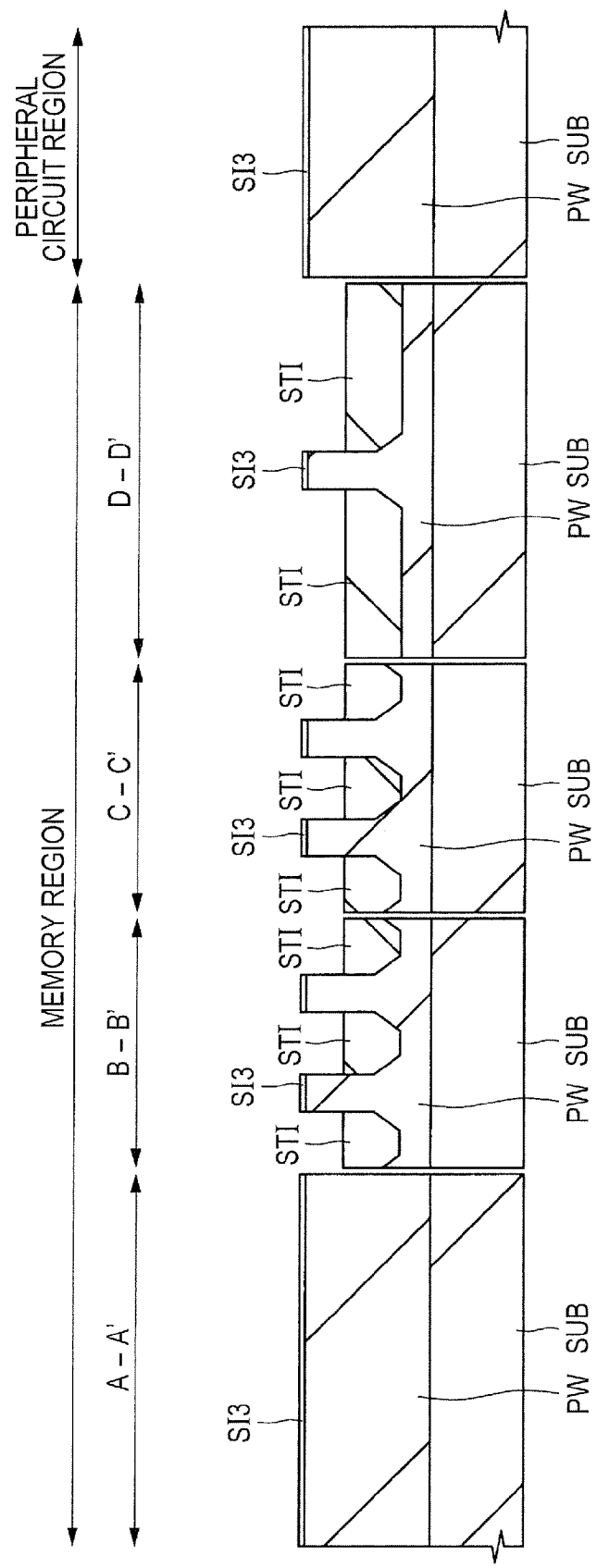
FIG. 50 is a main-portion cross-sectional view of the same portion as shown in FIG. 49 in the manufacturing process of the semiconductor device, which is subsequent to FIG. 49.

Next, as shown in FIG. 50, the silicon nitride film SN2 is removed, and then a p-type impurity is selectively ion-implanted into the semiconductor substrate SUB to form the p-well PW. It may also be possible to ion-implant a predetermined impurity for forming a channel into the semiconductor substrate SUB in the memory region and ion-implant a predetermined impurity for forming a channel in the semiconductor substrate SUB in the peripheral circuit region.

Figure 51:
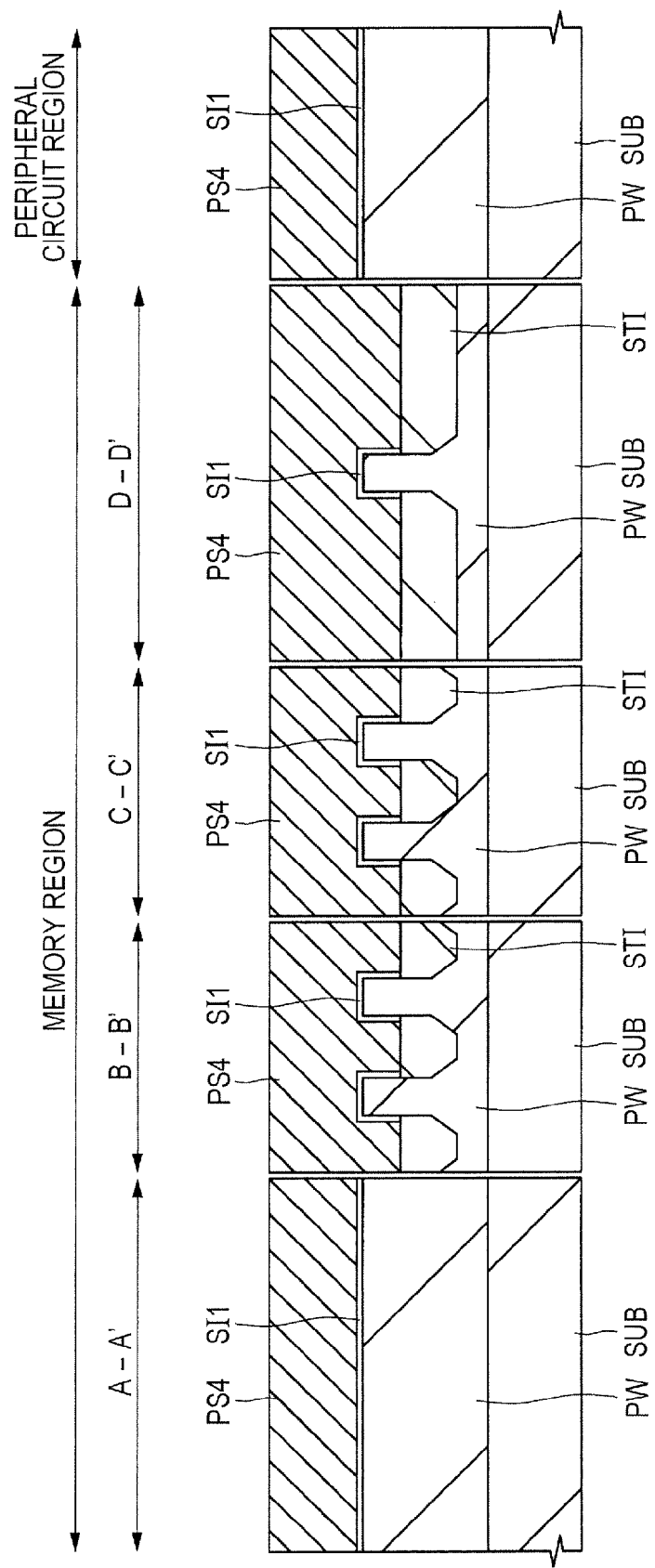
FIG. 51 is a main-portion cross-sectional view of the same portion as shown in FIG. 49 in the manufacturing process of the semiconductor device, which is subsequent to FIG. 50.

Next, as shown in FIG. 51, the silicon dioxide film SI3 is removed by a wet etching method. Then, over the main surface of the semiconductor substrate SUB, the silicon dioxide film SI1 is formed by a thermal oxidation method. The silicon dioxide film SI1 has a thickness of, e.g., about 2 nm. Subsequently, over the silicon dioxide film SI1, the polycrystalline silicon film PS4 is deposited. The polycrystalline silicon film PS4 has a thickness of, e.g., about 120 nm.

Figure 52:
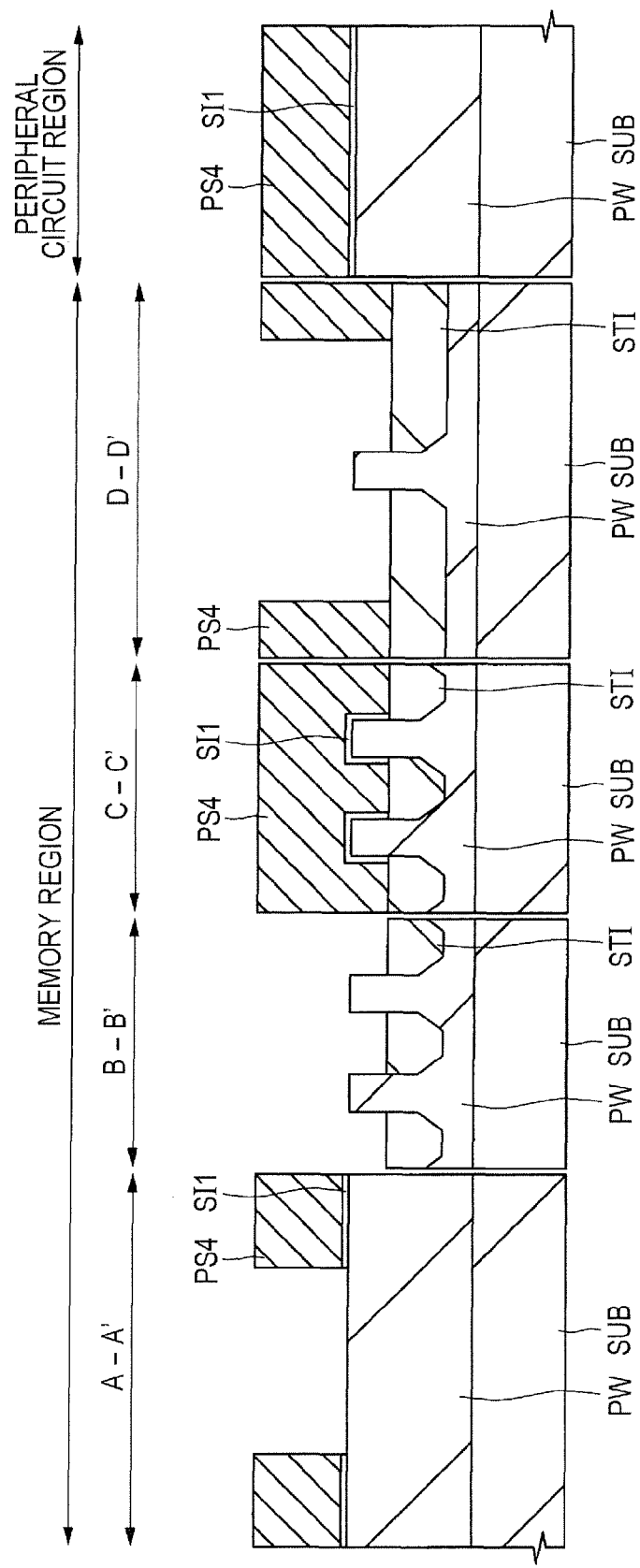
FIG. 52 is a main-portion cross-sectional view of the same portion as shown in FIG. 49 in the manufacturing process of the semiconductor device, which is subsequent to FIG. 51.

Next, as shown in FIG. 52, by a lithographic method and a dry etching method, the polycrystalline silicon film PS4 and the silicon dioxide film SI1 are removed from the regions where the memory gates MG are to be formed in the subsequent steps to form dummy patterns each made of the polycrystalline silicon film PS4.

Figure 53:
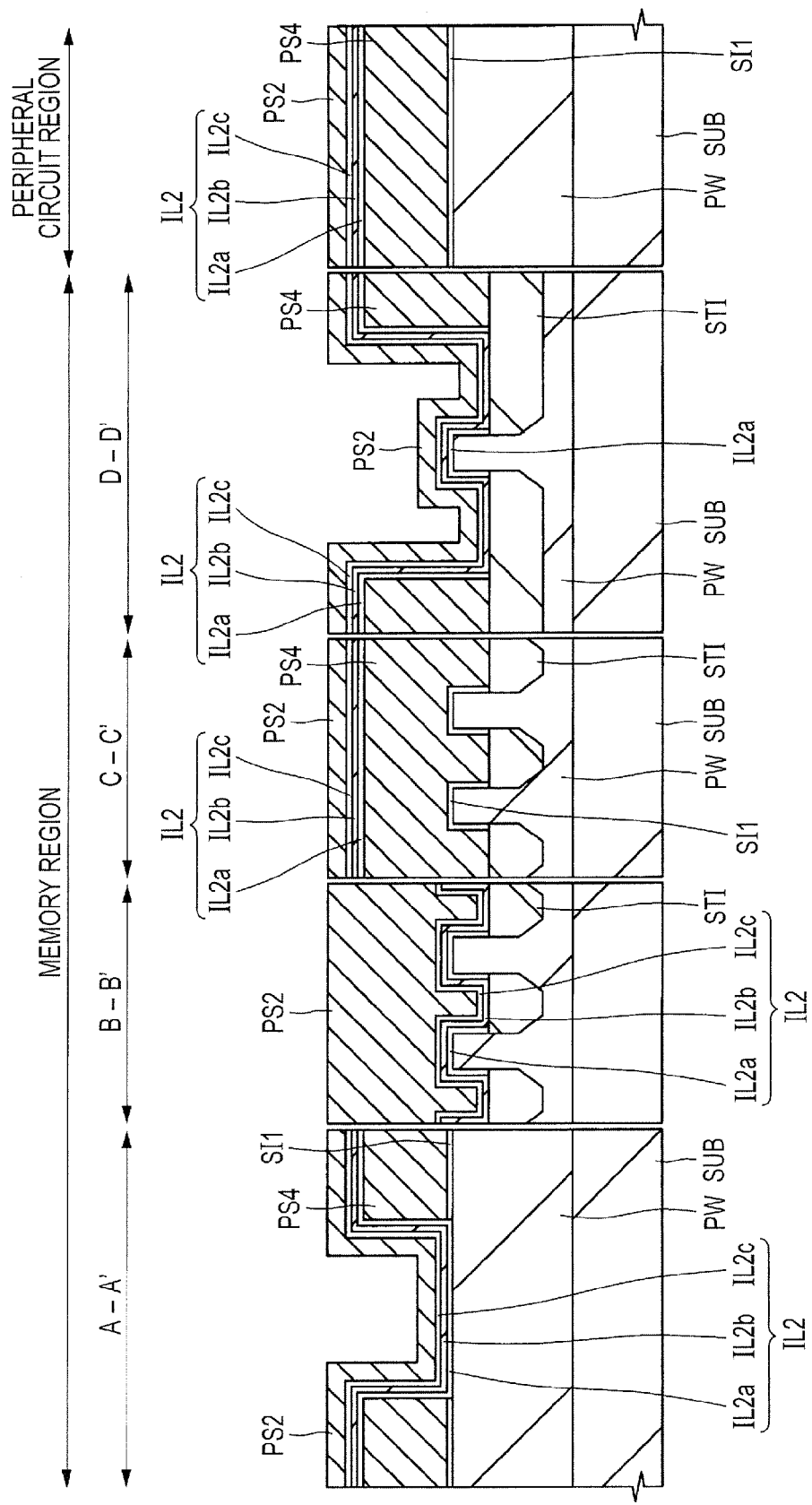
FIG. 53 is a main-portion cross-sectional view of the same portion as shown in FIG. 49 in the manufacturing process of the semiconductor device, which is subsequent to FIG. 52.

Next, as shown in FIG. 53, over the main surface of the semiconductor substrate SUB, the insulating film IL2a made of, e.g., silicon dioxide, the charge storage film IL2b made of, e.g., silicon nitride to serve as an insulating film having a trap level, and the insulating film IL2c made of, e.g., silicon oxynitride are successively formed to form the second insulating film IL2. The insulating film IL2a is formed by, e.g., a thermal oxidation method. The charge storage film IL2b is formed by, e.g., a CVD method. The insulating film IL2c is formed by, e.g., a CVD method. The insulating film IL2a has a thickness of, e.g., about 4 nm. The charge storage film IL2b has a thickness of, e.g., about 6 nm. The insulating film IL2c has a thickness of, e.g., about 8 nm.

As the charge storage film IL2b, a high-dielectric-constant film having a dielectric constant higher than that of a silicon nitride film, such as, e.g., an aluminum oxide (alumina) film, a hafnium oxide film, or a tantalum oxide film may also be used. To improve the processibility of the memory gates MG to be formed in the subsequent step, regions where dummy patterns having the same shapes as those of the memory cells MC1 are formed may also be provided.

Subsequently, over the main surface of the semiconductor substrate SUB, the n-type polycrystalline silicon film PS2 is deposited. The polycrystalline silicon film PS2 is formed by a CVD method and has a thickness of, e.g., about 40 nm.

Figure 54:
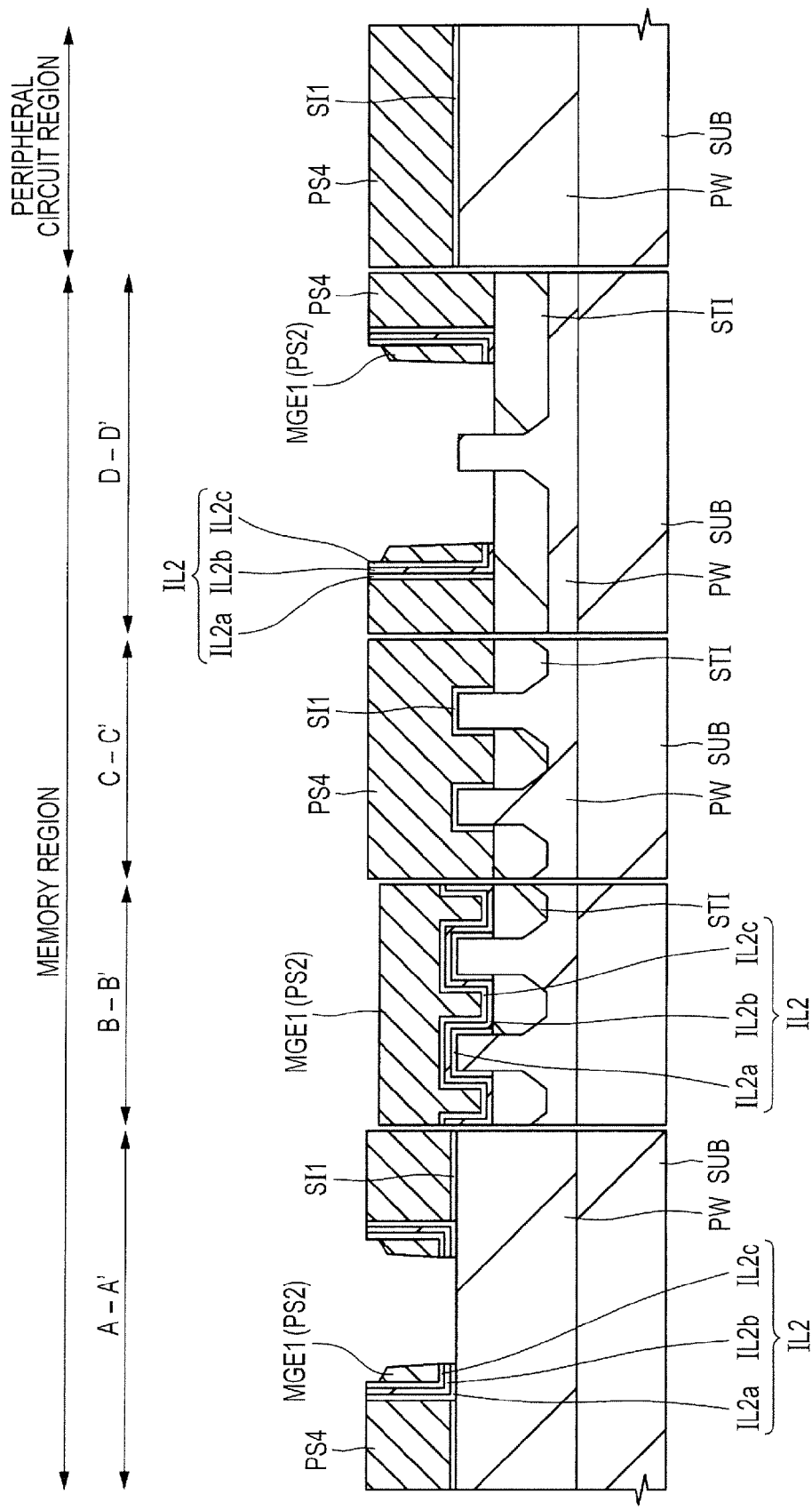
FIG. 54 is a main-portion cross-sectional view of the same portion as shown in FIG. 49 in the manufacturing process of the semiconductor device, which is subsequent to FIG. 53.

Next, as shown in FIG. 54, the polycrystalline silicon film PS2 is processed by an anisotropic dry etching method. Thus, in the memory region, the first memory gate electrodes MGE1 each made of the polycrystalline silicon film PS2 and having a sidewall shape are formed over the side surfaces of the dummy patterns each made of the polycrystalline silicon film PS4 via the second insulating films IL2. While the first memory gate electrodes MGE1 are formed, the exposed second insulating films IL2 are removed and the semiconductor substrate SUB exposed between the adjacent first memory gates MG1 is removed in the depth direction thereof to form trench portions in the main surface of the semiconductor substrate SUB. The preferred depth of each of the trench portions is, e.g., about 10 to 28 nm, in the same manner as in Embodiment 1 described above.

Between the dummy patterns each made of the polycrystalline silicon film PS4 and the first memory gate electrodes MGE1, the second insulating films IL2 in each of which the insulating film IL2a, the charge storage film IL2b, and the insulating film IL2c are successively stacked in order of increasing distance from the dummy pattern made of the polycrystalline silicon film PS4 are formed. On the other hand, between the semiconductor substrate SUB and the first memory gate electrodes MGE1, the second insulating films IL2 in each of which the insulating film IL2a, the charge storage film IL2b, and the insulating film IL2c are successively stacked in order of increasing distance from the semiconductor substrate SUB are formed.

Figure 55:
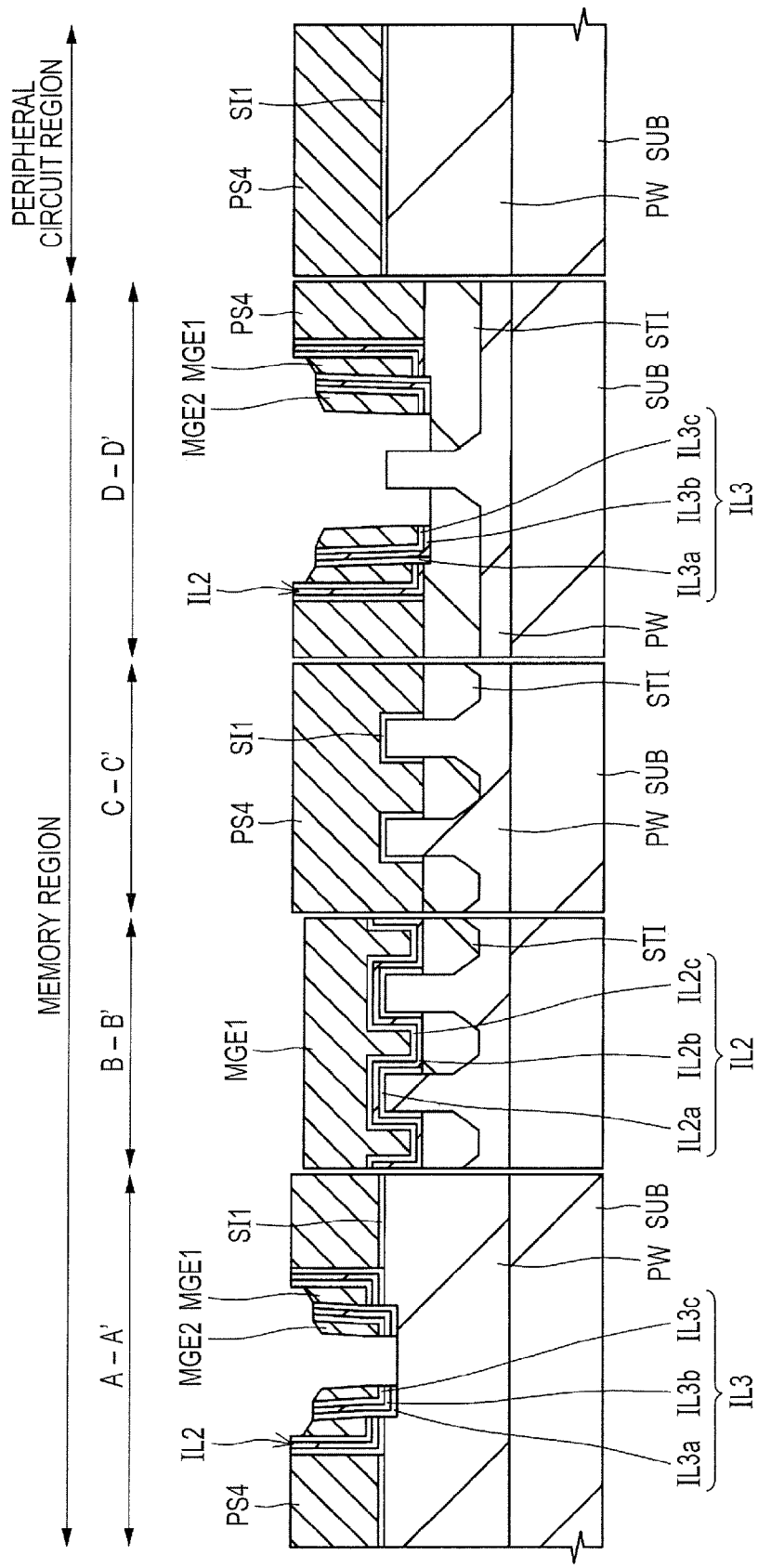
FIG. 55 is a main-portion cross-sectional view of the same portion as shown in FIG. 49 in the manufacturing process of the semiconductor device, which is subsequent to FIG. 54.

Next, as shown in FIG. 55, in the same manner as in the manufacturing steps described above using FIGS. 53 and 54, the second memory gate electrodes MGE2 are formed over the respective side surfaces of the first memory gate electrodes MGE1. Between the first and second memory gate electrodes MGE1 and MGE2, the third insulating films IL3 in each of which the insulating film IL3a, the charge storage film IL3b, and the insulating film IL3c are successively stacked in order of increasing distance from the first memory gate MGE1 are formed. On the other hand, between the semiconductor substrate SUB and the second memory gate electrodes MGE2, the third insulating films IL3 in each of which the insulating film IL3a, the charge storage film IL3b, and the insulating film IL3c are successively stacked in order of increasing distance from the semiconductor substrate SUB are formed.

Figure 56:
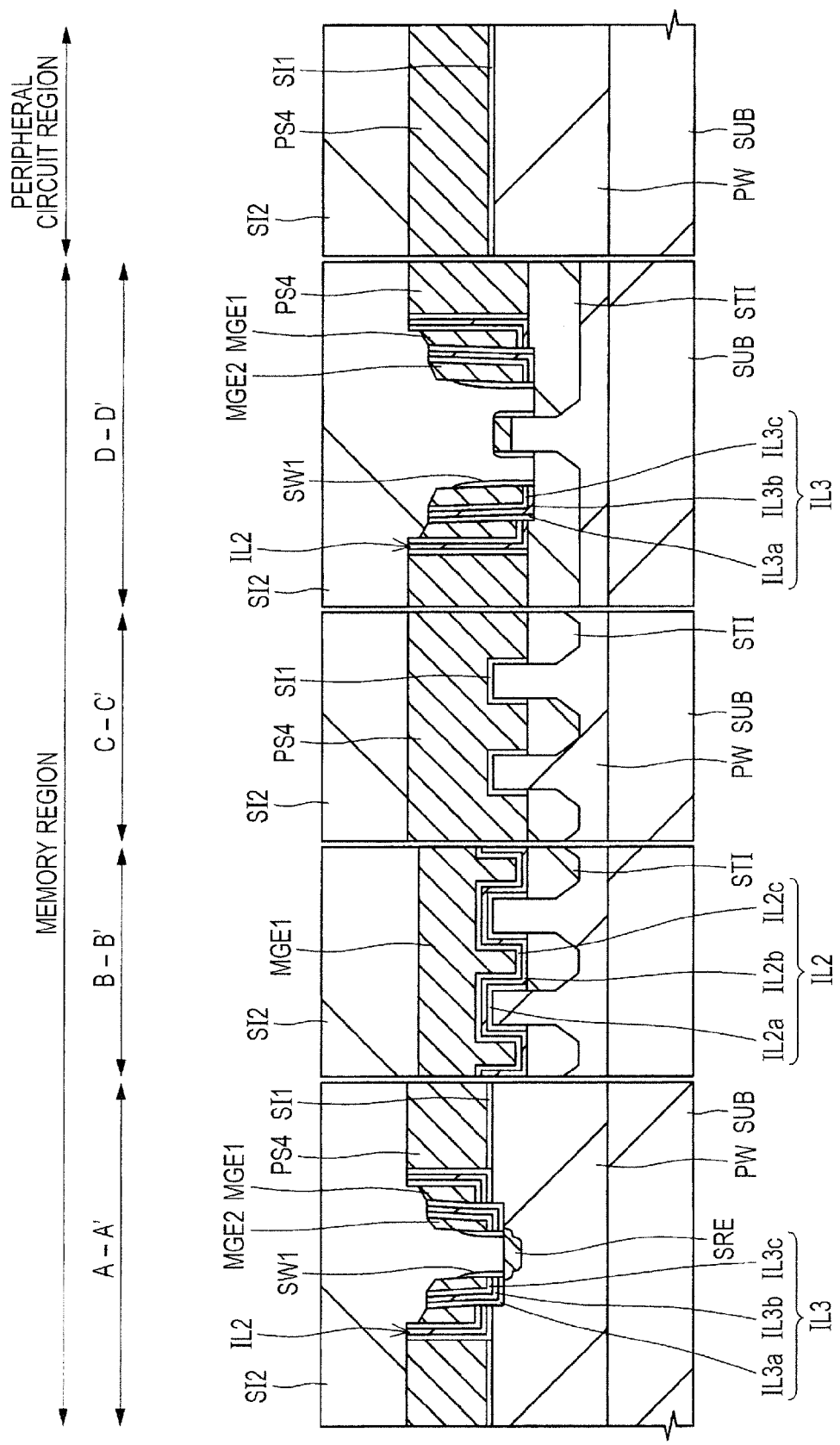
FIG. 56 is a main-portion cross-sectional view of the same portion as shown in FIG. 49 in the manufacturing process of the semiconductor device, which is subsequent to FIG. 55.

Next, as shown in FIG. 56, into the semiconductor substrate SUB interposed between the adjacent second memory gate electrodes MGE2 in the memory region, an n-type impurity, e.g., arsenic is ion-implanted to form a relatively-lower-concentration $n^-$-type semiconductor region. Subsequently, over the main surface of the semiconductor substrate SUB, an insulating film is deposited and processed by an anisotropic dry etching method. Thus, in the memory region, the sidewalls SW1 are formed over the respective side surfaces of the second memory gate electrodes MGE2. Subsequently, into the semiconductor substrate SUB interposed between the adjacent second memory gate electrodes MGE2 in the memory region, an n-type impurity, e.g., arsenic is ion-implanted to form a relative-higher-concentration $n^+$-type semiconductor region and thus form the source region SRE including the relatively-lower-concentration $n^-$-type semiconductor region and the relatively-higher-concentration $n^+$-type semiconductor region.

Subsequently, over the main surface of the semiconductor substrate SUB, the silicon dioxide film SI2 is formed. Here, the silicon dioxide film SI2 is removed by a wet etching method in the subsequent step. Accordingly, as the silicon dioxide film SI2, e.g., a SOG film having a high wet etching rate or the like is preferred.

Figure 57:
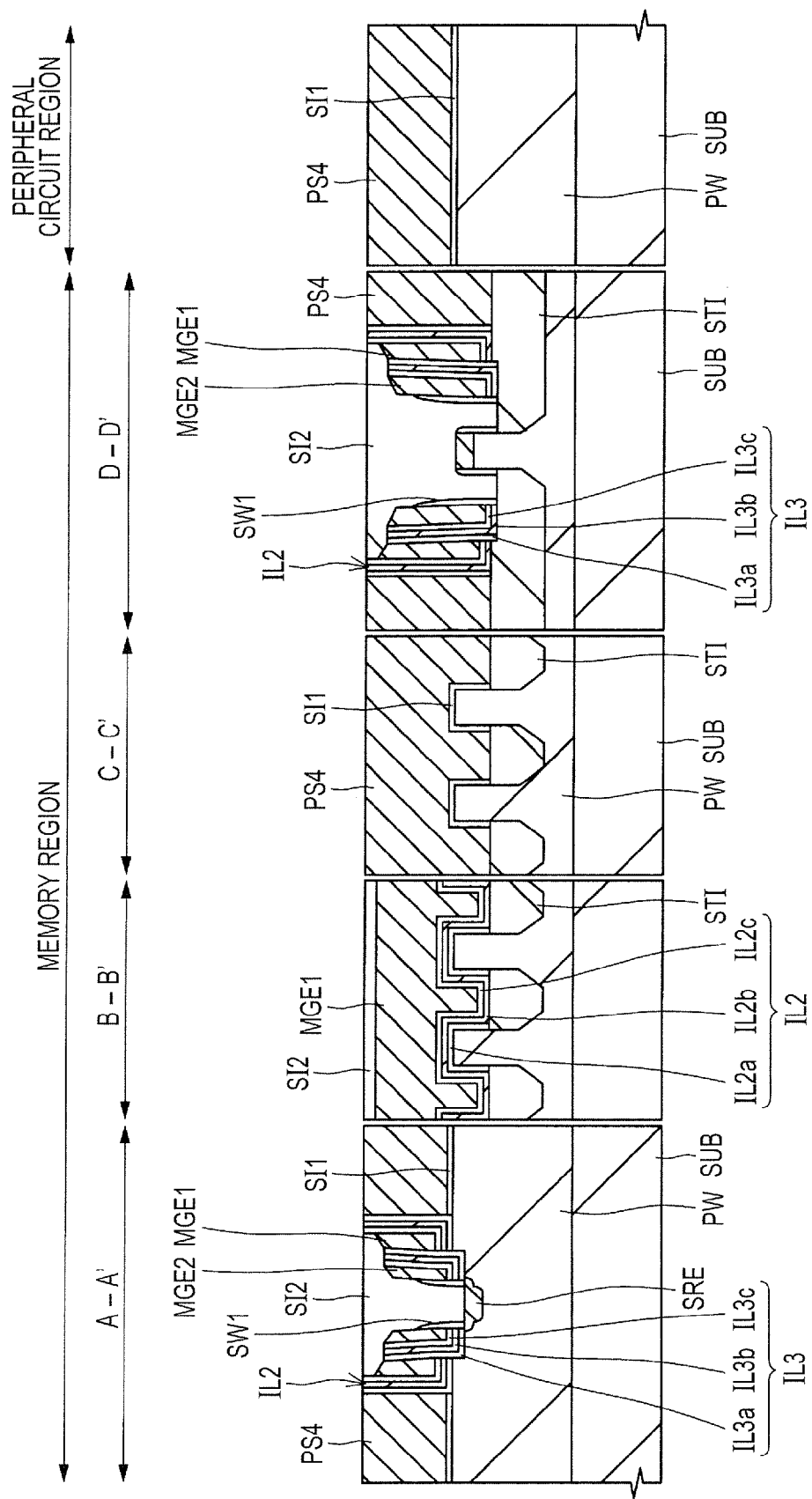
FIG. 57 is a main-portion cross-sectional view of the same portion as shown in FIG. 49 in the manufacturing process of the semiconductor device, which is subsequent to FIG. 56.

Next, as shown in FIG. 57, polishing which ends at the polycrystalline silicon film PS4 is performed by a CMP method to remove the silicon dioxide film SI2 over the polycrystalline silicon film PS4.

Figure 58:
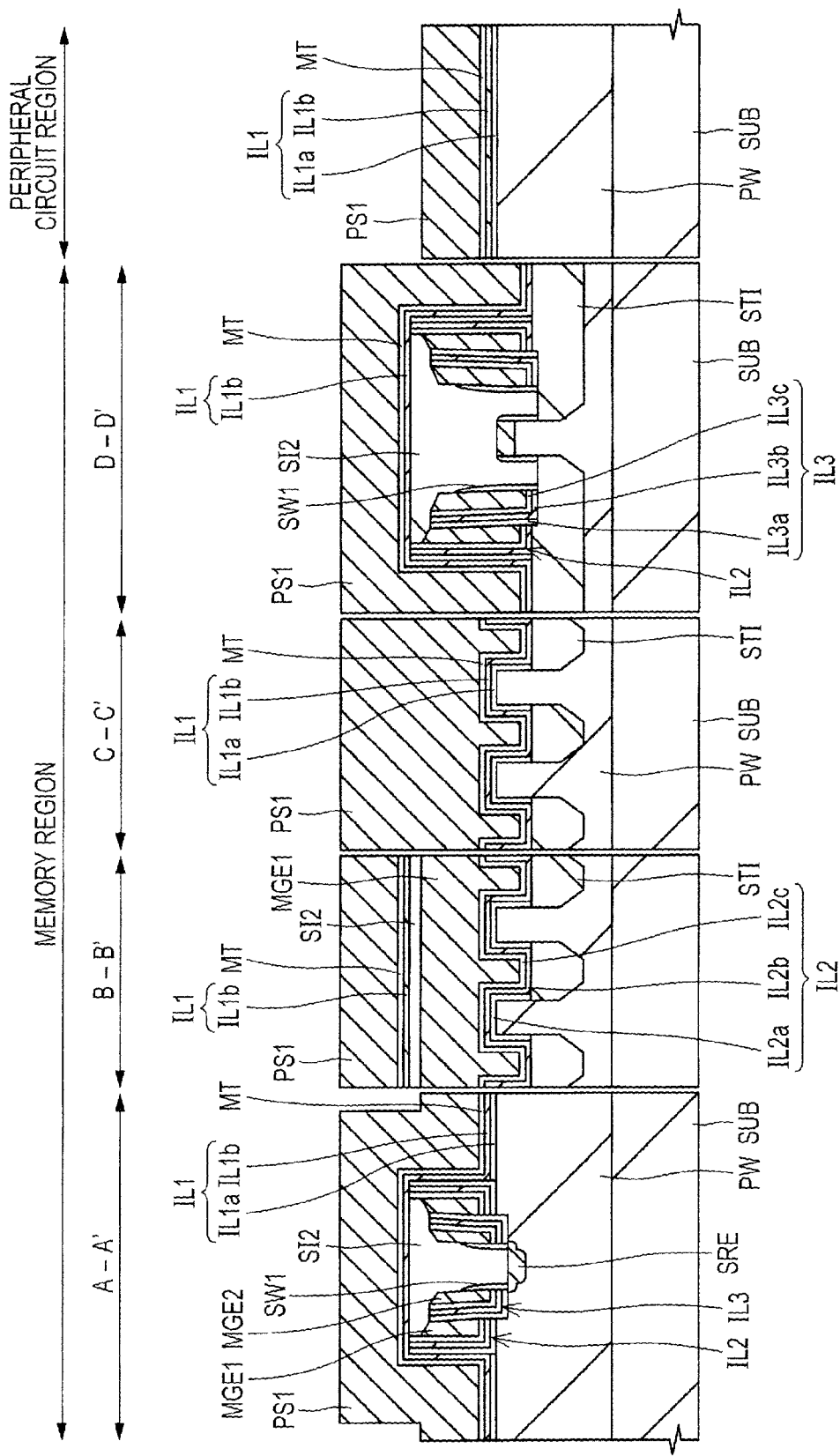
FIG. 58 is a main-portion cross-sectional view of the same portion as shown in FIG. 49 in the manufacturing process of the semiconductor device, which is subsequent to FIG. 57.

Next, as shown in FIG. 58, by a dry etching method and a wet etching method, the polycrystalline silicon film PS4 and the silicon dioxide film SI1 are removed. Subsequently, over the main surface of the semiconductor substrate SUB exposed in the memory region and the peripheral circuit region, an insulating film IL1a made of, e.g., silicon dioxide is formed by a thermal oxidation method. The insulating film IL1a has a thickness of, e.g., about 1 nm. Subsequently, over the main surface of the semiconductor substrate SUB, the high-dielectric-constant film IL1b made of, e.g., hafnium oxide is formed to form the first insulating film IL1 including the insulating film IL1a and the high-dielectric-constant film IL1b. The high-dielectric-constant film IL1b has a thickness of, e.g. about 5 nm. Subsequently, over the first insulating film IL1, the metal film MT made of, e.g., titanium nitride is formed. The metal film MT functions as a barrier film which prevents a reaction between the high-dielectric-constant film IL1b and the selection gate electrode CGE. The metal film MT has a thickness of, e.g., about 10 nm. Subsequently, over the metal film MT, the polycrystalline silicon film PS1 is deposited. The polycrystalline silicon film PS1 has a thickness of, e.g., about 100 nm.

Figure 59:
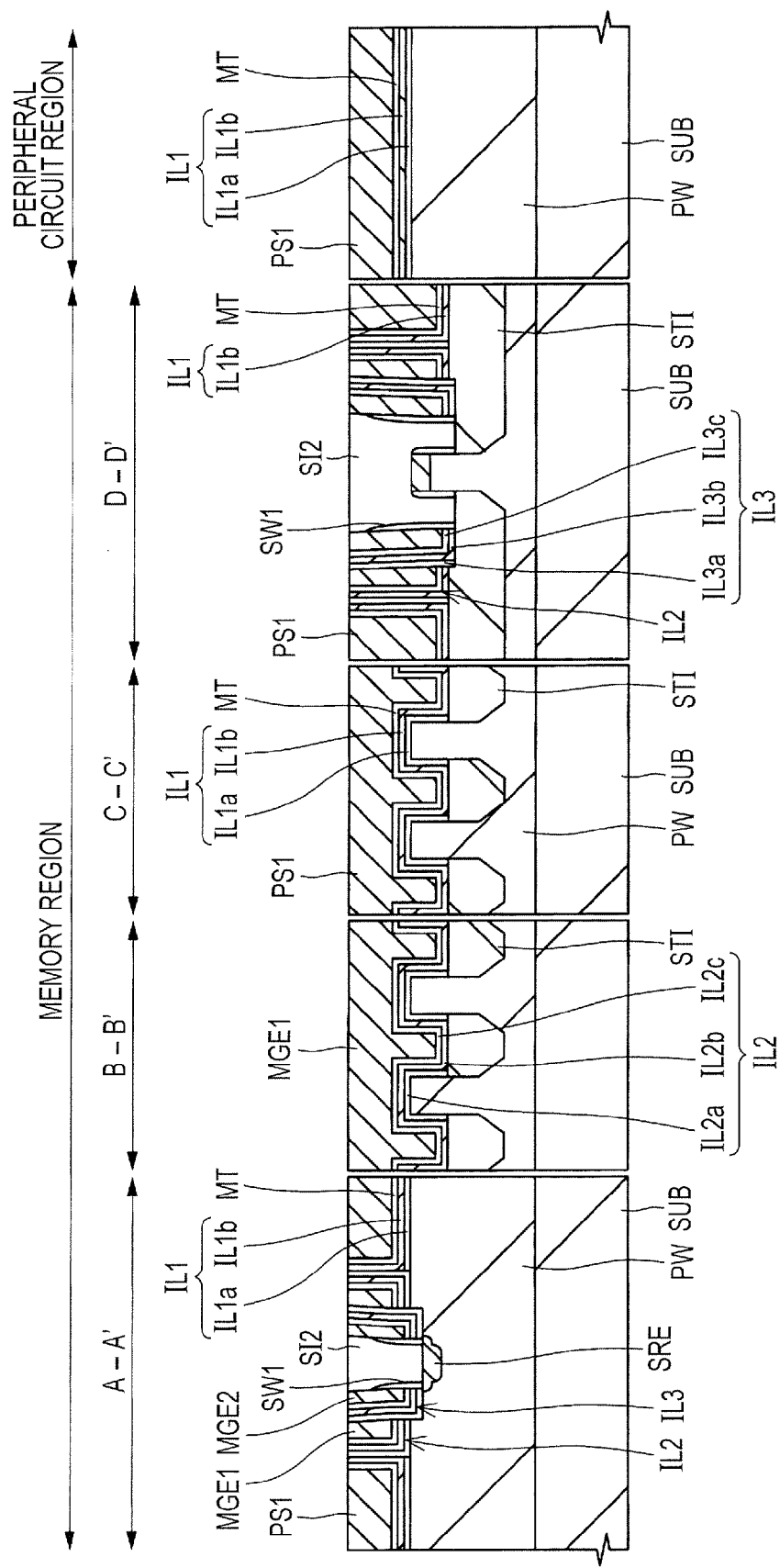
FIG. 59 is a main-portion cross-sectional view of the same portion as shown in FIG. 49 in the manufacturing process of the semiconductor device, which is subsequent to FIG. 58.

Next, as shown in FIG. 59, the polycrystalline silicon film PS1, the metal film MT, the first, second, and third insulating films IL1, IL2, and IL3, the silicon dioxide film SI2, and the first and second memory gate electrodes MGE1 and MGE2 are polished by a CMP method to have planarized top surfaces. A height from the main surface of the semiconductor substrate to each of the top surfaces is, e.g., about 80 nm.

Figure 60:
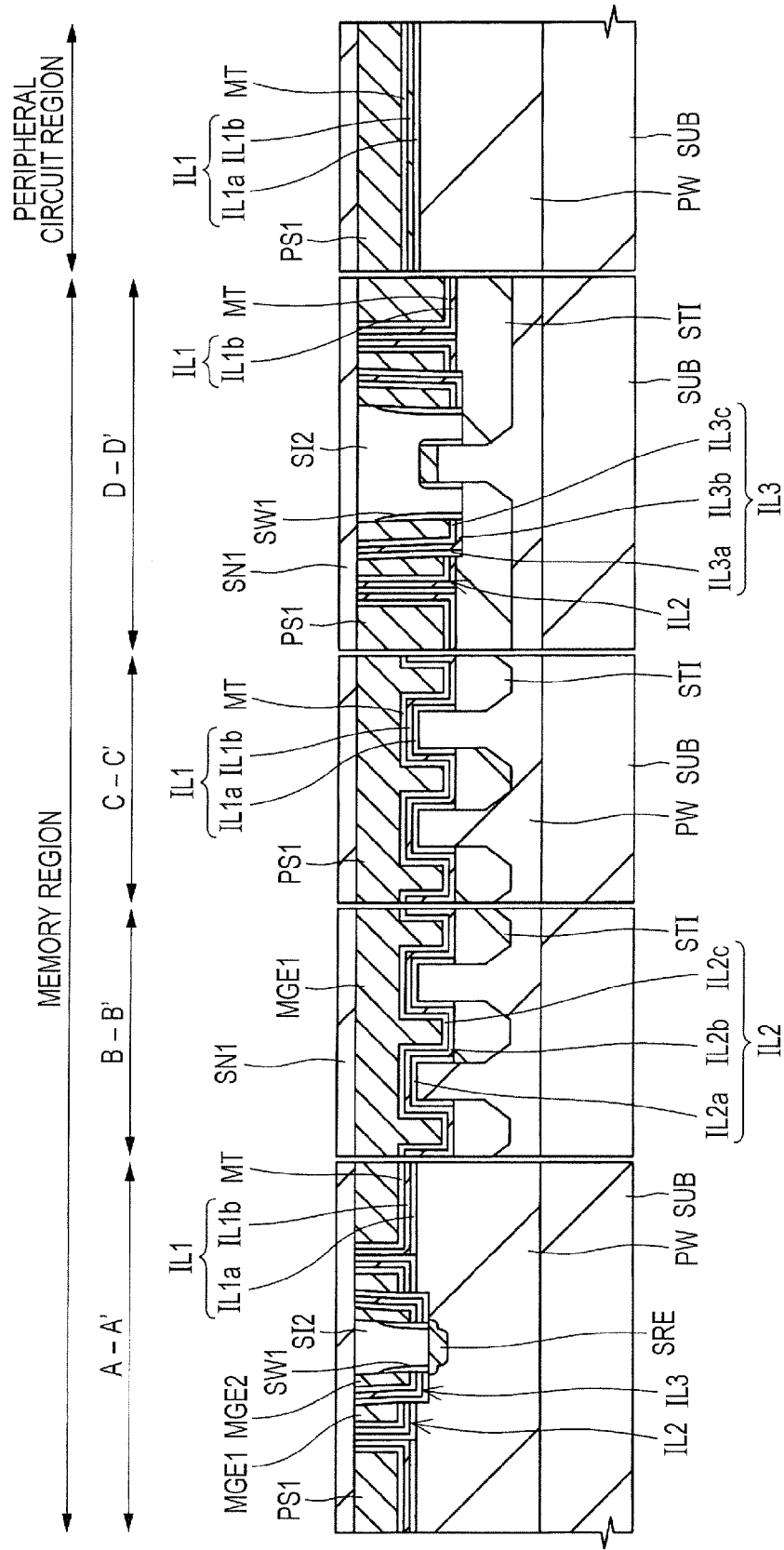
FIG. 60 is a main-portion cross-sectional view of the same portion as shown in FIG. 49 in the manufacturing process of the semiconductor device, which is subsequent to FIG. 59.

Next, as shown in FIG. 60, over the main surface of the semiconductor substrate SUB, the silicon nitride film SN1 is deposited.

Figure 61:
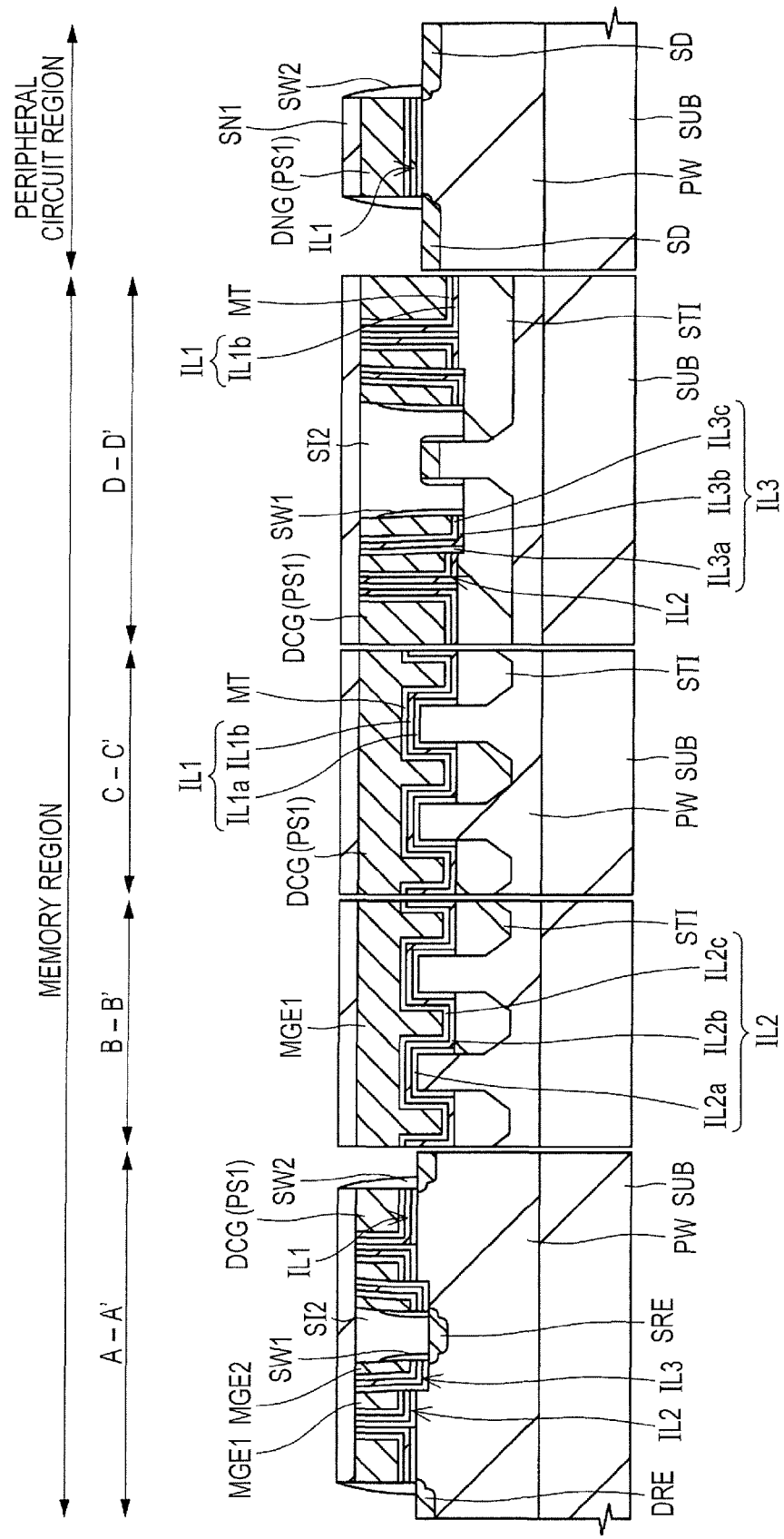
FIG. 61 is a main-portion cross-sectional view of the same portion as shown in FIG. 49 in the manufacturing process of the semiconductor device, which is subsequent to FIG. 60.

Next, as shown in FIG. 61, the silicon nitride film SN1 is removed from the areas of the peripheral circuit region where the source/drain regions SD of the nMIS transistor are formed and from the areas of the memory region where the drain regions DRE are formed. Subsequently, by a lithographic method and a dry etching method, the polycrystalline silicon film PS1, the metal film MT, and the first insulating film IL1 are processed. Thus, in the memory region, dummy selection gate electrodes DCG each made of the polycrystalline silicon film PS1 are formed. On the other hand, in the peripheral circuit region, the dummy gate electrode DNG for the nMIS transistor which is made of the polycrystalline silicon film PS1 is formed.

Subsequently, an n-type impurity, e.g., arsenic is ion-implanted into the semiconductor substrate SUB interposed between the adjacent dummy selection gate electrodes DCG in the memory region and into the semiconductor substrate SUB in the peripheral circuit region to form relatively-lower-concentration n⁻-type semiconductor regions. Subsequently, over the main surface of the semiconductor substrate SUB, an insulating film is deposited and processed using an anisotropic dry etching method. Thus, in the memory region, the sidewalls SW2 are formed over the respective side surface of the dummy selection gate electrodes DCG which are located opposite to the first and second memory gate electrodes MGE1 and MGE2 while, in the peripheral circuit region, the sidewalls SW2 are formed over the both side surfaces of the dummy gate electrode DNG.

Subsequently, an n-type impurity such as, e.g., arsenic is ion-implanted into the semiconductor substrate SUB interposed between the adjacent dummy selection gate electrodes DCG in the memory region and into the semiconductor substrate SUB in the peripheral circuit region to form relatively-higher-concentration n⁺-type semiconductor regions. Thus, in the memory region, the drain regions DRE each including the relatively-lower-concentration n⁻-type semiconductor region and the relatively-higher-concentration n⁺-type semiconductor region are formed while, in the peripheral circuit region, the source/drain regions SD of the nMIS transistor each including the relatively-lower-concentration n⁻-type semiconductor region and the relatively-higher-concentration n⁺-type semiconductor region are simultaneously formed.

Figure 62:
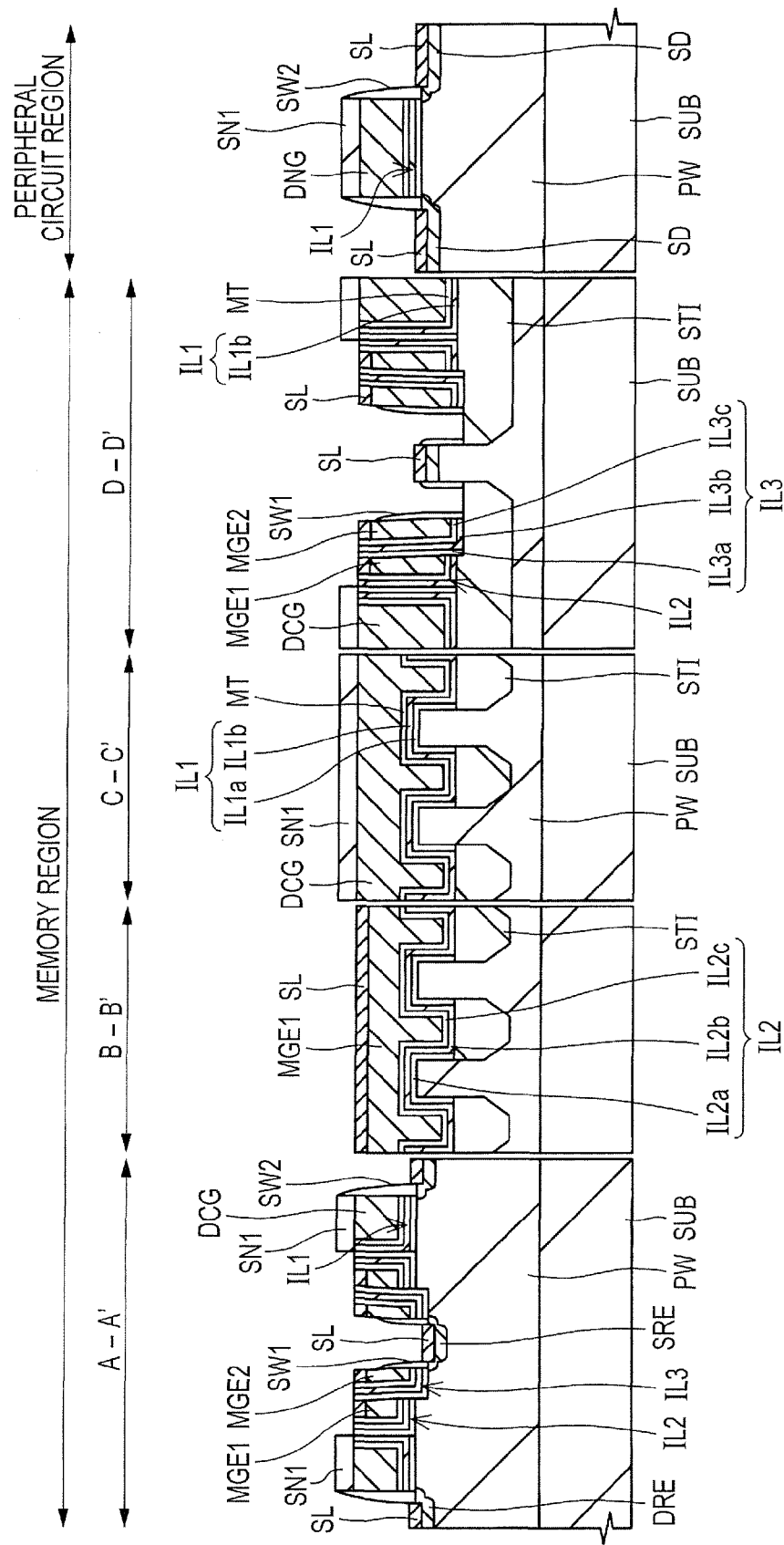
FIG. 62 is a main-portion cross-sectional view of the same portion as shown in FIG. 49 in the manufacturing process of the semiconductor device, which is subsequent to FIG. 61.

Next, as shown in FIG. 62, by a lithographic method and a dry etching method, the silicon nitride film SN1 is removed except from over the dummy gate electrode DNG of the nMIS transistor in the peripheral circuit region and from over the dummy selection gate electrodes DCG in the memory region. Subsequently, the silicon dioxide film 512 is removed by a wet etching method to expose the respective upper surfaces of the first and second memory gate electrodes MGE1 and MGE2, the source region SRE, and the drain regions DRE in the memory region and expose the upper surfaces of the source/drain regions SD in the peripheral circuit region.

Subsequently, by a salicide process, the silicide films SL are formed in the respective upper surfaces of the first and second memory gate electrodes MGE1 and MGE2, the source region SRE, and the drain regions DRE in the memory region, while being formed in the upper surfaces of the source/drain regions SD in the peripheral circuit region. For the silicide films SL, e.g., nickel silicide, cobalt silicide, or the like is used.

By forming the silicide films SL, it is possible to reduce the coupling resistance between each of the silicide films SL and the plug formed thereover or the like. In the memory region, it is possible to reduce the respective resistances of the first and second memory gate electrodes MGE1 and MGE2, the source region SRE, and the drain regions DRE. In the peripheral circuit region, it is possible to reduce the resistances of the source/drain regions SD of the nMIS transistor.

By the manufacturing steps that have been described heretofore, in the memory region, the memory gates MG each including the first and second memory gates MG1 and MG2 are formed, as shown in, e.g., FIG. 45 described above. Also, the source SR is formed in which the source region SRE and the silicide film SL are stacked, and the drains DR in each of which the drain region DRE and the silicide film SL are stacked are formed.

Figure 63:
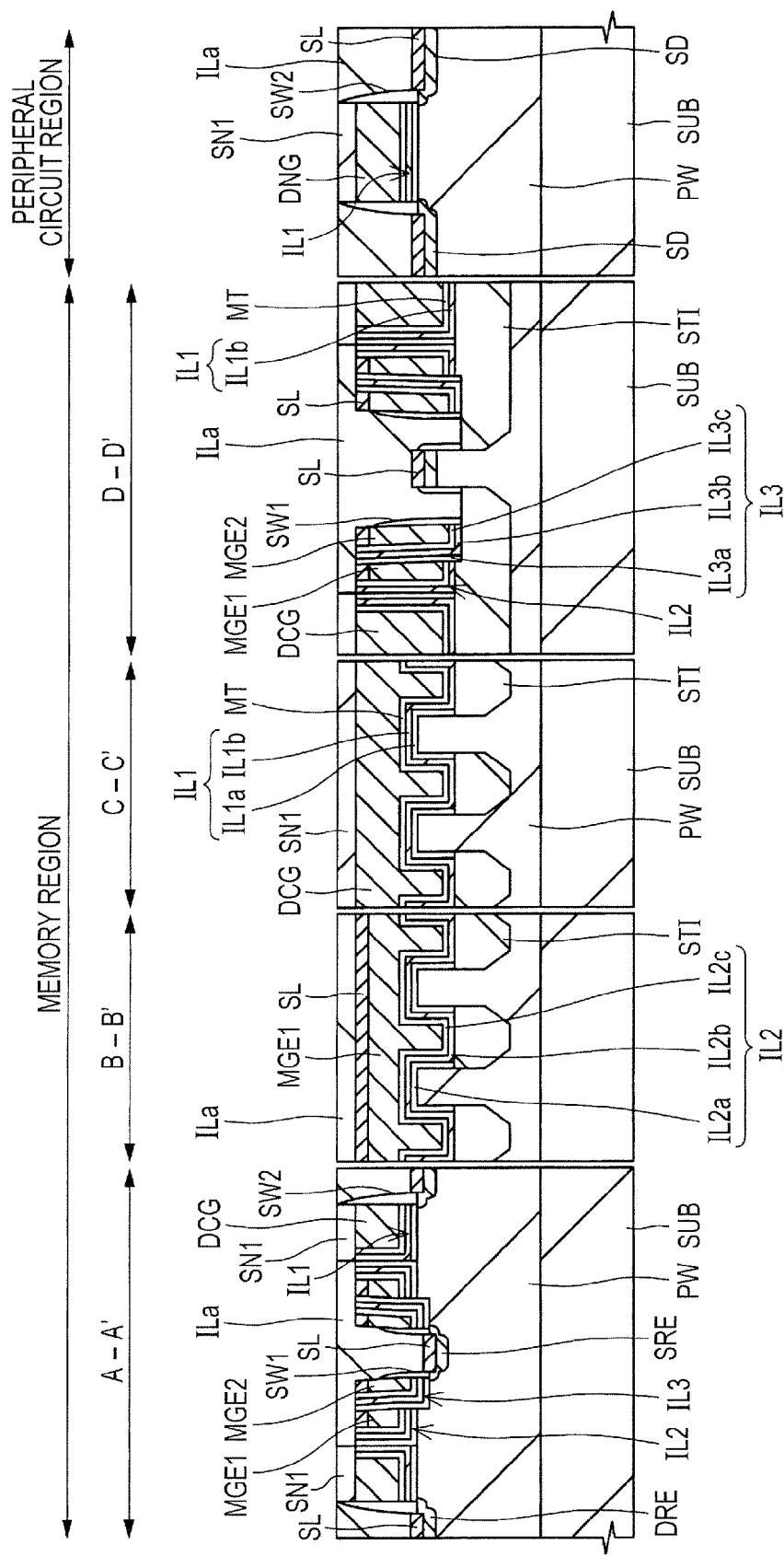
FIG. 63 is a main-portion cross-sectional view of the same portion as shown in FIG. 49 in the manufacturing process of the semiconductor device, which is subsequent to FIG. 62.

Next, as shown in FIG. 63, over the main surface of the semiconductor substrate SUB, the silicon dioxide film ILa is deposited by a CVD method. Then, polishing which ends at the silicon nitride film SN1 is performed by, e.g., a CMP method to planarize the top surfaces of the silicon dioxide film ILa.

Figure 64:
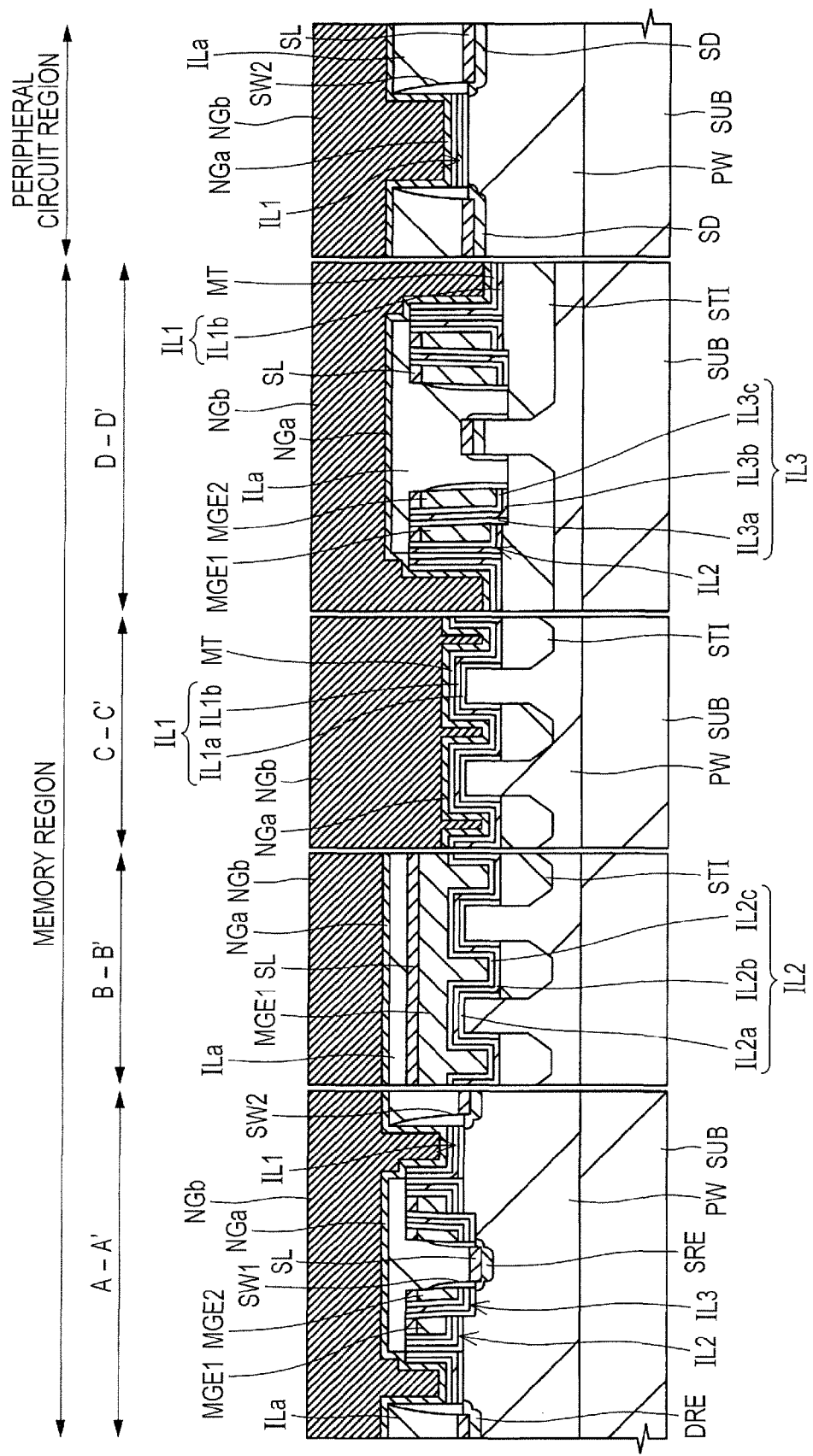
FIG. 64 is a main-portion cross-sectional view of the same portion as shown in FIG. 49 in the manufacturing process of the semiconductor device, which is subsequent to FIG. 63.

Then, as shown in FIG. 64, the silicon nitride film SN1 is removed by a wet etching. Subsequently, the dummy selection gate electrodes DCG in the memory region and the dummy gate electrode DNG in the peripheral circuit region are removed therefrom.

Subsequently, over the main surface of the semiconductor substrate SUB, the metal electrode film NGa and the aluminum film NGb are successively deposited. The metal electrode film NGa is a multi-layer film in which, e.g., tantalum nitride, titanium, and aluminum are successively formed in order of increasing distance from the main surface of the semiconductor substrate SUB. The metal electrode film NGa has a thickness of, e.g., about 20 nm. Here, the description has been given of the method of manufacturing the nMIS transistor as the semiconductor element formed in the peripheral circuit region. However, in the case of manufacturing a pMIS transistor, a multi-layer film is used in which, e.g., tantalum nitride, titanium nitride, and tantalum nitride are successively formed in order of increasing distance from the main surface of the semiconductor substrate SUB.

Figure 65:
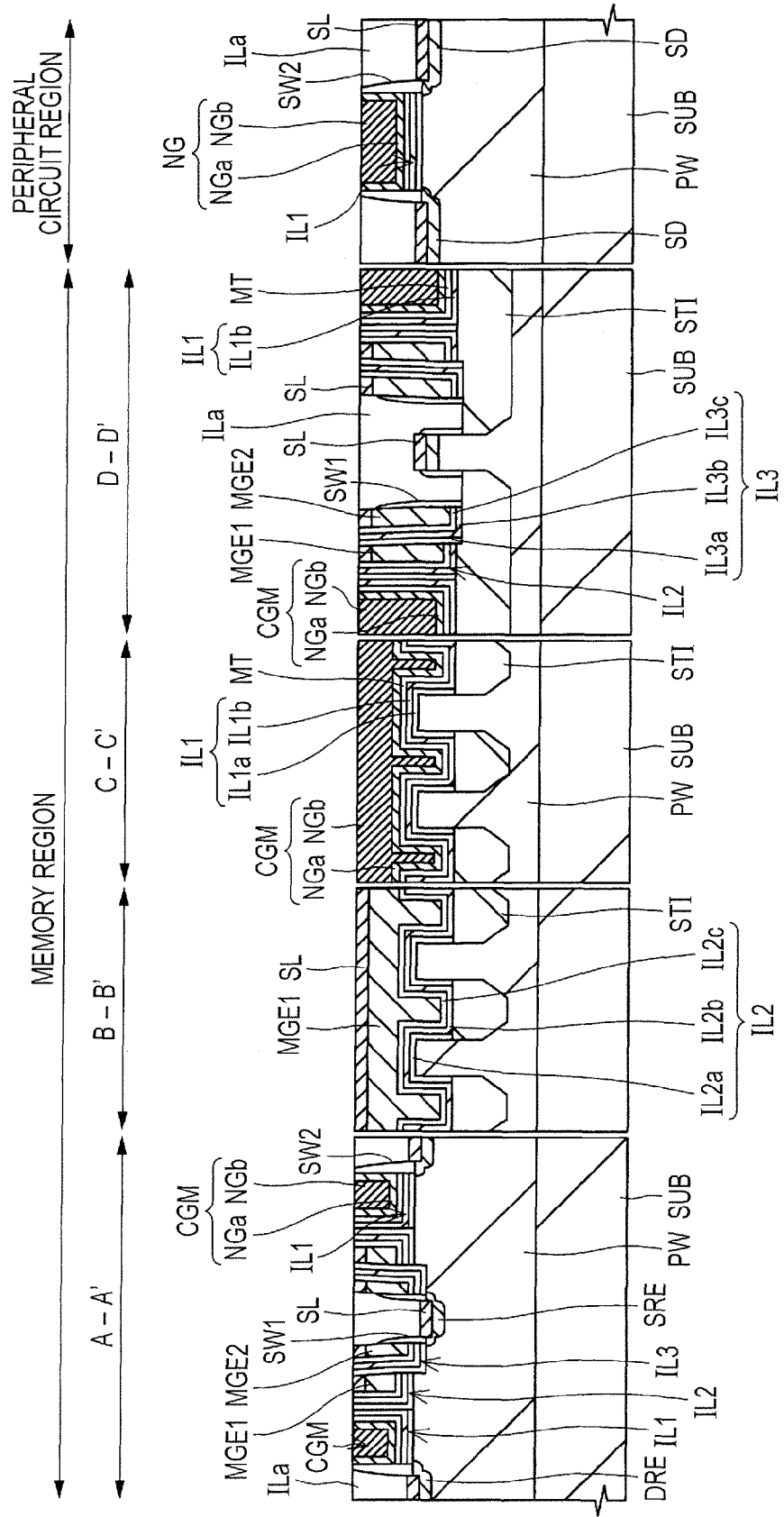
FIG. 65 is a main-portion cross-sectional view of the same portion as shown in FIG. 49 in the manufacturing process of the semiconductor device, which is subsequent to FIG. 64.

Next, as shown in FIG. 65, polishing which ends at the silicon dioxide film ILa is performed by, e.g., a CMP method to form the metal selection gates CGM each including the metal electrode film NGa and the aluminum film NGb in the memory region and form the gate electrode NG of the nMIS transistor including the metal electrode film NGa and the aluminum film NGb in the peripheral circuit region.

Between each of the metal selection gate electrodes CGM and the first memory gate electrode MGE1, the second insulating film IL2, the high-dielectric-constant film IL1b forming the first insulating film IL1 and the metal film MT are formed in order of increasing distance from the first memory gate electrode MGE1. On the other hand, between the semiconductor substrate SUB and the metal selection gate electrode CGM, the first insulating film IL1 and the metal film MT are formed in order of increasing distance from the semiconductor substrate SUB.

By the manufacturing steps that have been described heretofore, in the memory region, the selection gates CG in each of which the first gate insulating film GI1 made of the first insulating film IL1 and the metal selection gate electrode CGM are stacked are formed, as shown in, e.g., FIG. 45 described above.

Thus, in the memory region, as shown in, e.g., FIG. 45 described above, the memory cell MC5 including the memory gates MG, the selection gates CG, the source SR, and the drains DR is generally completed.

On the other hand, in the peripheral circuit region, the nMIS transistor including the gate in which the first insulating film IL1, the metal film MT, and the gate electrode NG are stacked, and the source/drain in which the source/drain regions SD and the silicide films SL are stacked is generally completed.

Figure 66:
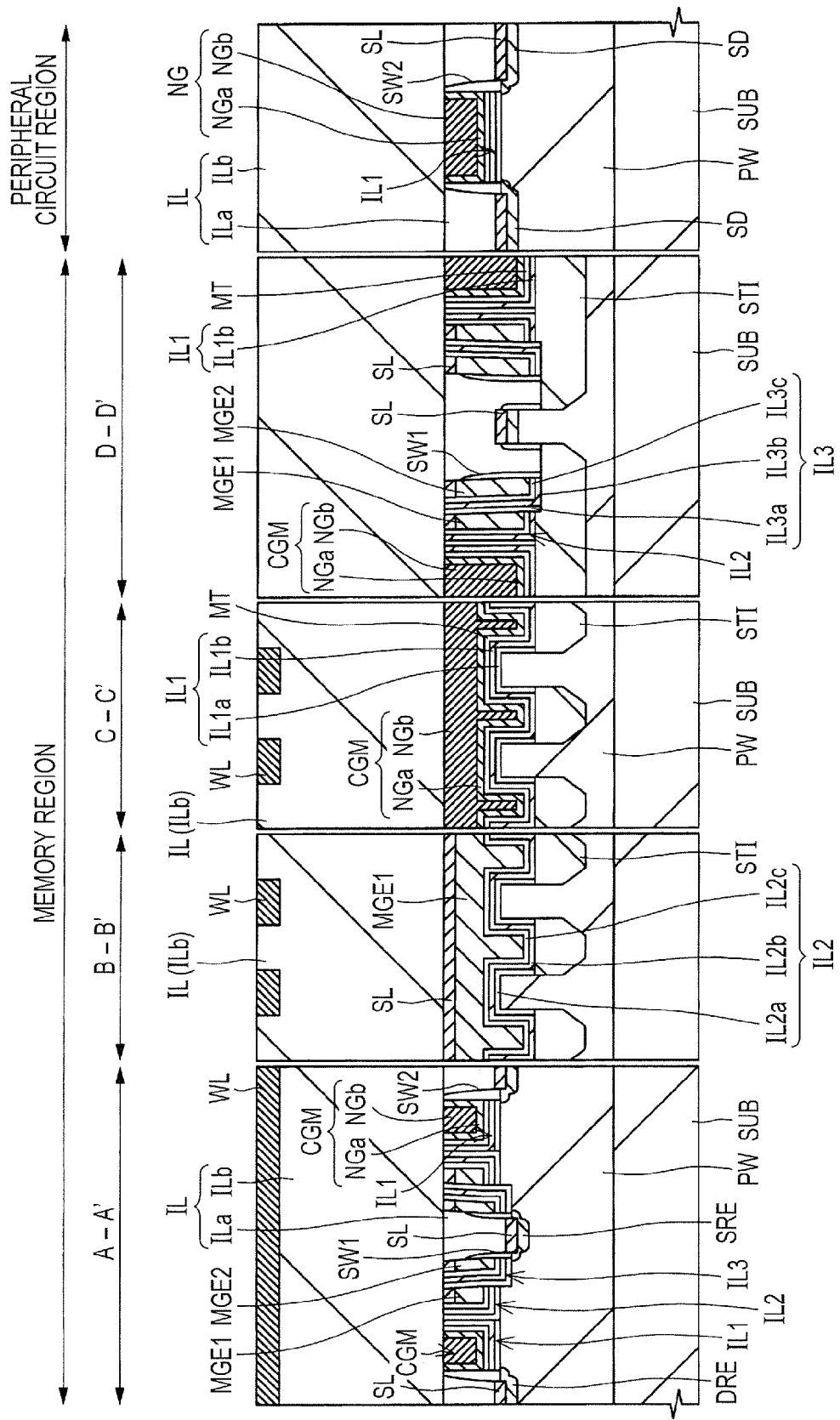
FIG. 66 is a main-portion cross-sectional view of the same portion as shown in FIG. 49 in the manufacturing process of the semiconductor device, which is subsequent to FIG. 65.

Next, as shown in FIG. 66, over the main surface of the semiconductor substrate SUB, the silicon dioxide film ILb is deposited by a CVD method to form the interlayer insulating film IL including the silicon dioxide films ILa and ILb.

Subsequently, in the memory region, contact holes (not shown (the contact holes CL shown in FIG. 2 described above)) reaching the silicide films SL over the drain regions DRE are formed in the interlayer insulating film IL. At the same time, in the peripheral circuit region, a contact hole (not shown) reaching the gate electrode NGE of the nMIS transistor and contact holes (not shown) reaching the silicide films SL over the source/drain regions SD are formed in the interlayer insulating film IL.

Subsequently, in the foregoing contact holes, plugs (not shown) are formed. Each of the plugs is formed of a multi-layer film including, e.g., a relatively thin barrier film made of a multi-layer film of titanium and titanium nitride, and a relatively thick conductive film made of tungsten, aluminum, or the like and formed so as to be covered with the barrier film.

Subsequently, the first-layer wires WL electrically coupled to the plugs are formed. Thereafter, by further forming upper-layer wires, the semiconductor device is manufactured.

<Effect of Embodiment 5>

In the same manner as in Embodiment 4 described above, during an erase operation, an electric field can be concentrated on the corner portion (portion B in FIG. 8A) of the second memory gate electrode MGE2. Accordingly, in the memory cell MC5 according to Embodiment 5, the efficiency of hole injection into the third insulating film IL3 is higher than in the memory cell MC1 according to Embodiment 1 described above. This allows data to be efficiently erased. In addition, since each of the selection gates CG has the metal selection gate electrode CGM, an effect is provided such that, even when the line width (width in the gate length direction) of the selection gate CG is reduced, the selection gate CG has a low resistance.

Embodiment 6

Configuration of Semiconductor Device

Figure 67:
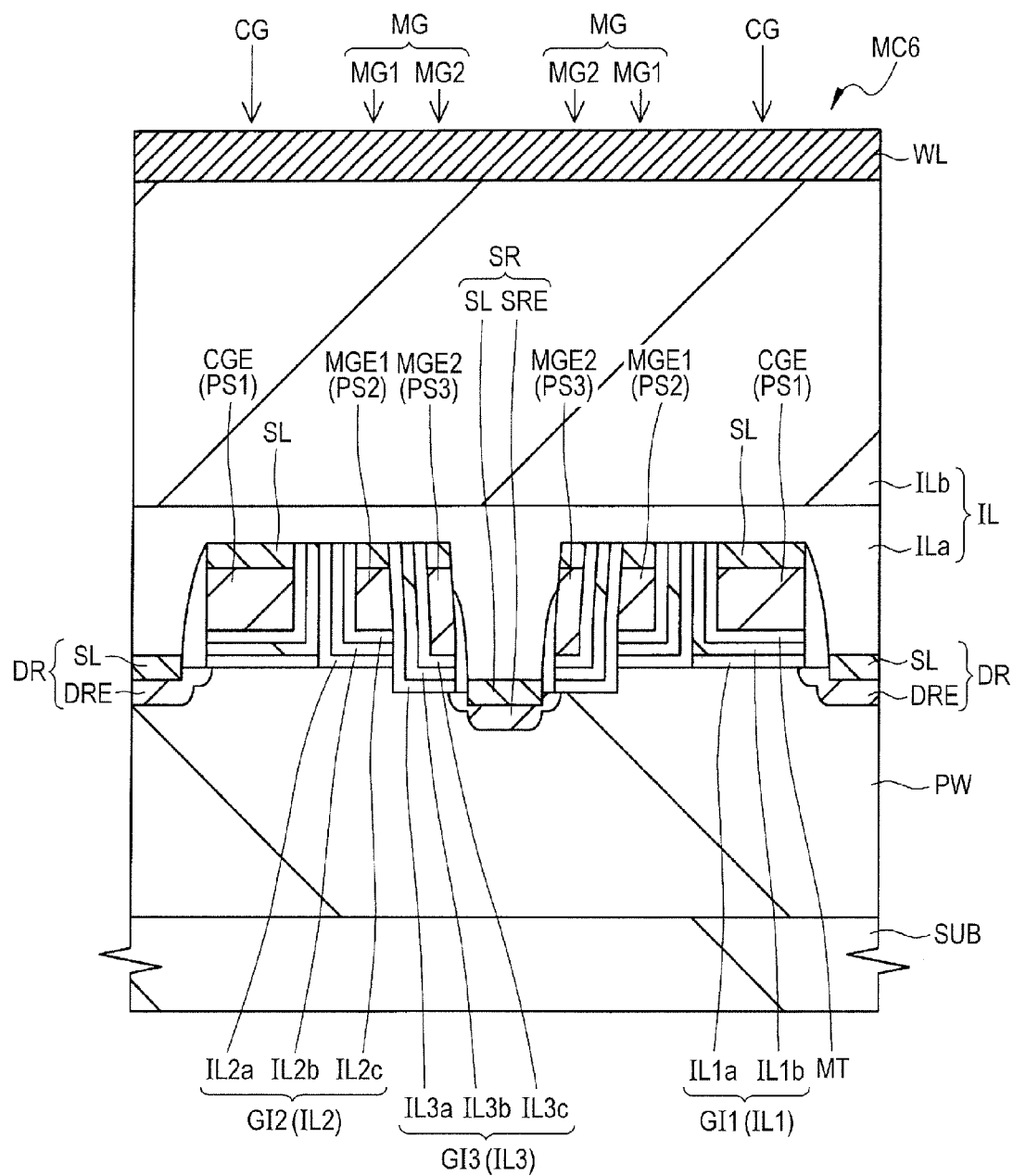
FIG. 67 is a main-portion cross-sectional view (main-portion cross-sectional view along the line A-A' shown in FIG. 2) of a MONOS-type nonvolatile memory cell according to Embodiment 6.
Figure 68:
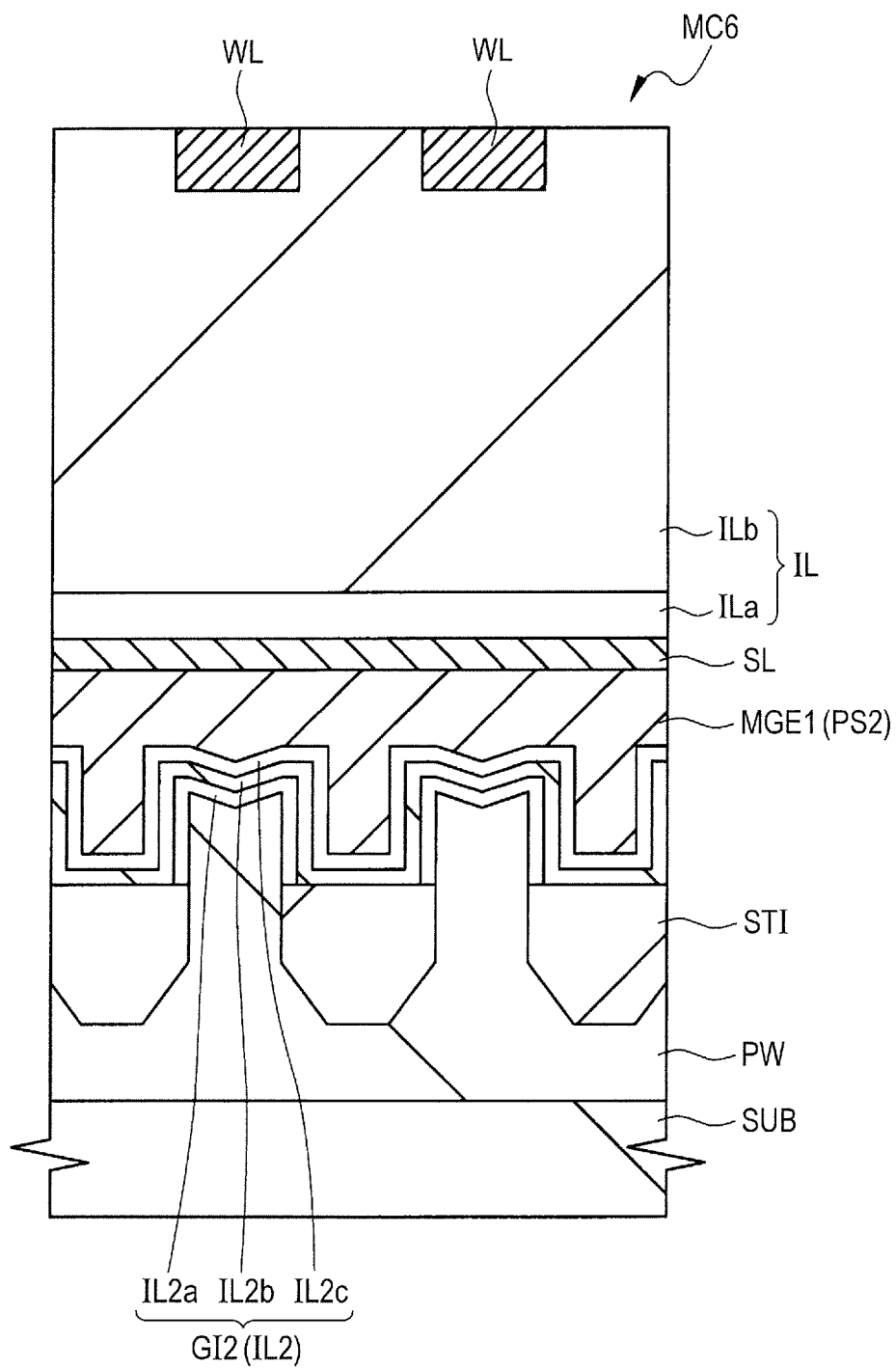
FIG. 68 is a main-portion cross-sectional view (main-portion cross-sectional view along the line B-B' shown in FIG. 2) of the MONOS-type nonvolatile memory cell according to Embodiment 6.
Figure 69:
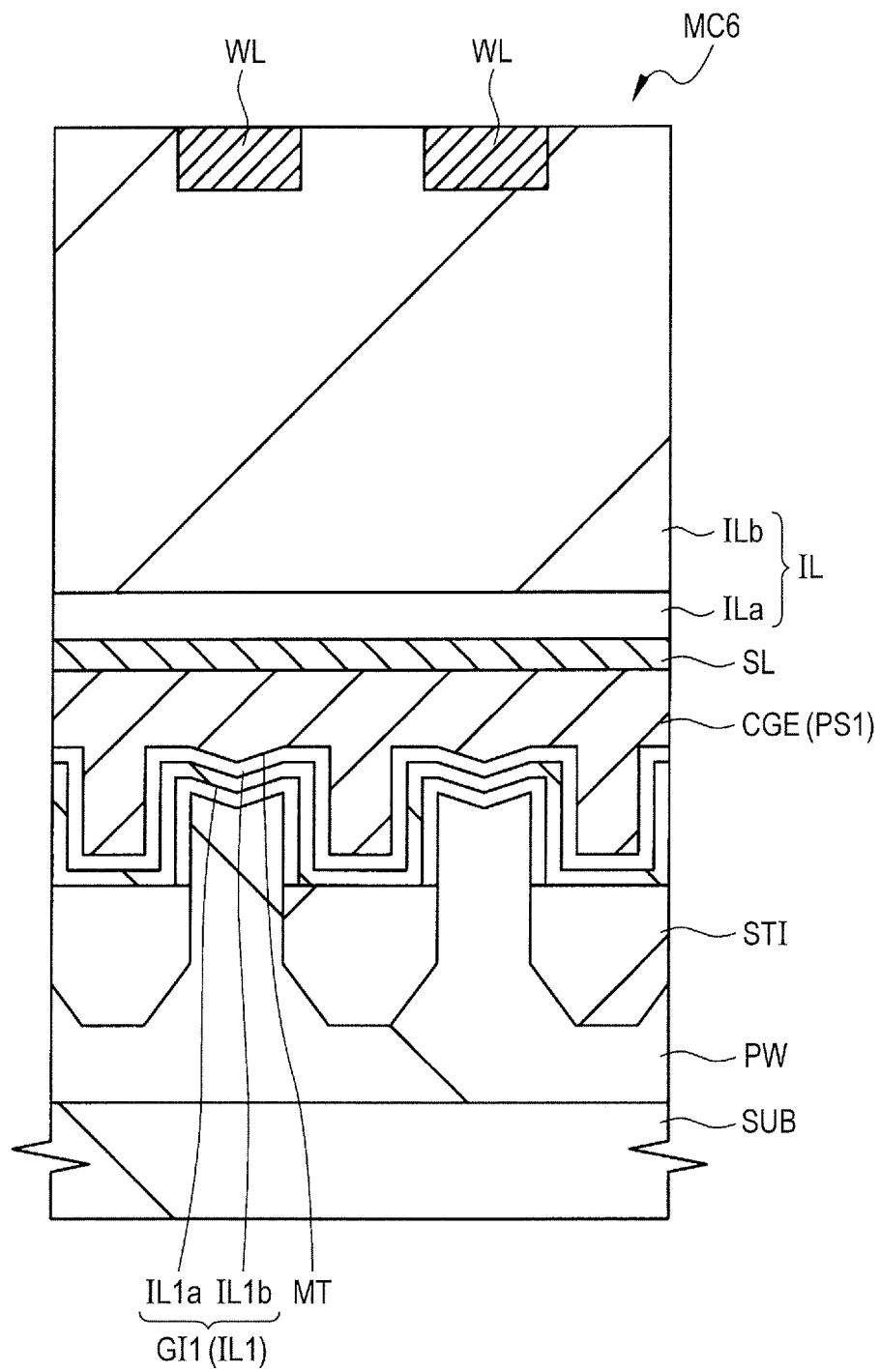
FIG. 69 is a main-portion cross-sectional view (main-portion cross-sectional view along the line C-C' shown in FIG. 2) of the MONOS-type nonvolatile memory cell according to Embodiment 6.
Figure 70:
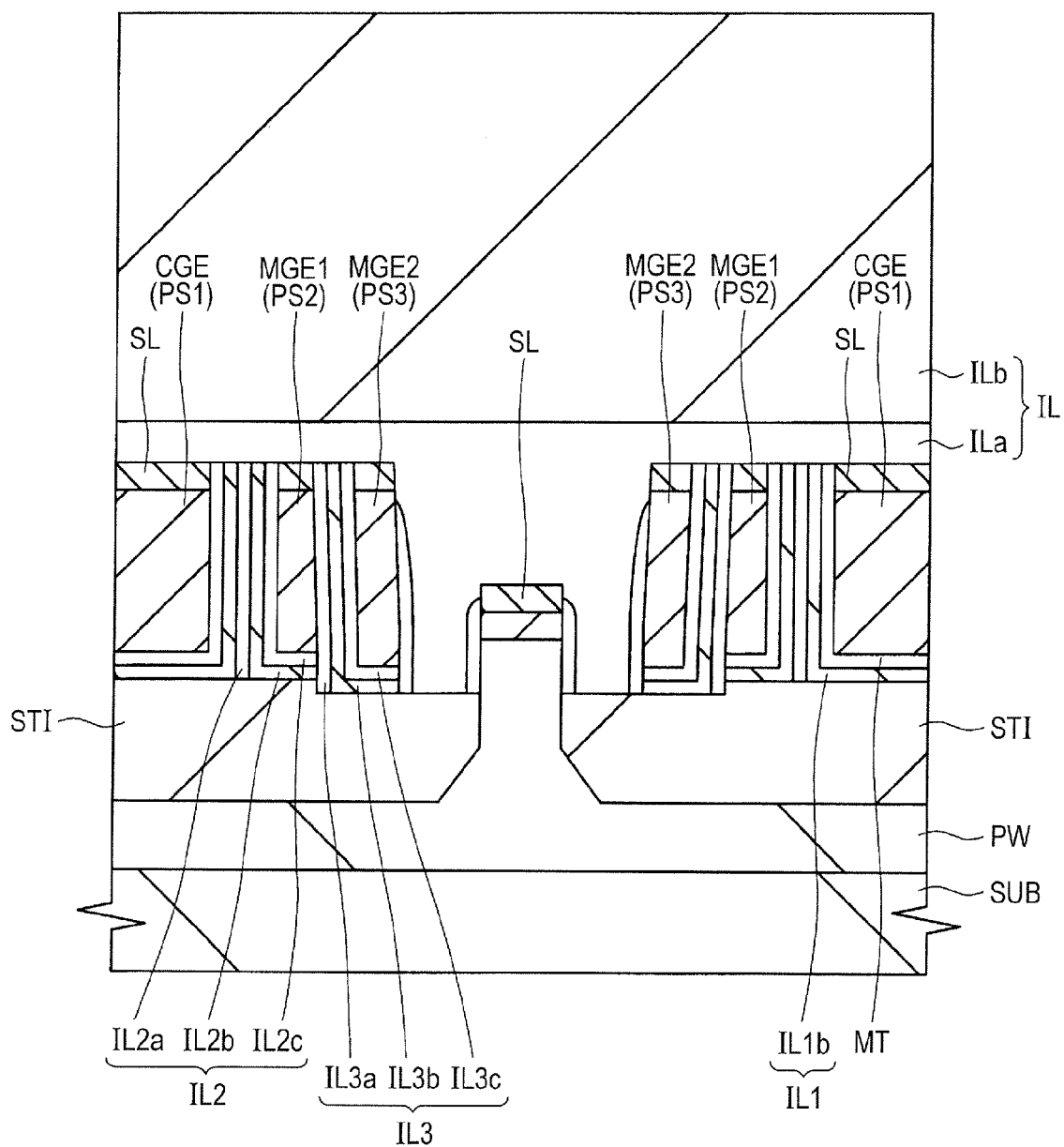
FIG. 70 is a main-portion cross-sectional view (main-portion cross-sectional view along the line D-D' shown in FIG. 2) of the MONOS-type nonvolatile memory cell according to Embodiment 6.

A configuration of a memory cell according to Embodiment 6 will be described using FIGS. 67 to 70. FIG. 67 is a main-portion cross-sectional view along the line A-A' shown in FIG. 2. FIG. 68 is a main-portion cross-sectional view along the line B-B' shown in FIG. 2. FIG. 69 is a main-portion cross-sectional view along the line C-C' shown in FIG. 2. FIG. 70 is a main-portion cross-sectional view along the line D-D' shown in FIG. 2.

A memory cell MC6 according to Embodiment 6 is different from the memory cell MC1 according to Embodiment 1 described above in the structure of each of the MIS transistors and in a recessed portion formed in the upper surface of the semiconductor substrate SUB in each of active regions extending along the gate length direction in the memory region.

That is, the memory cell MC1 according to Embodiment 1 described above has a planar-type transistor structure in which, in the memory region, the semiconductor substrate SUB in each of the active regions has a flat upper surface. By contrast, the memory cell MC6 according to Embodiment 6 has a Fin-type transistor structure in which the main surface of the semiconductor substrate SUB in each of the active regions is at a height position higher than that of the upper surface of each of the isolation portions STI. In addition, in the memory region, in a cross section along the gate width direction, the semiconductor substrate SUB in each of the active regions interposed between the isolation portions STI has an upper surface which is lower in level at the middle portion thereof than at the both end portions thereof.

The configuration of the semiconductor device according to Embodiment 6 is otherwise the same or substantially the same as that of the semiconductor device according to Embodiment 1 described above so that a description thereof is omitted.

<Operation of Memory Cell>

The operation of the memory cell MC6 is the same or substantially the same as the operation of the memory cell MC1 according to Embodiment 1 described above so that a description thereof is omitted.

<Method of Manufacturing Semiconductor Device>

Figure 71:
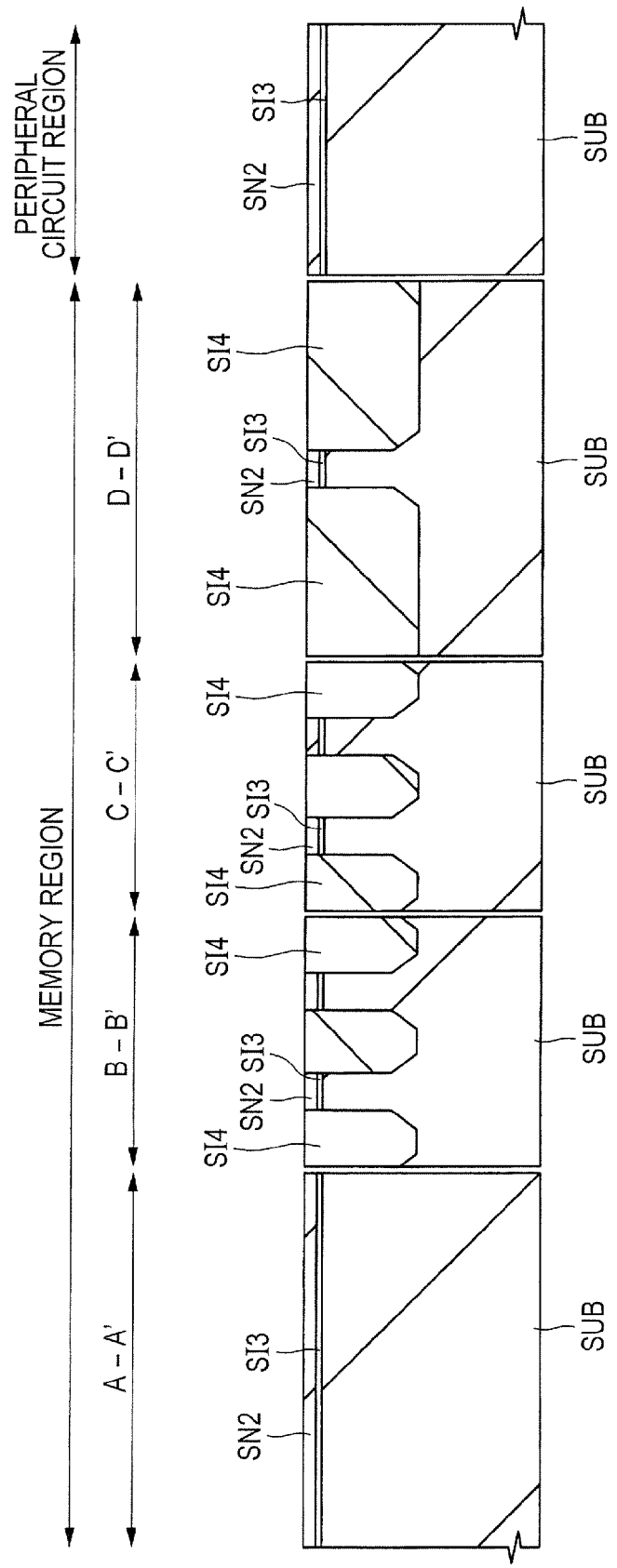
FIG. 71 is a main-portion cross-sectional view of each of the MONOS-type nonvolatile memory cells formed in a memory region and each of the n-channel MISFETs formed in a peripheral circuit region, which shows a manufacturing process of a semiconductor device according to Embodiment 6.
Figure 72:
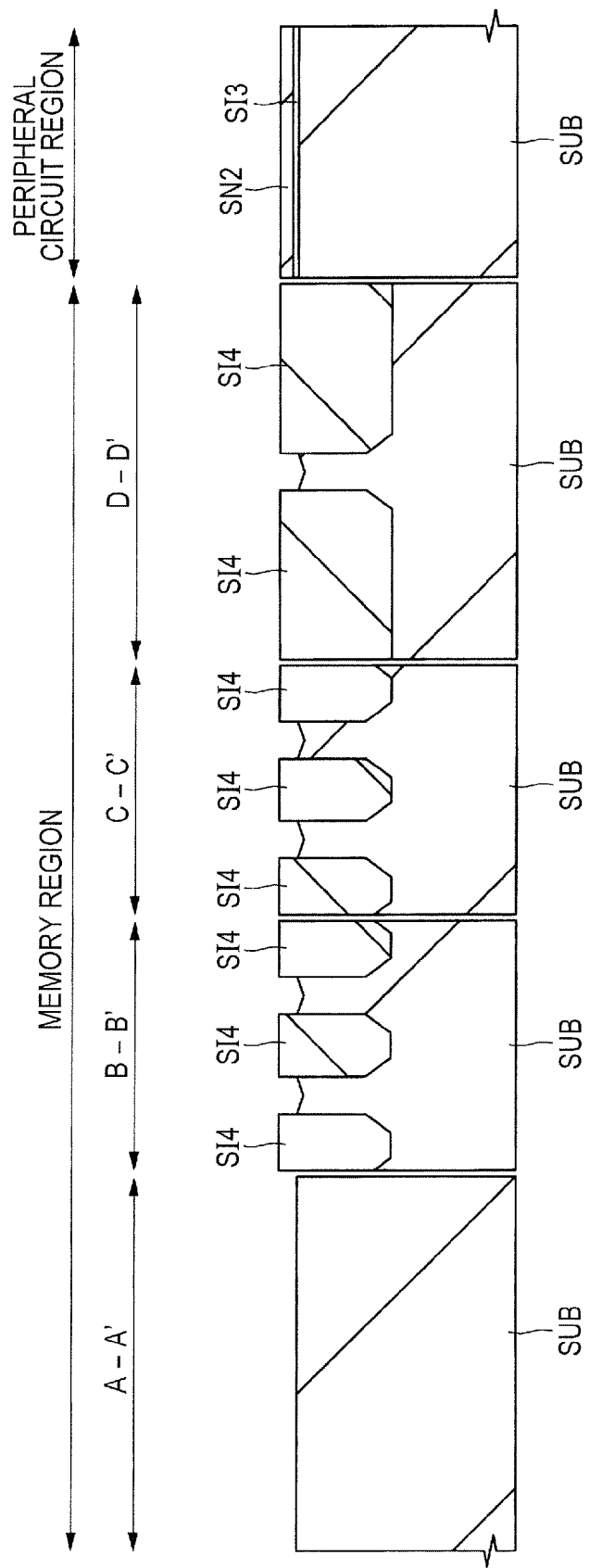
FIG. 72 is a main-portion cross-sectional view of the same portion as shown in FIG. 71 in the manufacturing process of the semiconductor device, which is subsequent to FIG. 71.
Figure 73:
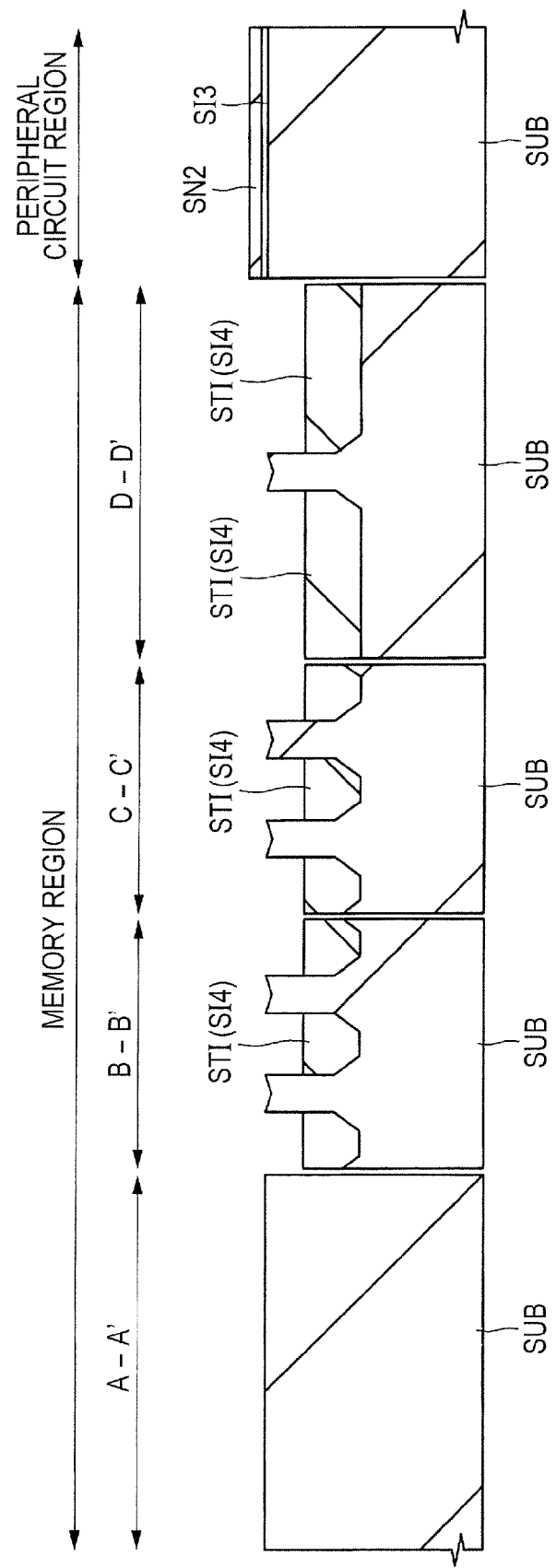
FIG. 73 is a main-portion cross-sectional view of the same portion as shown in FIG. 71 in the manufacturing process of the semiconductor device, which is subsequent to FIG. 72.

A method of manufacturing the semiconductor device according to Embodiment 6 will be described using FIGS. 71 to 73 in order of process steps. Here, by way of example, a method of producing the active region of the memory region where each of the memory cells is formed and the active region of the peripheral circuit region where each of the nMIS transistors is formed will be described. FIGS. 71 to 73 are main-portion cross-sectional views of the memory cells formed in the memory region and the nMIS transistor formed in the peripheral circuit region during a manufacturing process of a semiconductor device.

As shown in FIG. 71, the silicon dioxide film SI3 is formed over the main surface of the semiconductor substrate SUB by a thermal oxidation method. Then, over the silicon dioxide film SI3, the silicon nitride film SN2 is deposited. The silicon dioxide film SI3 has a thickness of, e.g., about 10 nm. The silicon nitride film SN2 has a thickness of, e.g., about 50 nm. Subsequently, by a lithographic method and a dry etching method, isolation trenches are formed in the predetermined portions of the semiconductor substrate SUB. Then, over the main surface of the semiconductor substrate SUB, an insulating film SI4 made of, e.g., silicon dioxide is deposited. Subsequently, polishing which ends at the silicon nitride film SN2 is performed on the insulating film SI4 by, e.g., a CMP method such that the upper surface of the insulating film SI4 is at the same height position as that of the upper surface of the silicon nitride film SN2.

Next, as shown in FIG. 72, by a dry etching method, the silicon nitride film SN2 and the silicon dioxide film SI3 are removed from the memory region. At this time, in the memory region, the upper surface of the semiconductor substrate SUB in each of the active regions is etched to be processed such that, in a cross section along the gate width direction, the middle portion of the upper surface of the semiconductor substrate SUB in the active region interposed between the isolation portions STI is lower in level than the both end portions thereof.

Next, as shown in FIG. 73, the insulating film SI4 is etched by a dry etching method until the upper surface of the insulating film SI4 reaches a height position lower than that of the main surface of the semiconductor substrate SUB. Thus, the isolation portions STI in each of which the insulating film SI4 is embedded in the isolation trench are formed. Thereafter, the silicon nitride film SN2 in the peripheral circuit region is removed therefrom.

<Effect of Embodiment 6>

In the same manner as in Embodiment 4 described above, during an erase operation, an electric field can be concentrated on the corner portion (portion B in FIG. 8A) of the second memory gate electrode MGE2. In addition, in the memory region, the upper surface of the semiconductor substrate SUB in each of the active regions extending along the gate length direction is formed with the recessed portion such that the upper surface of the semiconductor substrate SUB in the active region interposed between the isolation portions STI is lower in level at the middle portion thereof than at the both end portions thereof. As a result, during the erase operation, an electric field can also be concentrated on the recessed portion. Accordingly, in the memory cell MC6 according to Embodiment 6, the efficiency of hole injection into the third insulating film IL3 is higher than in the memory cell MC1 according to Embodiment 1 described above. This allows data to be efficiently erased.

Embodiment 7

Configuration of Semiconductor Device

Figure 74:
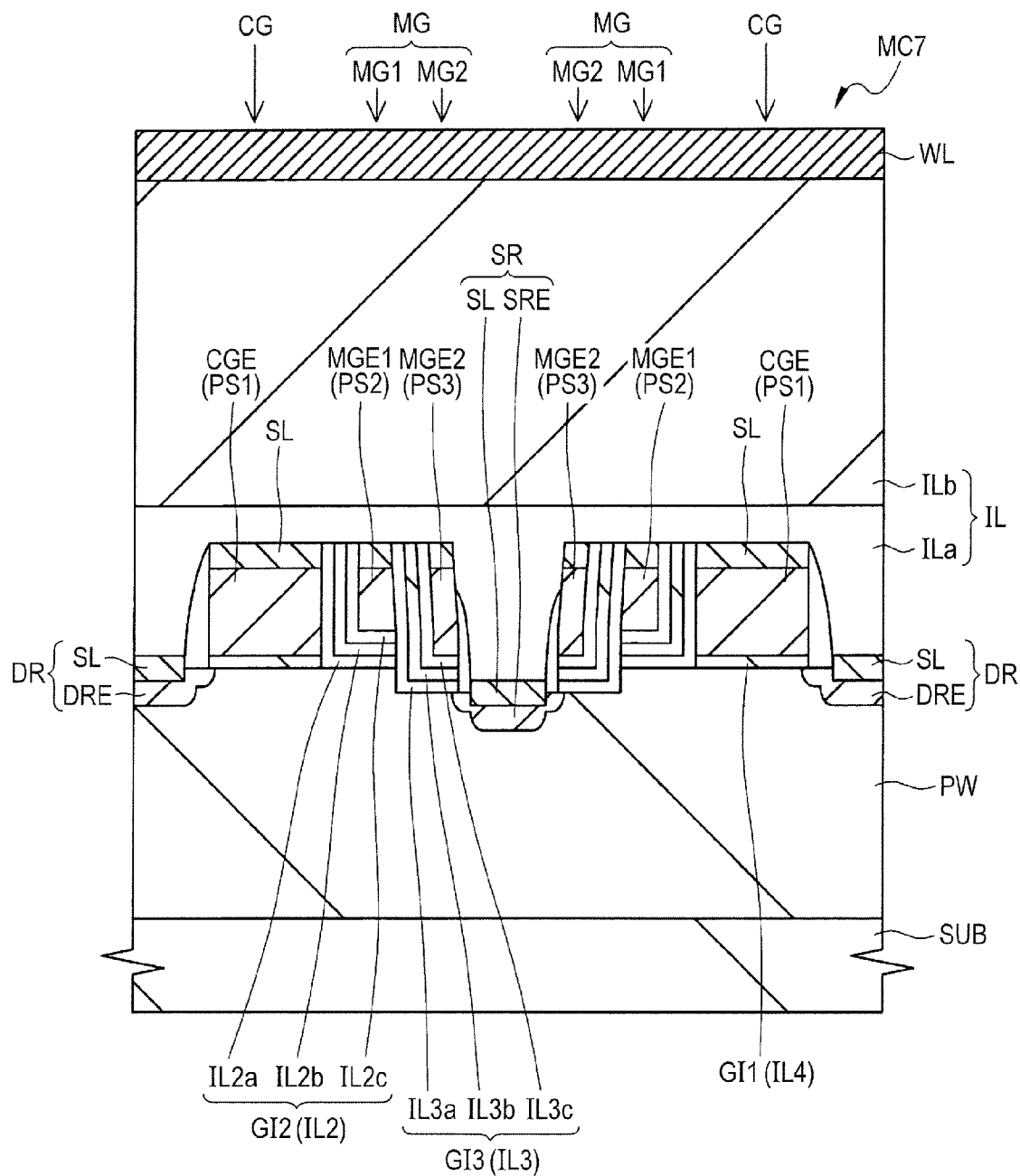
FIG. 74 is a main-portion cross-sectional view (main-portion cross-sectional view along the line A-A' shown in FIG. 2) of a MONOS-type nonvolatile memory cell according to Embodiment 7.
Figure 75:
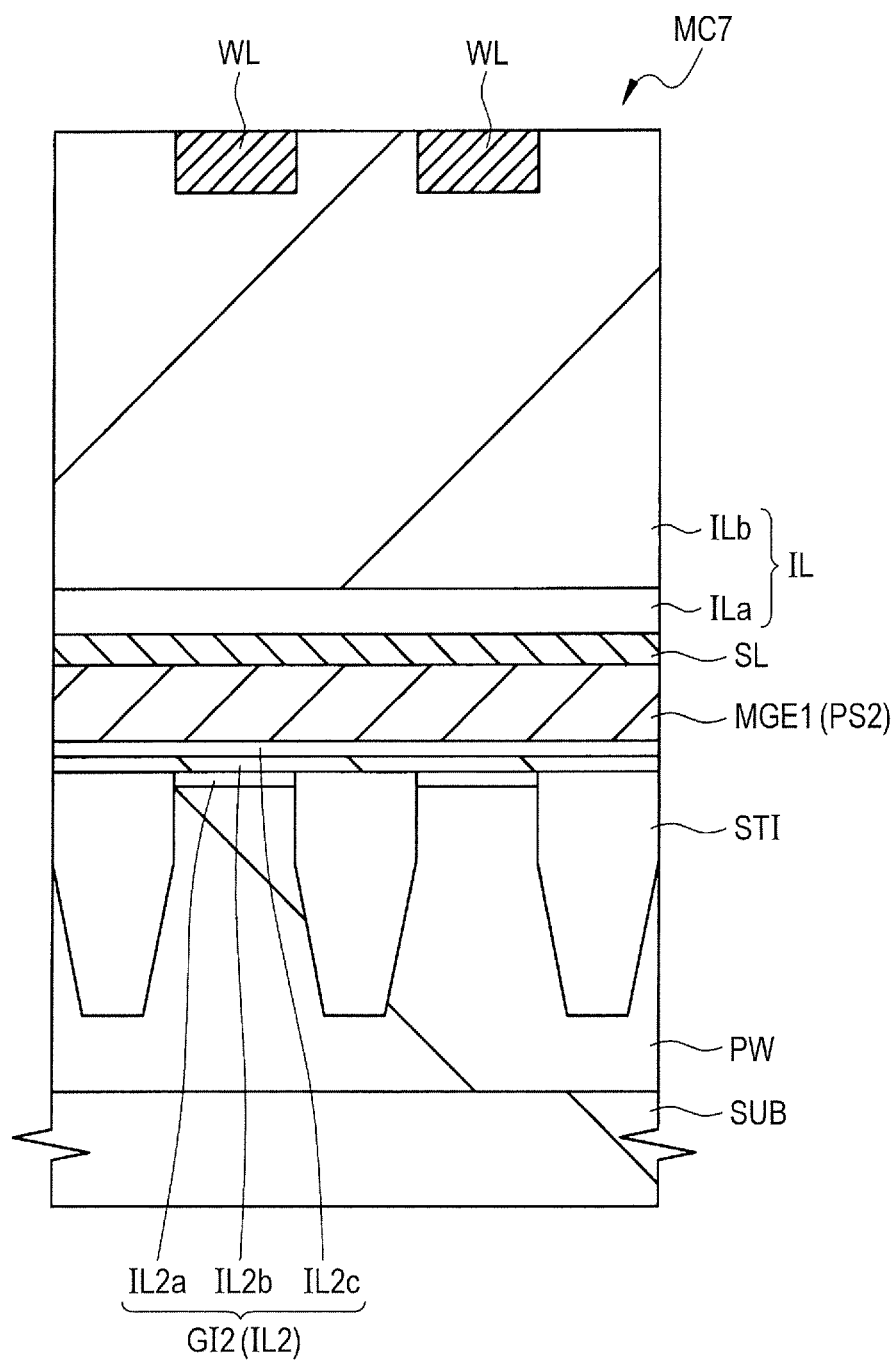
FIG. 75 is a main-portion cross-sectional view (main-portion cross-sectional view along the line B-B' shown in FIG. 2) of the MONOS-type nonvolatile memory cell according to Embodiment 7.
Figure 76:
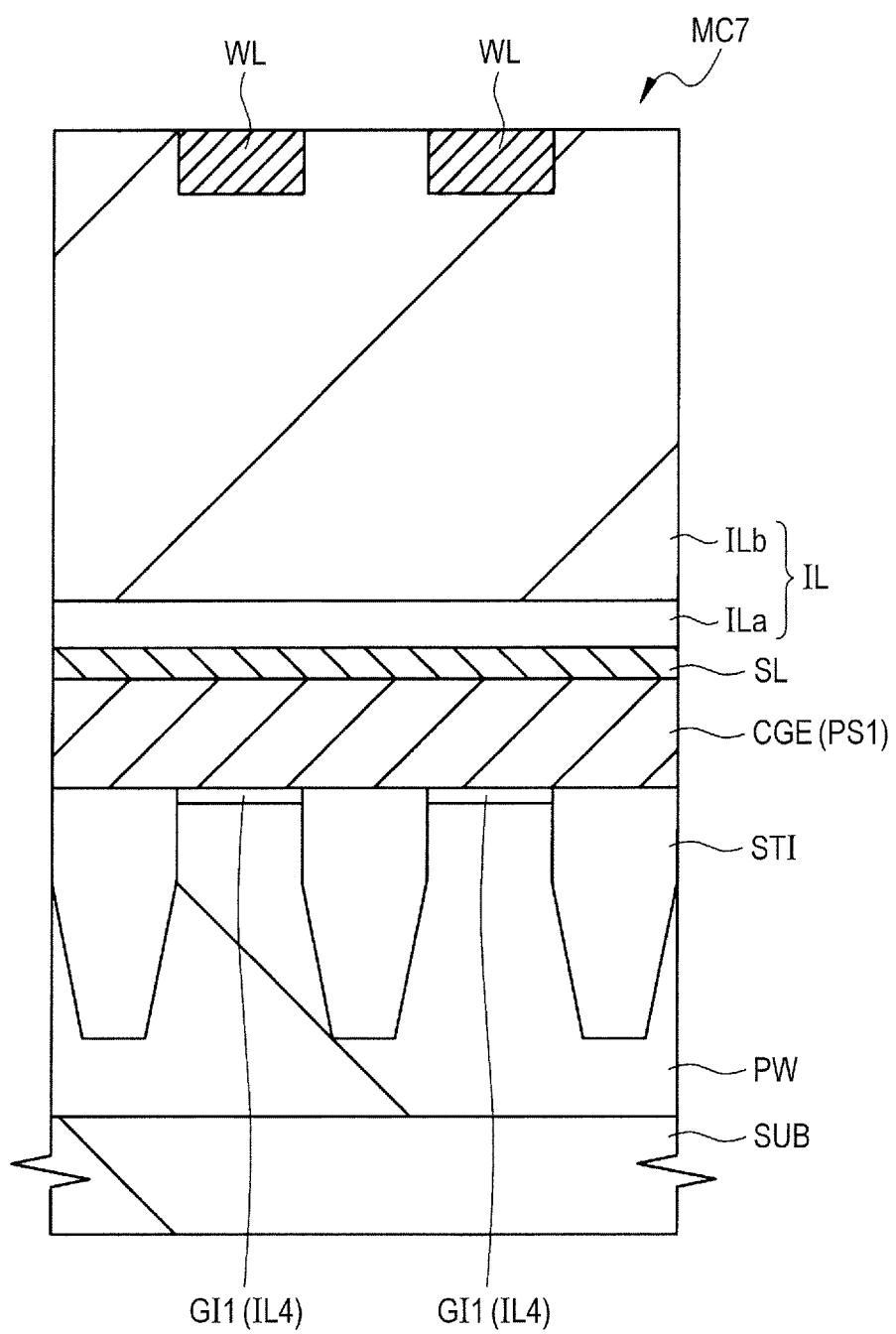
FIG. 76 is a main-portion cross-sectional view (main-portion cross-sectional view along the line C-C' shown in FIG. 2) of the MONOS-type nonvolatile memory cell according to Embodiment 7.
Figure 77:
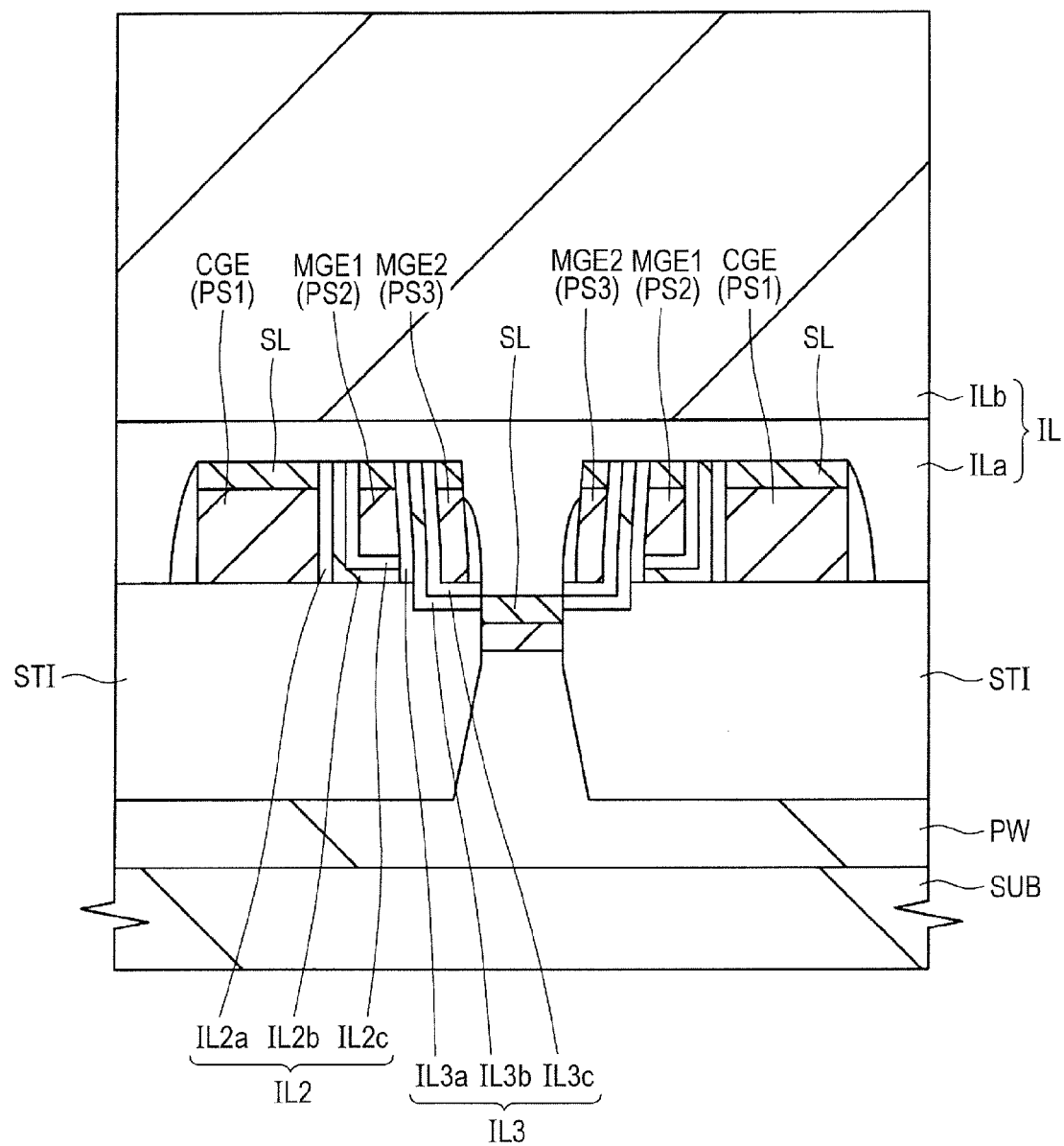
FIG. 77 is a main-portion cross-sectional view (main-portion cross-sectional view along the line D-D' shown in FIG. 2) of the MONOS-type nonvolatile memory cell according to Embodiment 7.

A configuration of a memory cell according to Embodiment 7 will be described using FIGS. 74 to 77. FIG. 74 is a main-portion cross-sectional view along the line A-A' shown in FIG. 2. FIG. 75 is a main-portion cross-sectional view along the line B-B' shown in FIG. 2. FIG. 76 is a main-portion cross-sectional view along the line C-C' shown in FIG. 2. FIG. 77 is a main-portion cross-sectional view along the line D-D' shown in FIG. 2.

A memory cell MC7 according to Embodiment 7 is different from the memory cell MC1 according to Embodiment 1 described above in the structure of the first gate insulating film GI1 of the selection gate CG.

That is, in the memory cell MC1 according to Embodiment 1 described above, the first gate insulating film GI1 of each of the selection gates CG is made of the first insulating film IL1 in which, over the main surface of the semiconductor substrate SUB, the insulating film IL1a and the high-dielectric-constant film IL1b are successively stacked. Also, between the selection gate electrode CGE and the first memory gate electrode MGE1, the high-dielectric-constant film IL1b forming the first insulating film ILL the metal film MT, and the second insulating film IL2 are formed. By contrast, in the memory cell MC7 according to Embodiment 7, the gate insulating film GI1 of each of the selection gates CG is made of a fourth insulating film IL4 formed only of single-layer silicon dioxide or silicon oxynitride. Also, between the selection gate CGE and the first memory gate electrode MGE1, only the second insulating film IL2 is formed.

The configuration of the semiconductor device according to Embodiment 7 is otherwise the same or substantially the same as that of the semiconductor device according to Embodiment 1 described above so that a description thereof is omitted.

<Operation of Memory Cell>

The operation of the memory cell MC7 is the same or substantially the same as the operation of the memory cell MC1 according to Embodiment 1 described above so that a description thereof is omitted.

<Method of Manufacturing Semiconductor Device>

In Embodiment 7, the selection gates CG are formed first, and then the memory gates MG are formed. For example, after the manufacturing steps described above using FIG. 12 in Embodiment 1, over the main surface of the semiconductor substrate SUB, the fourth insulating film IL4 and the polycrystalline silicon film PS1 are formed. Subsequently, the polycrystalline silicon film PS1 and the fourth insulating film IL4 are processed to form the selection gate electrodes CGE each made of the polycrystalline silicon film PS1 and the first gate insulating film GI1 made of the fourth insulating film IL4. Then, following the manufacturing steps described above using FIGS. 15 to 18 in Embodiment 1, over one side surface of each of the selection gate electrodes CGE and one side surface of each of the first gate insulating films GI1, the first and second memory gates MG1 and MG2 are formed.

<Effect of Embodiment 7>

In addition to the same effect as obtained in Embodiment 1 described above, the following effect can be obtained. That is, by using, not the multi-layer film (first insulating film IL1) used in the memory cell MC1 according to Embodiment 1 described above, but a single-layer silicon dioxide film, a single-layer silicon nitride film, or the like as the first gate insulating film GI of each of the selection gates CG, the number of manufacturing steps of the semiconductor device can be reduced.

Embodiment 8

Configuration of Semiconductor Device

Figure 78:
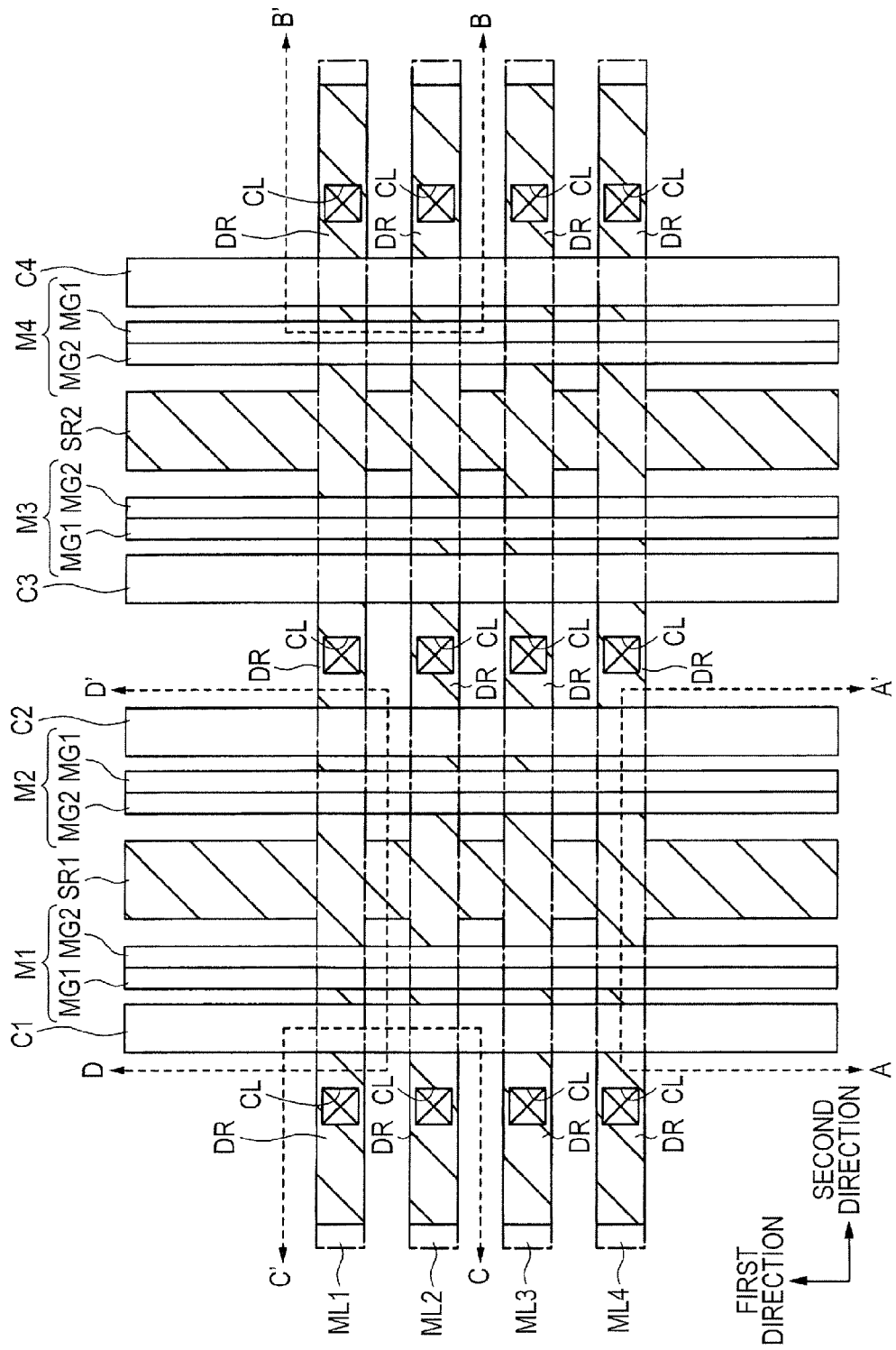
FIG. 78 is a main-portion plan view of a MONOS nonvolatile memory according to Embodiment 8.
Figure 79:
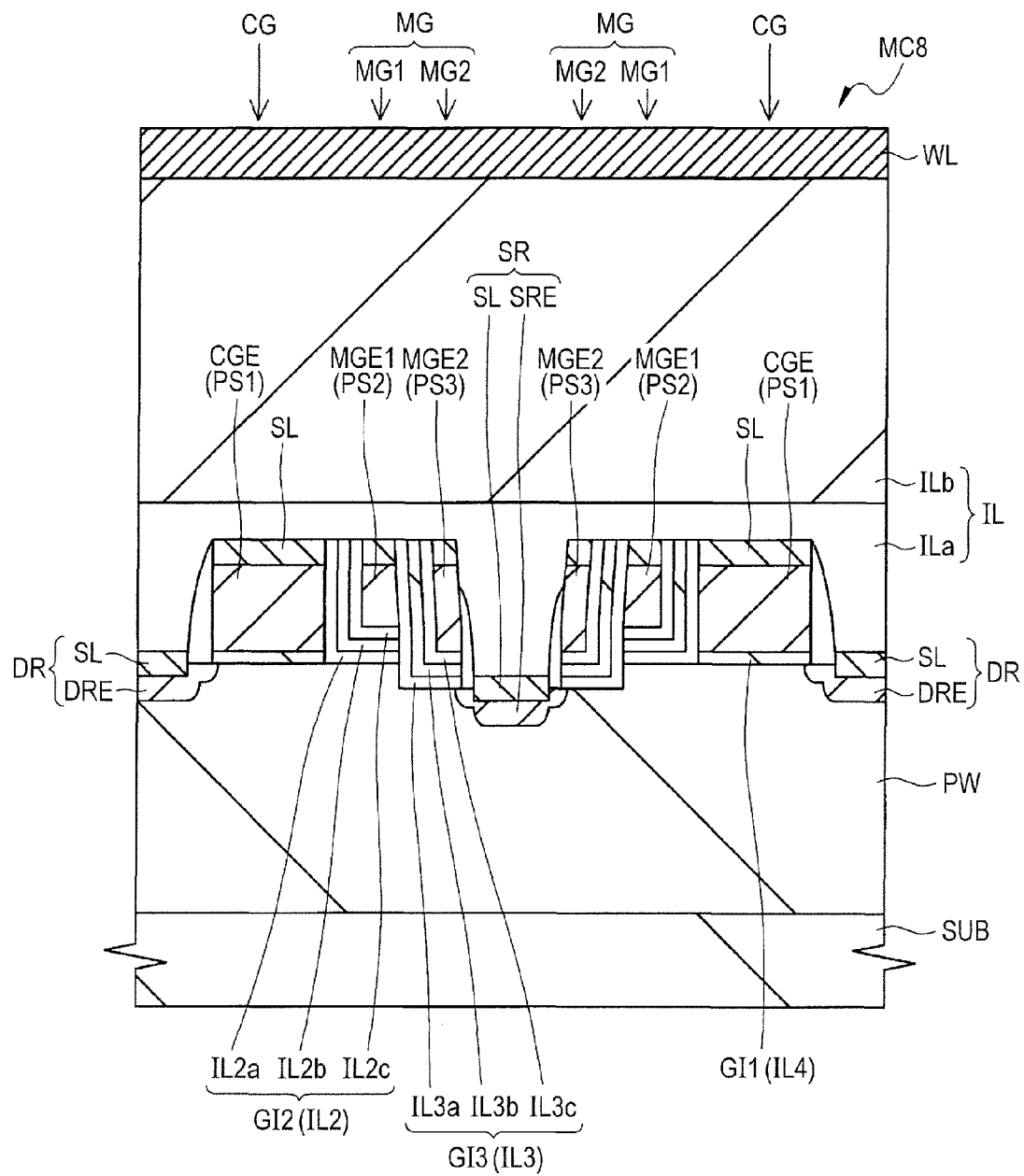
FIG. 79 is a main-portion cross-sectional view (main-portion cross-sectional view along the line A-A' shown in FIG. 78) of a MONOS-type nonvolatile memory cell according to Embodiment 8.
Figure 80:
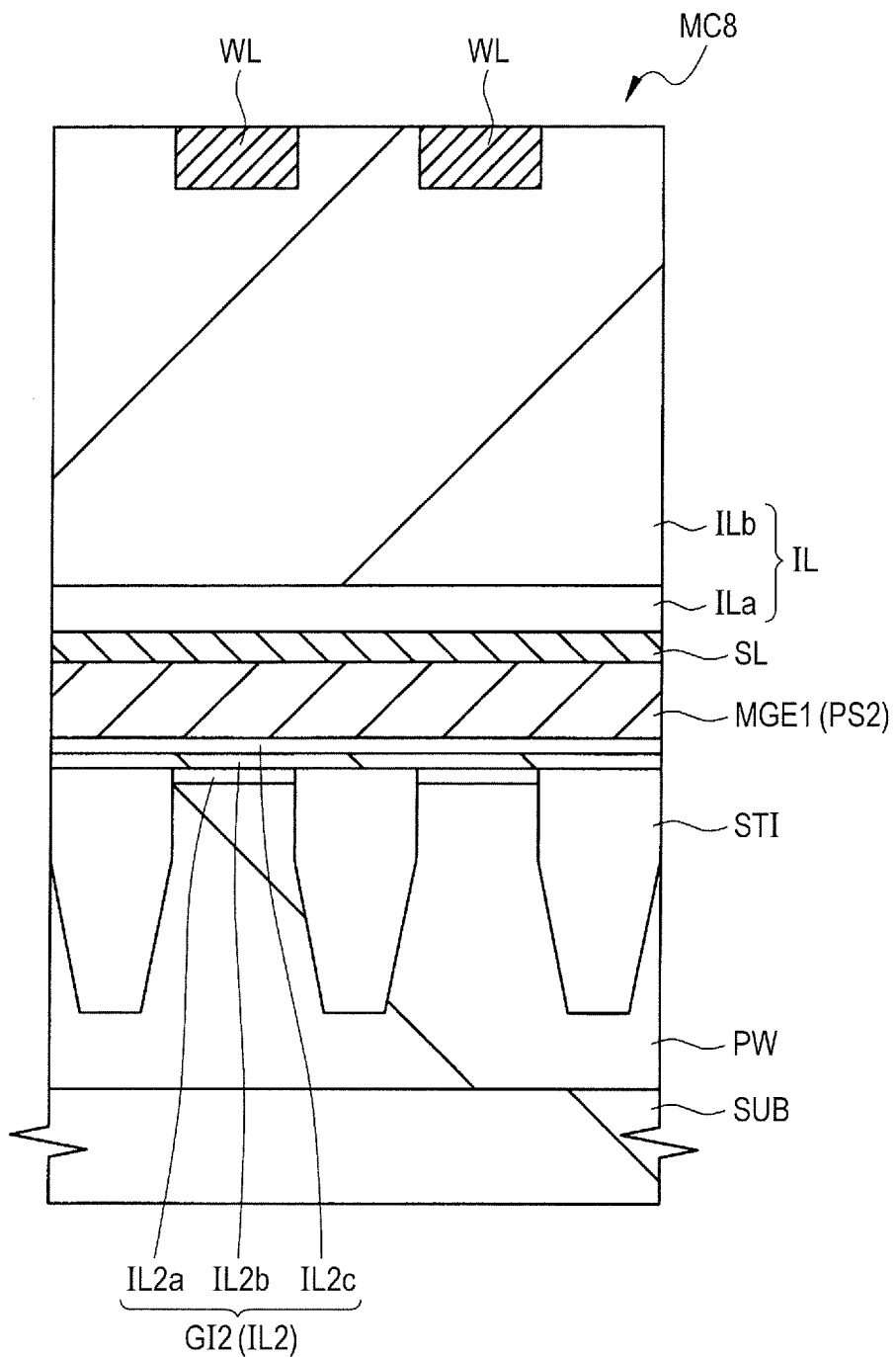
FIG. 80 is a main-portion cross-sectional view (main-portion cross-sectional view along the line B-B' shown in FIG. 78) of the MONOS-type nonvolatile memory cell according to Embodiment 8.
Figure 81:
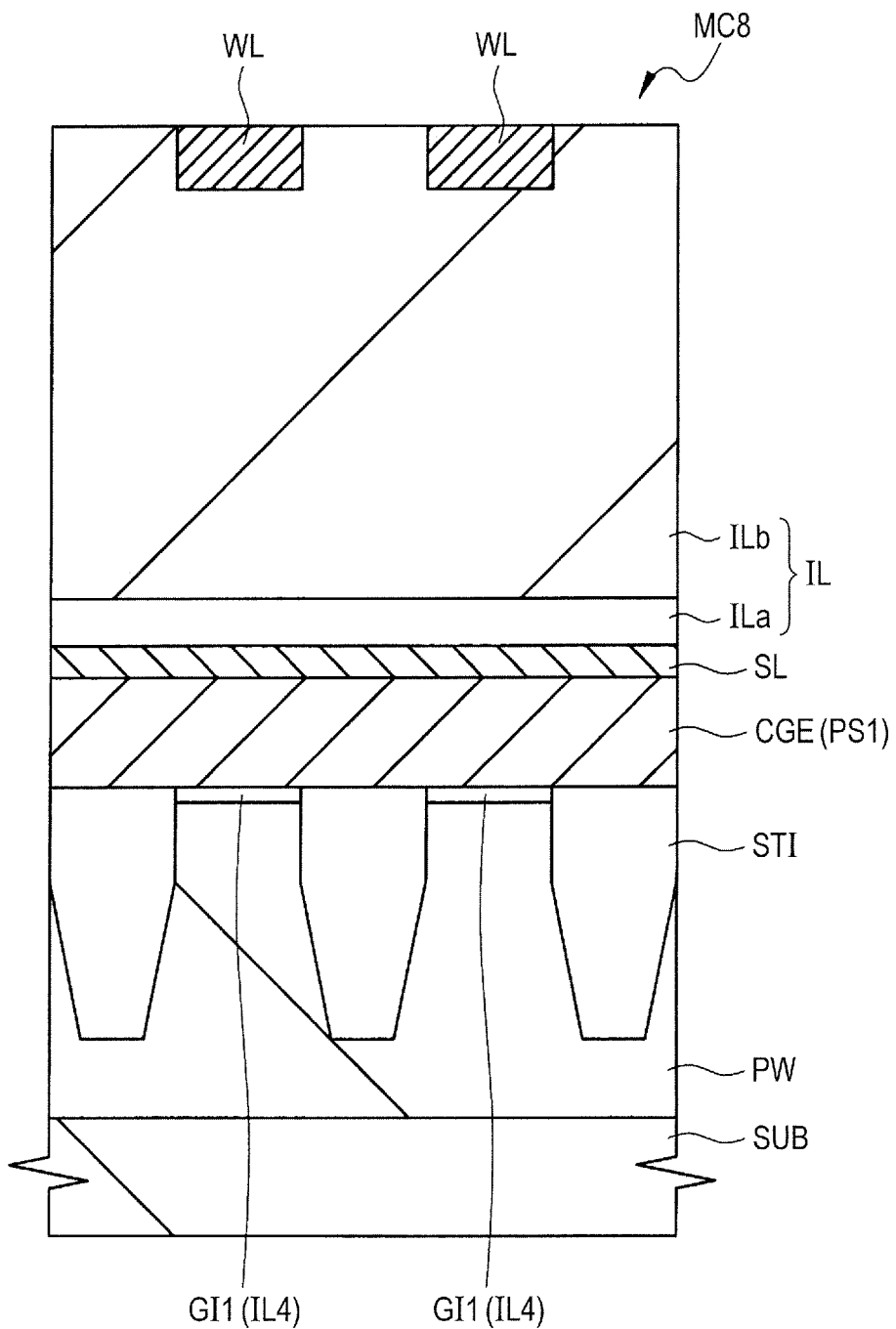
FIG. 81 is a main-portion cross-sectional view (main-portion cross-sectional view along the line C-C' shown in FIG. 78) of the MONOS-type nonvolatile memory cell according to Embodiment 8.
Figure 82:
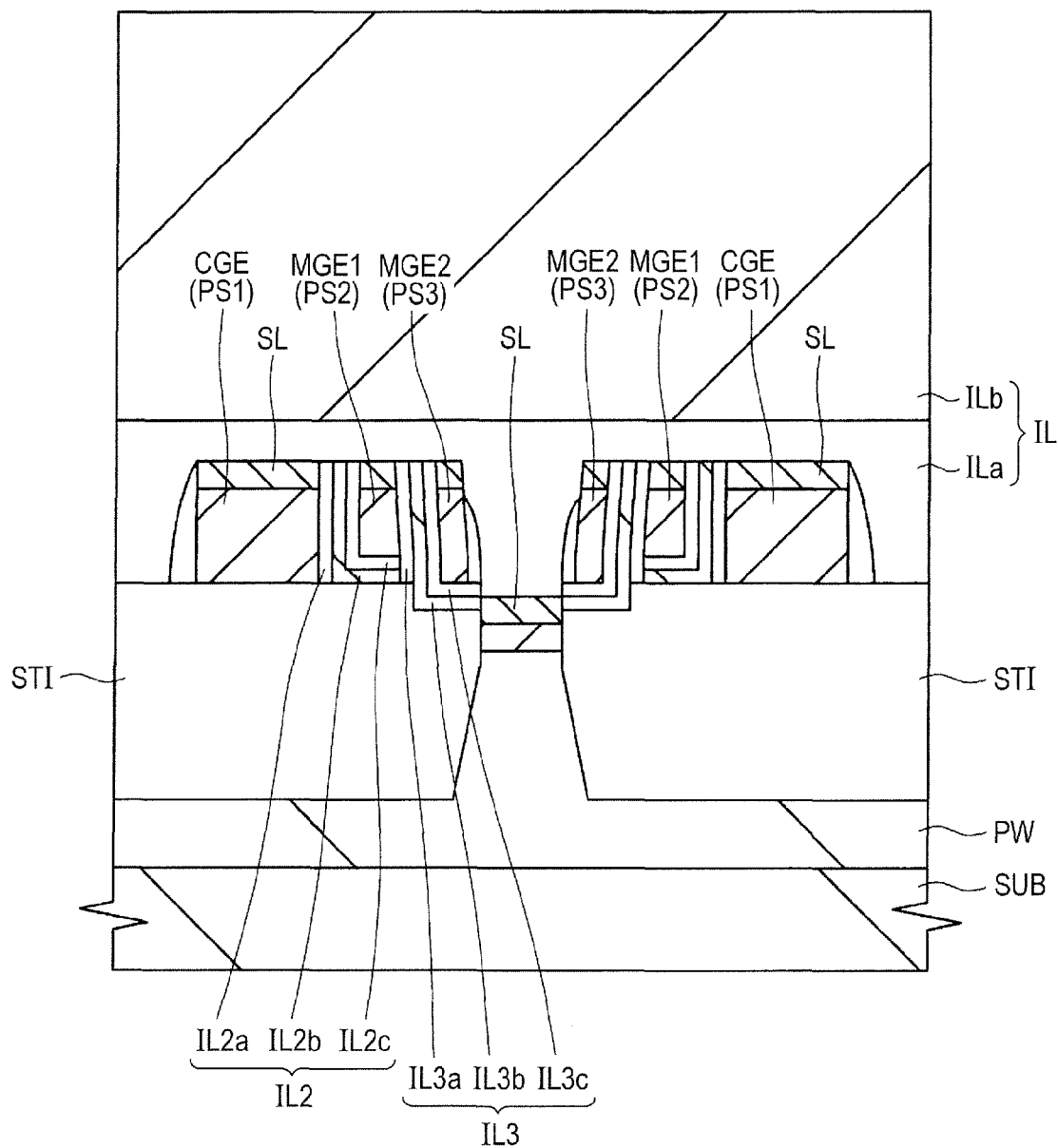
FIG. 82 is a main-portion cross-sectional view (main-portion cross-sectional view along the line D-D' shown in FIG. 78) of the MONOS-type nonvolatile memory cell according to Embodiment 8.

A configuration of a memory cell according to Embodiment 8 will be described using FIGS. 78 to 82. FIG. 78 is a main-portion plan view of a memory. FIG. 79 is a main-portion cross-sectional view along the line A-A' shown in FIG. 78. FIG. 80 is a main-portion cross-sectional view along the line B-B' shown in FIG. 78. FIG. 81 is a main-portion cross-sectional view along the line C-C' shown in FIG. 78. FIG. 82 is a main-portion cross-sectional view along the line D-D' shown in FIG. 78.

A memory cell MC8 according to Embodiment 8 is different from the memory cell MC1 according to Embodiment 1 described above in a method of supplying power to each of the memory gates MG.

That is, in the memory cell MC1 according to Embodiment 1 described above, the same voltage is supplied to each of the first and second memory gates MG1 and MG2. By contrast, in the memory cell MC8 according to Embodiment 8, different voltages are supplied to the first and second memory gates MG1 and MG2.

The configuration of the semiconductor device according to Embodiment 8 is otherwise the same or substantially the same as that of the semiconductor device according to Embodiment 1 described above so that a description thereof is omitted.

<Operation of Memory Cell>

The memory cell MC 8 according to Embodiment 8 is capable of so-called multi-value storage which allows 2-bit data to be recorded in one cell.

A description will be given of the charges injected into the memory cell in the multi-value storage using FIG. 83. FIG. 83 is a schematic diagram illustrating the charges injected into the first and second memory gates when 2-bit/cell data items "00", "01", "10", and "11" are stored.

The data item "00" is the same as in the memory cell in the erased state in Embodiment 1 described above. Into the respective charge storage films of the first and second memory gates MG1 and MG2, holes are injected. For example, by satisfying the voltage conditions shown in Table 5, the data item "00" can be stored in the memory cell.

TABLE 5

| PULSE NUMBER | N = 1 | N > 1 |
| --- | --- | --- |
| DIFFUSION LAYER LOCATED CLOSER TO SELECTION GATE | 0 V | 0 V |
| DIFFUSION LAYER LOCATED CLOSER TO MEMORY GATE | 0 V | 0 V |
| FIRST MEMORY GATE | 12 V | 14 V |
| SECOND MEMORY GATE | 12 V | 14 V |
| SELECTION GATE | 0 V | 0 V |
| WELL | 0 V | 0 V |

When the data item "01" is written in the memory cell in the state where the data item "00" has been stored, as shown in Table 6, a voltage of, e.g., about 10 V is applied to the first memory gate electrode of each of the first memory gates MG1, and a voltage of, e.g., about 5 V is applied to the second memory gate electrode of each of the second memory gates MG2. In addition, a voltage of, e.g., about 0.9 V is applied to the selection gate electrode of each of the selection gates CG, a voltage of, e.g., about 4.5 V is applied to each of the diffusion layers located closer to the memory gates MG, and a voltage lower than the voltage applied to the diffusion layer located closer to the memory gate MG, e.g., a voltage of 0.3 V is applied to each of the diffusion layers located closer to the selection gates CG. In this manner, electrons are injected into the first memory gates MG1 in accordance with an SSI injection method.

TABLE 6

| PULSE NUMBER | N = 1 | N > 1 |
| --- | --- | --- |
| DIFFUSION LAYER LOCATED CLOSER TO SELECTION GATE | 0.3 V | 0.3 V |
| DIFFUSION LAYER LOCATED CLOSER TO MEMORY GATE | 4.5 V | 4.9 V |
| FIRST MEMORY GATE | 10 V | 11 V |
| SECOND MEMORY GATE | 5 V | 5 V |
| SELECTION GATE | 0.9 V | 0.9 V |
| WELL | 0 V | 0 V |

When the data item "10" is written in the memory cell in the state where the data item "00" has been stored, as shown in Table 7, a voltage of, e.g., about 0 V is applied to the first memory gate electrode of each of the first memory gates MG1, and a voltage of, e.g., about 10 V is applied to the second memory gate electrode of each of the second memory gates MG2. In addition, a voltage of, e.g., about 0.9 V is applied to the selection gate electrode of each of the selection gates CG, a voltage of, e.g., about 4.5 V is applied to each of the diffusion layers located closer to the memory gates MG, and a voltage lower than the voltage applied to the diffusion layer located closer to the memory gate MG, e.g., a voltage of 0.3 V is applied to each of the diffusion layers located closer to the selection gates CG. In this manner, electrons are injected into the second memory gates MG2 in accordance with the SSI injection method.

TABLE 7

| PULSE NUMBER | N = 1 | N > 1 |
| --- | --- | --- |
| DIFFUSION LAYER LOCATED CLOSER TO SELECTION GATE | 0.3 V | 0.3 V |
| DIFFUSION LAYER LOCATED CLOSER TO MEMORY GATE | 4.5 V | 4.9 V |
| FIRST MEMORY GATE | 0 V | 0 V |
| SECOND MEMORY GATE | 10 V | 11 V |
| SELECTION GATE | 0.9 V | 0.9 V |
| WELL | 0 V | 0 V |

When the data item "11" is written in the memory cell in the state where the data item "00" has been stored, as shown in Table 8, a voltage of, e.g., about 10 V is applied to the first memory gate electrode of each of the first memory gates MG1 and to the second memory gate electrode of each of the second memory gates MG2. In addition, a voltage of, e.g., about 1.5 V is applied to the selection gate electrode of each of the selection gates CG, a voltage of, e.g., about 4.5 V is applied to each of the diffusion layers located closer to the memory gates MG, and a voltage lower than the voltage applied to the diffusion layer located closer to the memory gate MG, e.g., a voltage of 0.3 V is applied to each of the diffusion layers located closer to the selection gates CG. In this manner, electrons are injected into the first and second memory gates MG1 and MG2 in accordance with the SSI injection method.

TABLE 8

| PULSE NUMBER | N = 1 | N > 1 |
| --- | --- | --- |
| DIFFUSION LAYER LOCATED CLOSER TO SELECTION GATE | 0.3 V | 0.3 V |
| DIFFUSION LAYER LOCATED CLOSER TO MEMORY GATE | 4.5 V | 4.9 V |
| FIRST MEMORY GATE | 10 V | 11 V |
| SECOND MEMORY GATE | 10 V | 11 V |
| SELECTION GATE | 1.5 V | 1.5 V |
| WELL | −1 V | −1 V |

Figure 84:
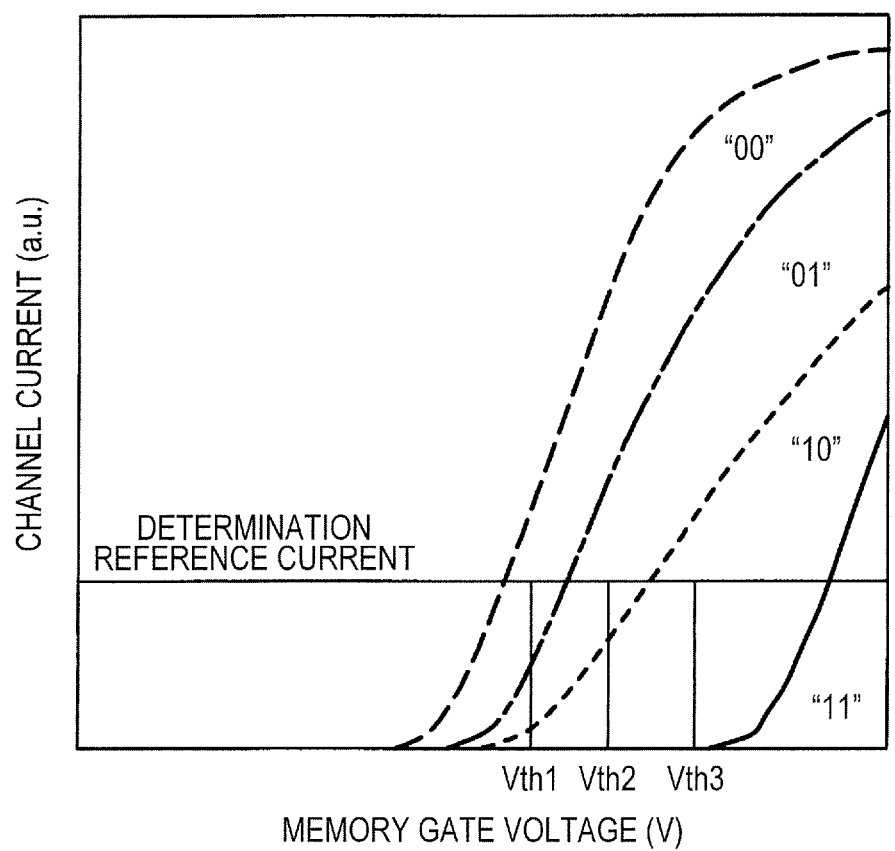
FIG. 84 is a graph showing the relationship between a channel current and a memory gate voltage in each of data items in the nonvolatile memory cell according to Embodiment 8.

Next, a description will be given of a read operation to the memory cell according to Embodiment 8 using FIG. 84. FIG. 84 is a graph showing the relationship between a channel current and a memory gate voltage in each of the data items (data items "00", "01", "10", and "11") in the memory cell.

By applying a voltage of, e.g., about 1.35 V to the drain DR located closer to each of the selection gates CG and applying a voltage of, e.g., about 1.35 V to the selection gate electrode of the selection gate CG in the memory cell MC8, the channel under the selection gate CG is brought into an ON state. Here, by simultaneously applying the individual voltages Vth1, Vth2, and Vth3 shown in the drawing to the first memory gate electrode of each of the first memory gates MG1 and to the second memory gate electrode of each of the second memory gates MG2 in succession and reading whether or not a current of not less than a determination current flows in each of the cases, each of the data items can be read.

<Method of Manufacturing Semiconductor Device>

A method of manufacturing the semiconductor device according to Embodiment 8 is the same or substantially the same as the method of manufacturing the semiconductor device according to Embodiment 7 described above. However, it is necessary to supply different voltages to the first memory gate electrode of each of the first memory gates MG1 and the second memory gate electrode of each of the second memory gates MG2. Accordingly, it is necessary to inventively improve the layout of the coupling portion between the first memory gate electrode of the first memory gate MG1 and a wire and the coupling portion between the second memory gate electrode of the second memory gate MG2 and a wire in a power supply portion.

Figure 85:
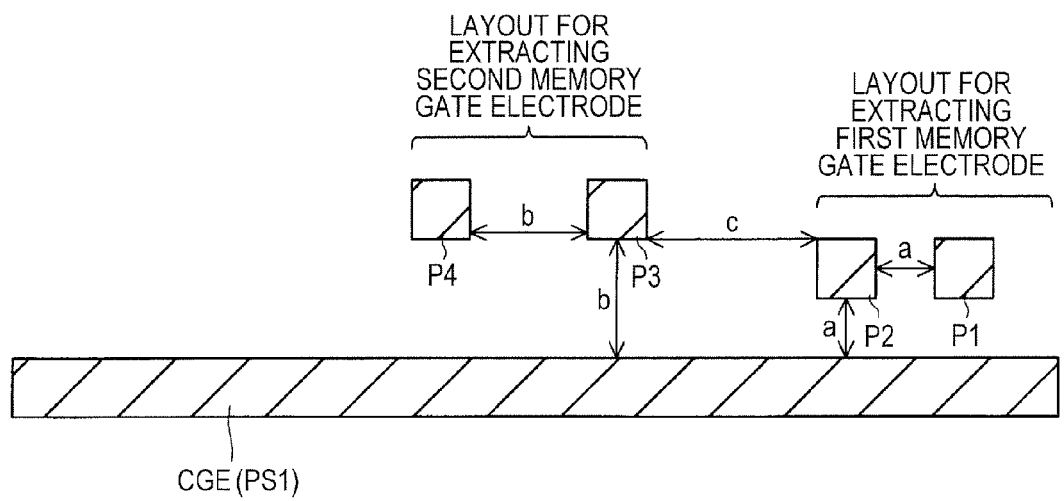
FIG. 85 is a main-portion plan view showing an example of a power supply portion for each of the memory gate electrodes of the nonvolatile memory cell in a manufacturing process of a semiconductor device according to Embodiment 8.
Figure 86:
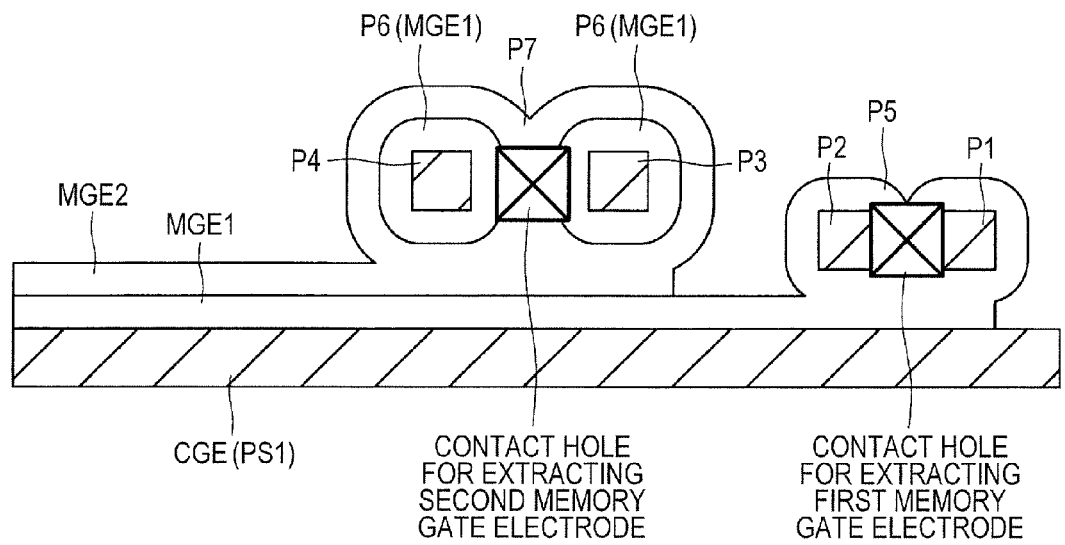
FIG. 86 is a main-portion plan view showing an example of the power supply portion for each of the memory gate electrodes of the nonvolatile memory cell in the manufacturing process of the semiconductor device according to Embodiment 8.

The layout of the power supply portion in Embodiment 8 will be described using FIGS. 85 and 86. FIGS. 85 and 86 are main-portion plan views showing an example of the power supply portion for the memory gate electrodes in a manufacturing process of the semiconductor device.

For example, when the polycrystalline silicon film PS1 is processed to form the selection gate electrodes CGE in the method of manufacturing the semiconductor device according to Embodiment 7 described above, the plurality of island patterns shown in FIG. 85 are simultaneously formed. By way of example, FIG. 85 shows first, second, third, and fourth patterns P1, P2, P3 and P4 which are successively placed over one side surface of each of the selection gate electrodes CGE to be spaced apart from each other in the direction in which the selection gate electrode CGE extends. Each of the first and second patterns P1 and P2 is placed at a first distance a from the side surface of the selection gate electrode CGE. Each of the third and fourth patterns P3 and P4 is placed at a second distance b from the side surface of the selection gate electrode CGE. The first and second patterns P1 and P2 are spaced apart by the first distance a. The second and third patterns P2 and P3 are spaced apart by a third distance c. The third and fourth patterns P3 and P4 are spaced apart by the second distance b.

Here, the first, second, and third distances a, b, and c preferably satisfy the following relational expression. In the following relational expression, A represents the thickness of each of the second gate insulating film (second insulating film IL2) of the first memory gate and the third gate insulating film (third insulating film IL3) of the second memory gate. Also, in the following relational expression, B represents the thickness (thickness of the deposition at a flat portion) of the polycrystalline silicon film serving as the first memory gate electrode MGE1 of the first memory gate and C represents the thickness (thickness of the deposition at a flat portion) of the polycrystalline silicon film serving as the second memory gate electrode MGE2 of the second memory gate.

$$A \times 2 + B < a < (A+B) \times 2$$

$$A \times 4 + B \times 2 < b < A \times 4 + (B+C) \times 2$$

$$c > b$$

As shown in FIG. 86, by forming the island patterns, after the formation of the first memory gate electrodes MGE1, a fifth pattern P5 is formed around the first and second patterns P1 and P2. The fifth pattern P5 is coupled to each of the first memory gate electrodes MGE1 and made of a multi-layer film including the second insulating film IL2, and the polycrystalline silicon film in the same layer as that of the first memory gate electrode MGE1. In addition, a sixth pattern P6 is formed around the third and fourth patterns P3 and P4. The sixth pattern P6 is not coupled to the first memory gate electrode MGE1 and made of the multi-layer film including the second insulating film IL2, and the polycrystalline silicon film in the same layer as that of the first memory gate electrode MGE1.

Furthermore, after the formation of the second memory gate electrodes MGE2, a seventh pattern P7 is formed around the sixth pattern P6 formed around the third and fourth patterns P3 and P4. The seventh pattern P7 is coupled to each of the second memory gate electrodes MGE2 and made of a multi-layer film including the third insulating film IL3, and the polycrystalline silicon film in the same layer as that of the second memory gate electrode MGE2.

Accordingly, by forming a contact hole coupled to the fifth pattern P5 formed around the first and second patterns P1 and P2, the coupling portion can be formed which allows a voltage to be applied only to each of the first memory gate electrodes MGE1. Also, by forming a contact hole coupled to the seventh pattern P7 formed around the third and fourth patterns P3 and P4, the coupling portion can be formed which allows a voltage to be applied only to each of the second memory gate electrodes MGE2. Thus, it is possible to apply different voltages to the first and second memory gate electrodes MGE1 and MGE2.

<Effect of Embodiment 8>

Since multiple values (e.g., 2 bits) can be stored in one cell, the degree of integration of the memory can be increased. This can achieve reductions in chip area and bit cost.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device comprising a nonvolatile memory cell,
   wherein the nonvolatile memory cell includes:
   a first gate insulating film formed over a semiconductor substrate;
   a selection gate electrode formed over the first gate insulating film;
   a second gate insulating film formed to extend over the semiconductor substrate and one side surface of the selection gate electrode and having an internal charge storage portion;
   a first memory gate electrode formed over the semiconductor substrate and the one side surface of the selection gate electrode via the second gate insulating film;
   a third gate insulating film formed to extend over the semiconductor substrate and one side surface of the first memory gate electrode and having an internal charge storage portion;
   a second memory gate electrode formed over the semiconductor substrate and the one side surface of the first memory gate electrode via the third gate insulating film;
   a first semiconductor region formed in a portion of the semiconductor substrate which is located closer to the selection gate electrode; and
   a second semiconductor region formed in a portion of the semiconductor substrate which is located closer to the second memory gate electrode.

2. The semiconductor device according to claim 1,
wherein holes are injected from the first memory gate electrode into the second gate insulating film and from the second memory gate electrode into the third gate insulating film to erase data in the nonvolatile memory cell therefrom.

3. The semiconductor device according to claim 1,
wherein a lower surface of the second memory gate electrode is lower in level than a lower surface of the first memory gate electrode.

4. The semiconductor device according to claim 3,
wherein the lower surface of the second memory gate electrode is located at a height position higher than a depth of 10 nm from a contact interface between the second gate insulating film and the semiconductor substrate.

5. The semiconductor device according to claim 1,
wherein the first and second memory gate electrodes are made of respective polycrystalline silicon films showing different conductivities.

6. The semiconductor device according to claim 5,
wherein the first memory gate electrode is made of the polycrystalline silicon film showing the n-type conductivity, and the second memory gate electrode is made of the polycrystalline silicon film showing the p-type conductivity.

7. The semiconductor device according to claim 5,
wherein a lower surface of the first memory gate electrode and a lower surface of the second memory gate electrode are at the same height.

8. The semiconductor device according to claim 1,
wherein isolation portions are formed on both sides of the nonvolatile memory cell in a first direction as a gate width direction of the nonvolatile memory cell,
wherein each of the isolation portions includes a trench formed in the semiconductor substrate, and an insulating film embedded in the trench,
wherein the selection gate electrode, the first memory gate electrode, and the second memory gate electrode are formed over the isolation portions formed on both sides of the nonvolatile memory cell to extend in the first direction, and
wherein an upper surface of the insulating film embedded in the trench of each of the isolation portions is lower in level than a main surface of the semiconductor substrate in which the first and second semiconductor regions are formed.

9. The semiconductor device according to claim 1,
wherein each of the second and third gate insulating films is made of a multi-layer film in which a lower-layer insulating film, an insulating film having the charge storage portion, and an upper-layer insulating film are successively formed.

10. The semiconductor device according to claim 1,
wherein, to the first and second memory gate electrodes, different voltages are applied to allow the nonvolatile memory cell to store 2-bit data.

11. A method of manufacturing a semiconductor device including a nonvolatile memory cell, the method comprising the steps of forming the nonvolatile memory cell,
wherein the steps of forming the nonvolatile memory cell include:
(a) forming, over a semiconductor substrate, a dummy pattern extending in a first direction as a gate width direction of the nonvolatile memory cell;
(b) after the step (a), successively forming, over the semiconductor substrate, a second gate insulating film having an internal charge storage portion and a second conductive film;
(c) after the step (b), processing the second conductive film to form a first memory gate electrode over the semiconductor substrate and one side surface of the dummy pattern via the second gate insulating film;
(d) after the step (c), successively forming, over the semiconductor substrate, a third gate insulating film having an internal charge storage portion and a third conductive film;
(e) after the step (d), processing the third conductive film to form a second memory gate electrode over the semiconductor substrate and one side surface of the first memory gate electrode via the third gate insulating film;
(f) after the step (e), removing the dummy pattern;
(g) after the step (f), successively forming, over the semiconductor substrate, a first gate insulating film and a first conductive film;
(h) after the step (g), processing the first conductive film to form a selection gate electrode over a portion of the semiconductor substrate which is located opposite to the second memory gate electrode and the one side surface of the first memory gate electrode via the first gate insulating film; and
(i) after the step (h), forming a first semiconductor region in a portion of the semiconductor substrate which is located closer to the selection gate electrode, while forming a second semiconductor region in a portion of the semiconductor substrate which is located closer to the second memory gate electrode.

12. The method of manufacturing a semiconductor device according to claim 11,
wherein holes are injected from the first memory gate electrode into the second gate insulating film and from the second memory gate electrode into the third gate insulating film to erase data in the nonvolatile memory cell therefrom.

13. The method of manufacturing a semiconductor device according to claim 11, further comprising, between the steps (c) and (d), the step of:
(j) etching the semiconductor substrate to foam a trench in a region of the semiconductor substrate where the second memory gate electrode is formed,
wherein a lower surface of the second memory gate electrode is located lower in level than a lower surface of the first memory gate electrode.

14. The method of manufacturing a semiconductor device according to claim 13,
wherein the lower surface of the second memory gate electrode is located at a height position higher than a depth of 10 nm from a contact interface between the second gate insulating film and the semiconductor substrate.

15. The method of manufacturing a semiconductor device according to claim 11,
wherein the first and second memory gate electrodes are made of respective polycrystalline silicon films showing different conductivities.

16. The method of manufacturing a semiconductor device according to claim 15,
wherein the first memory gate electrode is made of the polycrystalline silicon film showing the n-type conductivity, and the second memory gate electrode is made of the polycrystalline silicon film showing the p-type conductivity.

17. The method of manufacturing a semiconductor device according to claim 15,
wherein a lower surface of the first memory gate electrode and a lower surface of the second memory gate electrode are located at the same height.

18. The method of manufacturing a semiconductor device according to claim 11, further comprising, prior to the step (a), the step of:
(k) forming isolation portions in portions of the main surface of the semiconductor substrate which are located on both sides of the nonvolatile memory cell in the first direction,
wherein each of the isolation portions includes a trench formed in the semiconductor substrate, and an insulating film embedded in the trench,
wherein the selection gate electrode, the first memory gate electrode, and the second memory gate electrode are formed over the isolation portions formed on both sides of the nonvolatile memory cell to extend in the first direction, and
wherein an upper surface of the insulating film embedded in the trench of each of the isolation portions is lower in level than a main surface of the semiconductor substrate in which the first and second semiconductor regions are formed.

19. The method of manufacturing a semiconductor device according to claim 11,
wherein each of the second and third gate insulating films is made of a multi-layer film in which a lower-layer insulating film, an insulating film having the charge storage portion, and an upper-layer insulating film are successively formed.

20. The method of manufacturing a semiconductor device according to claim 11,
wherein, to the first and second memory gate electrodes, different voltages are applied to allow the nonvolatile memory cell to store 2-bit data.

* * * * *